(12) United States Patent
Umezaki

(10) Patent No.: US 9,698,170 B2
(45) Date of Patent: Jul. 4, 2017

(54) SEMICONDUCTOR DEVICE, DISPLAY MODULE, AND ELECTRONIC DEVICE

(71) Applicant: Semiconductor Energy Laboratory Co., Ltd., Atsugi-shi, Kanagawa-ken (JP)

(72) Inventor: Atsushi Umezaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 24 days.

(21) Appl. No.: 14/872,544

(22) Filed: Oct. 1, 2015

(65) Prior Publication Data
US 2016/0096725 A1    Apr. 7, 2016

(30) Foreign Application Priority Data
Oct. 7, 2014    (JP) .................. 2014-206113

(51) Int. Cl.
*H01L 27/12*    (2006.01)
*B81B 3/00*    (2006.01)
(Continued)

(52) U.S. Cl.
CPC .......... *H01L 27/124* (2013.01); *B81B 3/0083* (2013.01); *B81B 3/0086* (2013.01);
(Continued)

(58) Field of Classification Search
CPC ............. H01L 27/0617; H01L 27/0629; H01L 27/124; B81B 3/0083; B81B 3/0086; B81B 7/008; B81B 7/02
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters) , Sep. 27, 2004, vol. 85, No. 13, pp. 2541-2543.

(Continued)

*Primary Examiner* — Joseph C Nicely
(74) *Attorney, Agent, or Firm* — Fish & Richardson P.C.

(57) ABSTRACT

To reduce the amplitude voltage of control signals of a MEMS device. A semiconductor device includes a MEMS device, a first transistor, a second transistor whose source or drain is electrically connected to a source or a drain of the first transistor, a third transistor which sets the potential of a gate of the first transistor to a value at which the first transistor is turned on, a fourth transistor which sets the potential of the gate of the first transistor to a value at which the first transistor is turned off, and a fifth transistor which supplies a signal to a gate of the second transistor and a gate of the fourth transistor.

14 Claims, 33 Drawing Sheets

(51) Int. Cl.
  *H01L 27/06* (2006.01)
  *B81B 7/02* (2006.01)
  *B81B 7/00* (2006.01)
  *G09G 3/34* (2006.01)

(52) U.S. Cl.
  CPC .............. *B81B 7/008* (2013.01); *B81B 7/02* (2013.01); *H01L 27/0617* (2013.01); *H01L 27/0629* (2013.01); *G09G 3/346* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,730,186 B2 | 5/2014 | Tamura et al. |
| 8,766,608 B2 | 7/2014 | Yamazaki et al. |
| 8,891,051 B2 | 11/2014 | Yamazaki et al. |
| 8,902,205 B2 | 12/2014 | Miyazawa et al. |
| 8,975,695 B2 | 3/2015 | Yamazaki |
| 8,994,704 B2 | 3/2015 | Miyazawa et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0220117 A1 | 9/2010 | Kimura |
| 2011/0063014 A1* | 3/2011 | Koyama ............ H03K 19/0013 327/427 |
| 2011/0216876 A1* | 9/2011 | Amano ................ G11C 19/184 377/75 |
| 2012/0306562 A1 | 12/2012 | Miyamoto et al. |
| 2014/0043223 A1* | 2/2014 | English ................ G09G 3/3433 345/156 |
| 2014/0085017 A1 | 3/2014 | Tsinker |
| 2014/0231770 A1 | 8/2014 | Inoue et al. |
| 2016/0090291 A1* | 3/2016 | Umezaki ................ B81B 3/0083 257/72 |
| 2016/0115015 A1* | 4/2016 | Umezaki ................ H01L 27/124 257/43 |
| 2017/0004865 A1* | 1/2017 | Nagatsuka |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-239046 A | 12/2012 |
| JP | 2014-142405 A | 8/2014 |

(56) References Cited

FOREIGN PATENT DOCUMENTS

| JP | 2014-522509 A | 9/2014 |
|---|---|---|
| JP | 2014-523659 A | 9/2014 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C. ,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films, ", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-in. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,",

(56) References Cited

OTHER PUBLICATIONS

SID Digest '09 : SID International Symposium Digest of Technical Papers, May 31, 2009, pp. 1110-1112.
Ohara.H et al., "21.3:4.0 in. QVGA AMOLED Display Using In—Ga—Zn-Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Sympoisum Digest of Technical Papers, 2007, vol. 38, pp. 1737-1740.
Nakamura.M, "Synthesis of Homologous Compound with New Long-Period Structure,", Nirim Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: a hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW 08 :Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803. Eng.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE, DISPLAY MODULE, AND ELECTRONIC DEVICE

BACKGROUND OF THE INVENTION

1. Field of the Invention

One embodiment of the present invention relates to a semiconductor device, a display module, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Another embodiment of the present invention relates to a semiconductor device, a display device, a lighting device, a power storage device, a memory device, or a driving method or manufacturing method thereof.

2. Description of the Related Art

Display devices including display elements using microelectromechanical systems (MEMS) have been developed. Patent Documents 1 to 4 each disclose a pixel circuit including a display element using MEMS.

REFERENCES

Patent Document 1: Japanese Published Patent Application No. 2012-239046
Patent Document 2: Japanese Published Patent Application No. 2014-142405
Patent Document 3: Japanese Translation of PCT International Application No. 2014-522509
Patent Document 4: Japanese Translation of PCT International Application No. 2014-523659

SUMMARY OF THE INVENTION

Patent Documents 1 to 3 have a problem in that it is difficult to continuously supply voltage to the display element using the MEMS. Patent Document 4 has a problem of requiring a CMOS circuit.

An object of one embodiment of the present invention can provide a pixel, a semiconductor device, or a display device having a novel structure. An object of one embodiment of the present invention is to reduce the amplitude voltage of signals or to provide a structure capable of achieving it. An object of one embodiment of the present invention is to continuously apply voltage to a display element or to provide a structure capable of achieving it. An object of one embodiment of the present invention is to precisely control the gray level of a display element or to provide a structure capable of achieving it. An object of one embodiment of the present invention is to prevent continuous generation of current or to provide a structure capable of achieving it. An object of one embodiment of the present invention is to reduce power consumption or to provide a structure capable of achieving it. An object of one embodiment of the present invention is to use only transistors of the same polarity or to provide a structure capable of achieving it. An object of one embodiment of the present invention is to reduce the number of manufacturing steps or to provide a structure capable of achieving it. An object of one embodiment of the present invention is to shorten the time during which a shoot-through current is generated or to provide a structure capable of achieving it. An object of one embodiment of the present invention is to reduce a shoot-through current or to provide a structure capable of achieving it. An object of one embodiment of the present invention is to reduce the layout area or to provide a structure capable of achieving it.

One embodiment of the present invention does not necessarily achieve all the objects listed above and only needs to achieve at least one of the objects. The description of the above objects does not preclude the existence of other objects. Other objects are apparent from and can be derived from the description of the specification, the drawings, the claims, and the like.

One embodiment of the present invention is a semiconductor device including first to fifth transistors and a MEMS device. One of a source and a drain of the first transistor is electrically connected to one of a source and a drain of the second transistor. One of a source and a drain of the third transistor is electrically connected to one of a source and a drain of the fourth transistor and to a gate of the first transistor. The other of the source and the drain of the third transistor is electrically connected to the other of the source and the drain of the first transistor. The other of the source and the drain of the fourth transistor is electrically connected to the other of the source and the drain of the second transistor. A gate of the fourth transistor is electrically connected to a gate of the second transistor. One of a source and a drain of the fifth transistor is electrically connected to the gate of the second transistor. The MEMS device is electrically connected to the one of the source and the drain of the first transistor.

One embodiment of the present invention is a semiconductor device including first to sixth transistors and a MEMS device. One of a source and a drain of the first transistor is electrically connected to one of a source and a drain of the second transistor. One of a source and a drain of the third transistor is electrically connected to one of a source and a drain of the fourth transistor and to a gate of the first transistor. The other of the source and the drain of the third transistor is electrically connected to the other of the source and the drain of the first transistor. The other of the source and the drain of the fourth transistor is electrically connected to the other of the source and the drain of the second transistor. A gate of the fourth transistor is electrically connected to a gate of the second transistor. One of a source and a drain of the fifth transistor is electrically connected to the gate of the second transistor. One of a source and a drain of the sixth transistor is electrically connected to the gate of the second transistor. The other of the source and the drain of the sixth transistor is electrically connected to the other of the source and the drain of the second transistor. The MEMS device is electrically connected to the one of the source and the drain of the first transistor.

One embodiment of the present invention is a semiconductor device including first to fifth transistors and a MEMS device. The first transistor has a function of supplying a first potential to the MEMS device. The second transistor has a function of supplying a second potential to the MEMS device. The third transistor has a function of setting the potential of a gate of the first transistor to a value at which the first transistor is turned on. The fourth transistor has a function of setting the potential of the gate of the first transistor to a value at which the first transistor is turned off. The fifth transistor has a function of supplying a signal to a gate of the second transistor and a gate of the fourth transistor.

One embodiment of the present invention is a semiconductor device including first to fifth transistors and a MEMS device. The first transistor has a function of controlling electrical continuity between a first wiring and the MEMS device. The second transistor has a function of controlling electrical continuity between a second wiring and the MEMS device. The third transistor has a function of controlling electrical continuity between the first wiring or a third wiring and a gate of the first transistor. The fourth transistor has a function of controlling electrical continuity between the second wiring or a fourth wiring and the gate of the first transistor. The fifth transistor has a function of controlling electrical continuity between a sixth wiring and a gate of the second transistor or a gate of the fourth transistor.

In any of the above embodiments of the present invention, each of the first to sixth transistors may include a channel formation region in an oxide semiconductor.

In any of the above embodiments of the present invention, the W/L ratio of the second transistor is higher than the W/L ratio of the first transistor.

In any of the above embodiments of the present invention, the W/L ratio of the fourth transistor is higher than the W/L ratio of the third transistor.

One embodiment of the present invention is a semiconductor device including first to tenth transistors and a MEMS device. One of a source and a drain of the first transistor is electrically connected to one of a source and a drain of the second transistor. One of a source and a drain of the third transistor is electrically connected to one of a source and a drain of the fourth transistor and to a gate of the first transistor. A gate of the fourth transistor is electrically connected to a gate of the second transistor. One of a source and a drain of the fifth transistor is electrically connected to the gate of the second transistor. One of a source and a drain of the sixth transistor is electrically connected to one of a source and a drain of the seventh transistor. One of a source and a drain of the eighth transistor is electrically connected to one of a source and a drain of the ninth transistor and to a gate of the sixth transistor. A gate of the ninth transistor is electrically connected to a gate of the seventh transistor. One of a source and a drain of the tenth transistor is electrically connected to the gate of the seventh transistor. A first component of the MEMS device is electrically connected to the one of the source and the drain of the first transistor. A second component of the MEMS device is electrically connected to the one of the source and the drain of the sixth transistor.

One embodiment of the present invention is a display module including a display panel and a flexible printed circuit (FPC). The display panel includes a semiconductor device according to any one of the above embodiments of the present invention.

One embodiment of the present invention is an electronic device including the display module according to the above embodiment of the present invention, and an antenna, an operation button, or a speaker.

Other embodiments of the present invention are described in embodiments described below and shown in the drawings.

One embodiment of the present invention can provide a pixel, a semiconductor device, or a display device having a novel structure. One embodiment of the present invention can continuously apply voltage to a display element or provide a structure capable of achieving it. One embodiment of the present invention can reduce the amplitude voltage of signals or provide a structure capable of achieving it. One embodiment of the present invention can precisely control the gray level of a display element or provide a structure capable of achieving it. One embodiment of the present invention can prevent continuous generation of current or provide a structure capable of achieving it. One embodiment of the present invention can reduce power consumption or provide a structure capable of achieving it. One embodiment of the present invention can use only transistors of the same polarity or provide a structure capable of achieving it. One embodiment of the present invention can reduce the number of manufacturing steps or provide a structure capable of achieving it. One embodiment of the present invention can shorten the time during which a shoot-through current is generated or provide a structure capable of achieving it. One embodiment of the present invention can reduce a shoot-through current or provide a structure capable of achieving it. One embodiment of the present invention can reduce the layout area or provide a structure capable of achieving it.

Note that the description of these effects does not preclude the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1:
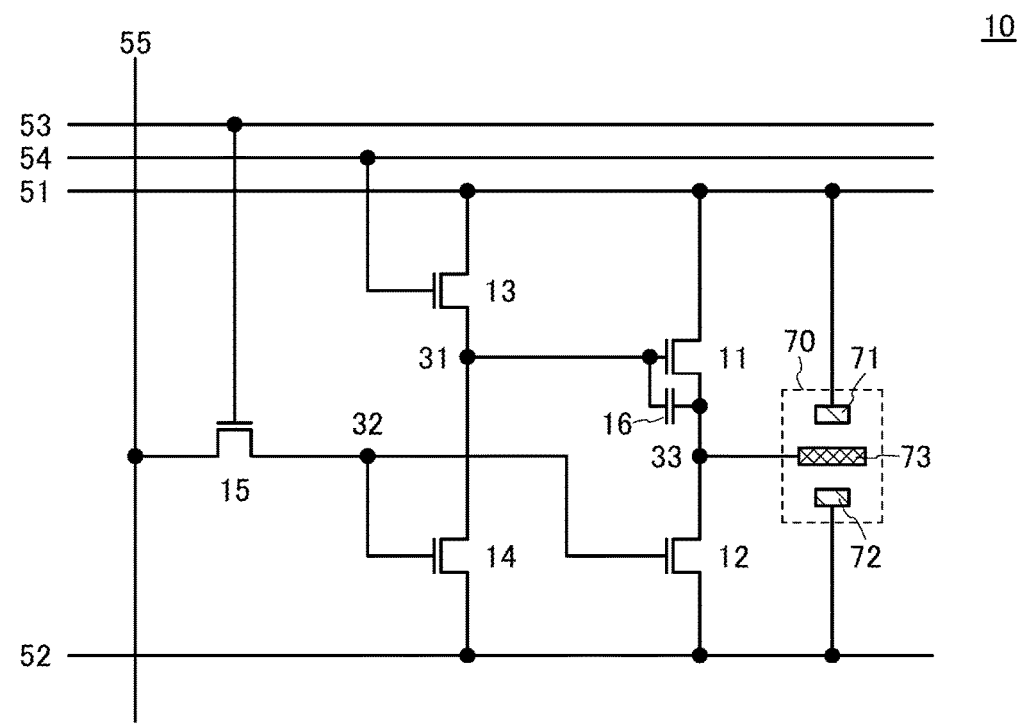
FIG. 1 shows an example of a pixel.

Embodiments of the present invention will be described below in detail with reference to the accompanying drawings. Note that the present invention is not limited to the following description and it is easily understood by those skilled in the art that the mode and details can be variously changed without departing from the scope and spirit of the present invention. Therefore, the present invention should not be interpreted as being limited to the description of the embodiments below.

One embodiment of the present invention includes, in its category, devices such as an imaging device, a radio frequency (RF) tag, a display device, and an integrated circuit. A display device includes, in its category, a display device including an integrated circuit, such as a liquid crystal display device, a light-emitting device in which a light-emitting element typified by an organic light-emitting element is provided in each pixel, electronic paper, a digital micromirror device (DMD), a plasma display panel (PDP), and a field emission display (FED).

In describing structures of the present invention with reference to the drawings, the same reference numerals are sometimes used in common for the same portions in different drawings.

In this specification and the like, part of a diagram or text described in one embodiment can be taken out to constitute one embodiment of the invention. Thus, in the case where a diagram or text related to a certain portion is described, the context taken out from part of the diagram or the text is also disclosed as one embodiment of the invention, and one embodiment of the invention can be constituted. The embodiment of the invention is clear. Therefore, for example, in a diagram or text in which one or more active elements (e.g., transistors), wirings, passive elements (e.g., capacitors), conductive layers, insulating layers, semiconductor layers, components, devices, operating methods, manufacturing methods, and the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

In the case where at least one specific example is described in a diagram or text in one embodiment in this specification and the like, it will be readily appreciated by those skilled in the art that a broader concept of the specific example can be derived. Therefore, in the case where at least one specific example is described in the diagram or the text in one embodiment, a broader concept of the specific example is disclosed as one embodiment of the invention, and one embodiment of the invention can be constituted. The embodiment of the invention is clear.

In this specification and the like, a content described in at least a diagram (or part of the diagram) is disclosed as one embodiment of the invention, and one embodiment of the invention can be constituted. Therefore, when a certain content is described in a diagram, the content is disclosed as one embodiment of the invention even when the content is not described with text, and one embodiment of the invention can be constituted. In a similar manner, part of a diagram, which is taken out from the diagram, is disclosed as one embodiment of the invention, and one embodiment of the invention can be constituted. The embodiment of the invention is clear.

In addition, contents that are not specified in any text or drawing in the specification can be excluded from one embodiment of the invention. Alternatively, when the range of a value that is defined by the maximum and minimum values is described, the range is appropriately narrowed or part of the range is removed, whereby one embodiment of the invention excluding part of the range can be constructed. In this manner, it can be specified that a conventional technology is excluded from the technical scope of one embodiment of the present invention, for example.

In this specification and the like, it might be possible for those skilled in the art to constitute one embodiment of the invention even when portions to which all the terminals of an active element (e.g., a transistor), a passive element (e.g., a capacitor), or the like are connected are not specified. In other words, one embodiment of the invention can be clear even when connection portions are not specified. Furthermore, in the case where a connection portion is disclosed in this specification and the like, it can be determined in some cases that one embodiment of the invention in which a connection portion is not specified is disclosed in this specification and the like. In particular, in the case where the number of portions to which the terminal is connected is more than one, it is not necessary to specify the portions to which the terminal is connected. Therefore, it might be possible to constitute one embodiment of the invention by specifying only portions to which some of terminals of an active element (e.g., a transistor), a passive element (e.g., a capacitor), or the like are connected.

In this specification and the like, it might be possible for those skilled in the art to specify the invention when at least the connection portion of a circuit is specified. It might be possible for those skilled in the art to specify the invention when at least a function of a circuit is specified. In other words, when a function of a circuit is specified, one embodiment of the invention can be clear. Furthermore, it can sometimes be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Moreover, when a function of a circuit is specified, the circuit is disclosed as one embodiment of the invention even when a connection portion is not specified, and one embodiment of the invention can be constituted.

In this specification and the like, when it is explicitly described that X and Y are connected, the case where X and Y are electrically connected, the case where X and Y are functionally connected, and the case where X and Y are directly connected are included therein. Accordingly, without limitation to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, that is, the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and a control circuit) can be connected between X and Y. Note that for example, when a signal output from X is transmitted to Y, it can be said that X and Y are functionally connected even if another circuit is provided between X and Y. Note that the case where X and Y are functionally connected includes the case where X and Y are directly connected and the case where X and Y are electrically connected.

Note that in this specification and the like, the explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path," and "a source (or a first terminal or the like) of a transistor is electrically connected to X through Z1 at least with a first connection path, the first connection path does not include a second connection path, the second connection path includes a connection path through the transistor, a drain (or a second terminal or the like) of the transistor is electrically connected to Y through Z2 at least with a third connection path, and the third connection path does not include the second connection path." Still another example of the expression is "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, a pixel according to one embodiment of the present invention is described.

FIG. 1 is a circuit diagram showing an example of a pixel 10 of one embodiment of the present invention. The pixel 10 includes transistors 11 to 15, a capacitor 16, and a display element 70. The display element 70 includes components 71 to 73. A first terminal of the transistor 11 is connected to a wiring 51. A second terminal of the transistor 11 is connected to the component 73. A first terminal of the transistor 12 is connected to a wiring 52. A second terminal of the transistor 12 is connected to the component 73. A first terminal of the transistor 13 is connected to the wiring 51. A second terminal of the transistor 13 is connected to a gate of the transistor 11. A gate of the transistor 13 is connected to a wiring 54. A first terminal of the transistor 14 is connected to the wiring 52. A second terminal of the transistor 14 is connected to the gate of the transistor 11. A gate of the transistor 14 is connected to a gate of the transistor 12. A first terminal of the transistor 15 is connected to a wiring 55. A second terminal of the transistor 15 is connected to the gate of the transistor 12. A gate of the transistor 15 is connected to a wiring 53. A first electrode of the capacitor 16 is connected to the component 73. A second electrode of the capacitor 16 is connected to the gate of the transistor 11. The component 71 is connected to the wiring 51. The component 72 is connected to the wiring 52.

A node 31 is a point at which the gate of the transistor 11, the second terminal of the transistor 13, the second terminal of the transistor 14, and the second electrode of the capacitor 16 are connected. A node 32 is a point at which the gate of the transistor 12, the gate of the transistor 14, and the second terminal of the transistor 15 are connected. A node 33 is a point at which the second terminal of the transistor 11, the second terminal of the transistor 12, the first electrode of the capacitor 16, and the component 73 are connected.

The transistors 11 to 15 preferably have the same polarity. The transistors 11 to 15 are n-channel transistors in FIG. 1; however, they may be p-channel transistors.

The component 73 has a region placed between the component 71 and the component 72. A potential difference between the component 71 and the component 73 causes the component 71 and the component 73 to move closer to each other. A potential difference between the component 72 and the component 73 causes the component 72 and the component 73 to move closer to each other. Note that the component 71 and the component 72 may be fixed. In other words, the potential difference between the component 71 and the component 73 may cause the component 73 to move toward the component 71; the potential difference between the component 72 and the component 73 may cause the component 73 to move toward the component 72.

By the movement of the component 73, the gray level can be controlled in the display element 70. For example, in the case where the component 73 has openings, the movement of the component 73 changes the amount of light passing through the openings. In the case where the component 73 has a region capable of reflecting light, the movement of the component 73 changes the direction of light reflected by the component 73.

An operation of the pixel 10 in FIG. 1 is described with reference to a timing chart of FIG. 2A or FIG. 2B. Note that the pixel 10 in FIG. 1 is also capable of other operations if a signal, voltage, or the like is input to the wirings 51 to 55 as appropriate.

Figure 2A:
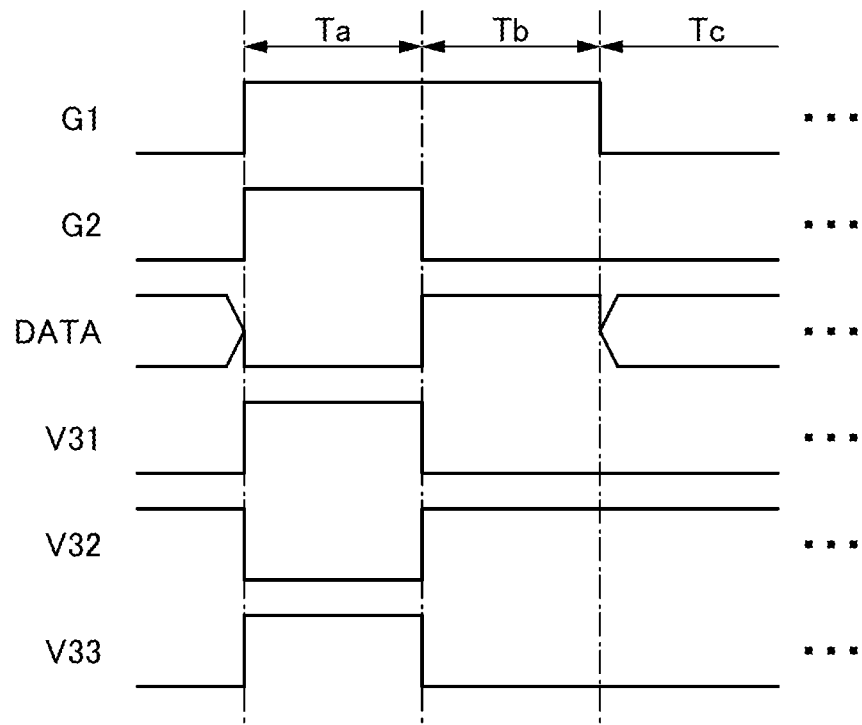
FIGS. 2A and 2B each show a chart of the example of the pixel.
Figure 2B:
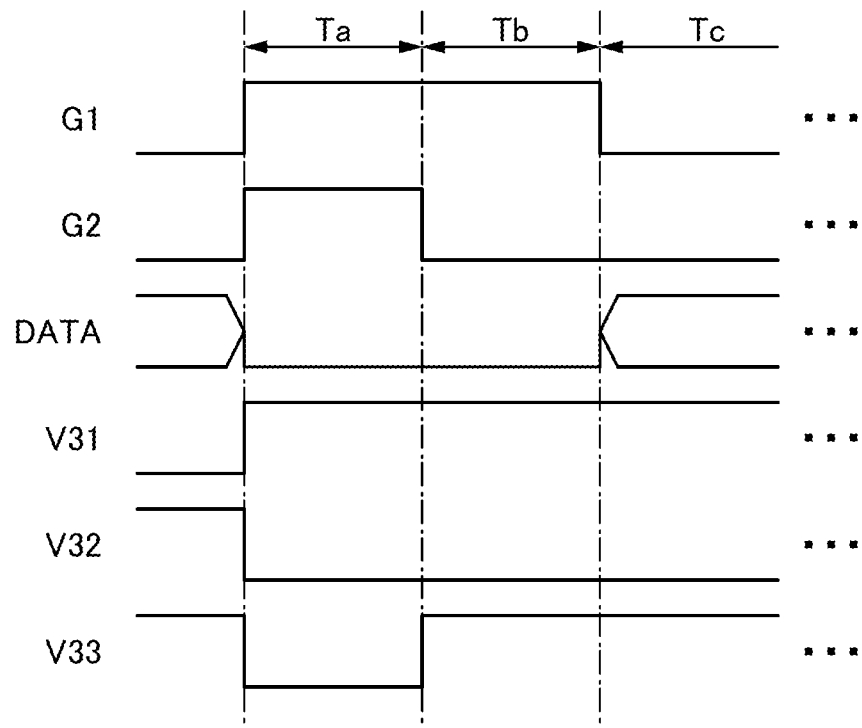

FIGS. 2A and 2B each show a chart of a signal G1, a signal G2, a signal DATA, a potential V31, a potential V32, and a potential V33. The signal G1 is a signal input to the wiring 53. The signal G2 is a signal input to the wiring 54. The potential V31 is the potential of the node 31. The potential V32 is the potential of the node 32. In the case where the pixel 10 in FIG. 1 is controlled based on the timing chart of FIG. 2A or FIG. 2B, a voltage VDD is input to the wiring 51 and a voltage VSS (VSS<VDD) is input to the wiring 52. The timing charts of FIGS. 2A and 2B are different in that in the period Tb, the level of the signal DATA is high in FIG. 2A and is low in FIG. 2B.

Figure 3A:
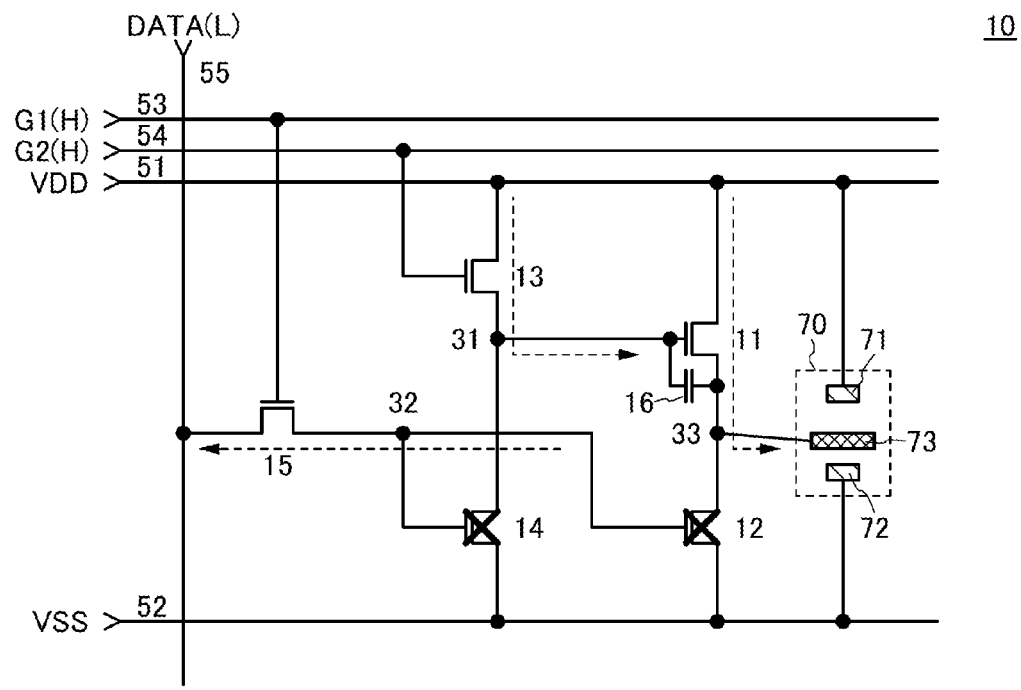
FIGS. 3A and 3B each show an example of the pixel.

In the period Ta, the level of the signal G1 becomes high, the level of the signal G2 becomes high, and the level of the signal DATA becomes low; the transistors 13 and 15 are thus turned on. The low-level signal DATA is supplied to the node 32 from the wiring 55 through the transistor 15, so that the level of the potential V32 becomes low and the transistors 12 and 14 are turned off. The voltage VDD is supplied to the node 31 from the wiring 51 through the transistor 13, so that the potential V31 is increased and the transistor 11 is turned on. The voltage VDD is supplied to the node 33 from the wiring 51 through the transistor 11, so that the potential V33 is increased. Then, the potential V31 exceeds the voltage VDD because of a bootstrap operation, and accordingly the potential V33 is increased to the voltage VDD. A potential difference is thus generated between the component 73 and the component 72 but not between the component 73 and the component 71; therefore, the component 73 moves toward the component 72 (see FIG. 3A).

A bootstrap operation is specifically described. When the potential V31 increases to a value obtained by subtracting the threshold voltage of the transistor 13 from the potential of the gate of the transistor 13 (the high-level potential of the signal G2), the transistor 13 is turned off and the node 31 becomes floating. The capacitor 16 holds a difference between the potential V33 and the potential V31. Therefore, as the potential V33 increases, the potential V31 also increases. When the potential V31 is higher than the sum of the voltage VDD and the threshold voltage of the transistor 11, the potential V33 is increased to the voltage VDD.

In the period Tb, the level of the signal G1 is high and the level of the signal G2 becomes low. Thus, the transistor 13 remains off and the transistor 15 remains on. The signal DATA continues to be input to the node 32 from the wiring 55 through the transistor 15, and the potential V32 is controlled based on the signal DATA.

Figure 3B:
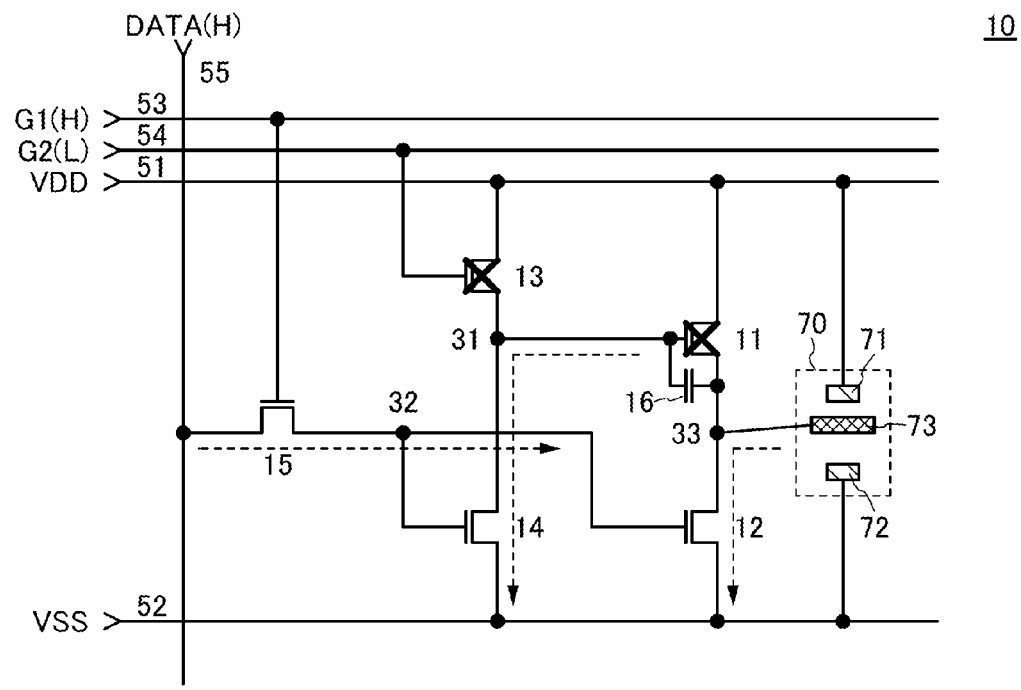

In the case where the level of the signal DATA is high as in FIG. 2A, the level of the potential V32 becomes high, so that the transistors 12 and 14 are turned on. The voltage VSS is supplied to the node 31 from the wiring 52 through the transistor 14, so that the level of the potential V31 becomes low and the transistor 11 is turned off. The voltage VSS is supplied to the node 33 from the wiring 52 through the transistor 12, and the potential V33 becomes the voltage VSS. Thus, a potential difference is generated between the component 73 and the component 71 but not between the component 73 and the component 72; therefore, the component 73 moves toward the component 71 (see FIG. 3B).

Figure 4A:
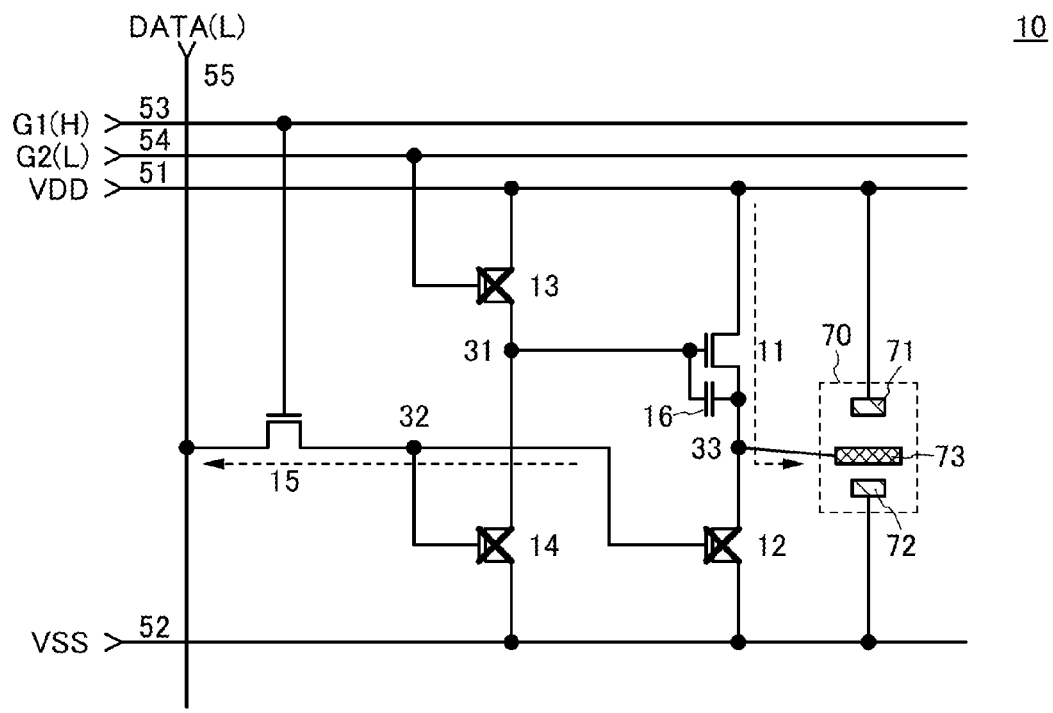
FIGS. 4A and 4B each show an example of the pixel.

In the case where the level of the signal DATA is low as shown in FIG. 2B, the level of the potential V32 remains low and the transistors 12 and 14 remain off. Since the node 31 remains in a floating state, the value of the potential V31 in the period Ta is kept and the transistor 11 remains on. The voltage VDD continues to be supplied to the node 33 from the wiring 51 through the transistor 11, and therefore the potential V33 is kept at the voltage VDD. Thus, a potential difference is generated between the component 73 and the component 72 but not between the component 73 and the component 71; therefore, the component 73 remains close to the component 72 (see FIG. 4A).

In the period Tc, the level of the signal G1 becomes low and the level of the signal G2 is low. Consequently, the transistor 13 remains off and the transistor 15 is turned off. The node 32 becomes floating, and therefore the value of the potential V32 in the period Tb is kept.

Figure 4B:
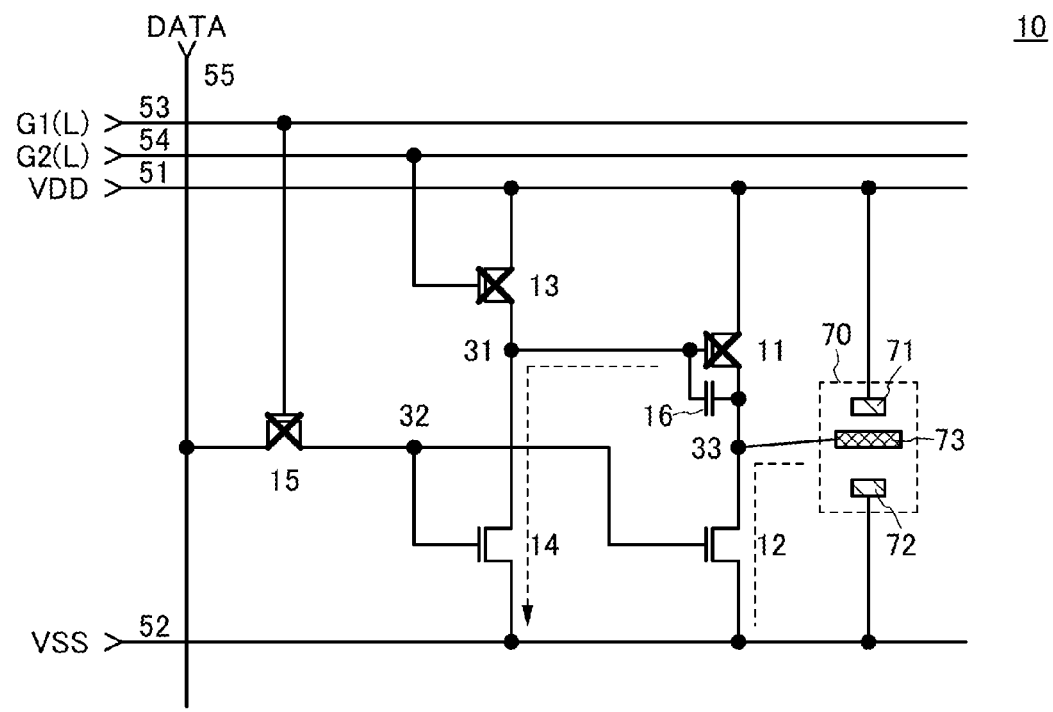

In the case where the level of the signal DATA is high in the period Tb as in FIG. 2A, the potential V31 is kept at a high level; accordingly, the transistors 12 and 14 remain on. The voltage VSS continues to be supplied to the node 31 from the wiring 52 through the transistor 14, so that the level of the potential V31 remains low and the transistor 11 remains off. The voltage VSS continues to be supplied to the node 33 from the wiring 52 through the transistor 12, so that the potential V33 becomes the voltage VSS. Thus, a potential difference is generated between the component 73 and the component 71 but not between the component 73 and the component 72; therefore, the component 73 remains close to the component 71 (see FIG. 4B).

Figure 5:
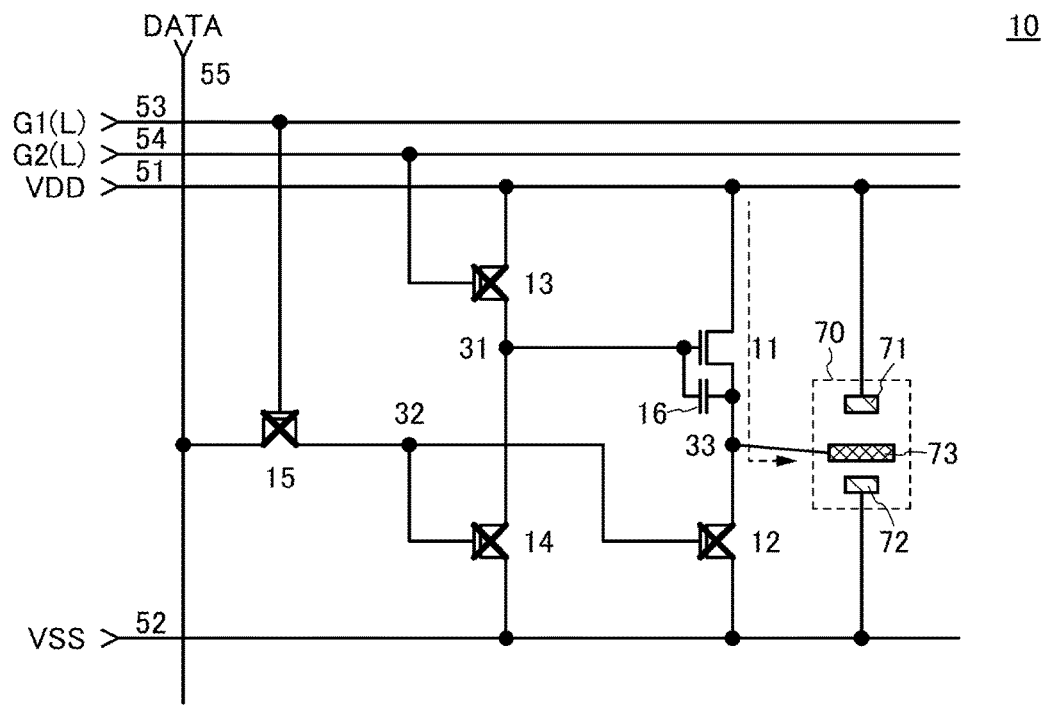
FIG. 5 shows an example the a pixel.

In the case where the level of the signal DATA is low in the period Tb as in FIG. 2B, the potential V32 is kept at a low level and the transistors 12 and 14 remain off. Since the node 31 remains in a floating state, the value of the potential V31 in the period Tb is kept and the transistor 11 remains on. The voltage VDD continues to be supplied to the node 33 from the wiring 51 through the transistor 11, so that the potential V33 remains the voltage VDD. Thus, a potential difference is generated between the component 73 and the component 71 but not between the component 73 and the component 72; therefore, the component 73 remains close to the component 72 (see FIG. 5).

In the pixel 10 in FIG. 1, the position of the component 73 during the period Tc can be controlled based on the signal DATA input in the period Tb. The gray level of the display element 70 can thus be controlled.

In the pixel 10 in FIG. 1, at least the voltage VDD or the voltage VSS can be supplied to the node 33 in the period Tc to prevent the node 33 from becoming floating. This can prevent a change in the potential of the component 73 which is caused by a movement of the components 71 to 73. Thus, the position of the component 73, i.e., the gray level, can be precisely controlled. Alternatively, malfunction can be prevented. Alternatively, the refresh rate can be decreased, leading to lower power consumption.

In the pixel 10 in FIG. 1, at least one of the transistors 11 and 12 is turned off and at least one of the transistors 13 and 14 is turned off throughout the periods Ta to Tc. This can prevent continuous flow of current between the wiring 51 and the wiring 52, leading to lower power consumption.

In the pixel 10 in FIG. 1, the signal DATA controls the on/off state of the transistors 12 and 14 connected to the wiring 52 but does not directly control the on/off state of the transistors 11 and 13 connected to the wiring 51. Therefore, the high-level potential of the signal DATA is set higher than the sum of the voltage VSS and the threshold voltage of the transistor 12 or 14 but not necessarily as high as the voltage VDD, and the amplitude voltage of the signal DATA can be reduced accordingly, so that power consumption can be reduced. Alternatively, the amplitude voltage of the signal G1 can also be reduced, leading to lower power consumption.

In the pixel 10 in FIG. 1, a bootstrap operation is performed when the node 31 becomes floating. Therefore, the high-level potential of the signal G2 is set higher than the sum of the voltage VSS and the threshold voltages of the transistors 13 and 11 but not necessarily as high as the voltage VDD, and the amplitude voltage of the signal G2 can be reduced accordingly. Thus, power consumption can be reduced.

In the pixel 10 in FIG. 1, the transistors 11 to 15 have the same polarity. Thus, manufacturing steps can be simplified, which enables improvement in yield and a reduction in costs. In particular, the transistors 11 to 15 in the pixel 10 in FIG. 1 are n-channel transistors, in which case transistors each including a channel formation region in an oxide semiconductor layer (hereinafter, also referred to as OS transistors) can be used as the transistors 11 to 15. Since an OS transistor has a low off-state current, the potential V31 and the potential V32 can be easily kept.

The transistor 15 has a function of controlling electrical continuity between the wiring 55 and the node 32. The transistor 15 has a function of controlling whether to supply the potential of the wiring 55 (the signal DATA) to the node 32. The transistor 15 has a function of controlling whether to input the signal DATA to the pixel 10. In other words, the transistor 15 has a function of controlling whether to write the signal DATA to the pixel 10. The transistor 15 has a function of controlling whether to set the potential V32 to the value at which the transistors 12 and 14 are turned off. The transistor 15 has a function of controlling whether to initialize the potential V32.

The transistor 13 has a function of controlling electrical continuity between the wiring 51 and the node 31. The transistor 13 has a function of controlling whether to supply the potential of the wiring 51 (the voltage VDD) to the node 31. The transistor 13 has a function of controlling whether to set the potential V31 to the value at which the transistor 11 is turned on. The transistor 13 has a function of controlling whether to make the node 31 become floating after setting the potential V31 to the value at which the transistor 11 is turned on. The transistor 13 has a function of controlling whether to initialize the potential V31.

The transistor 14 has a function of controlling electrical continuity between the wiring 52 and the node 31. The transistor 14 has a function of controlling whether to supply the potential of the wiring 52 (the voltage VSS) to the node 31. The transistor 14 has a function of controlling whether to set the potential V31 to the value at which the transistor 11 is turned off.

The transistor 11 has a function of controlling electrical continuity between the wiring 51 and the node 33. The transistor 11 has a function of controlling whether to supply the potential of the wiring 51 to the node 33. The transistor 11 has a function of controlling whether to set the potential V33 to a first value (at which the component 73 moves toward the component 72).

The transistor 12 has a function of controlling electrical continuity between the wiring 52 and the node 33. The transistor 12 has a function of controlling whether to supply the potential of the wiring 52 (the voltage VSS) to the node 33. The transistor 12 has a function of controlling whether to set the potential V33 to a second value (at which the component 73 moves toward the component 71).

The capacitor 16 has a function of holding a potential difference between the node 33 and the node 31. The capacitor 16 has a function of changing the potential V31 in response to a change in the potential V33.

The signal G1 has a high level and a low level. The signal G1 has the value at which the transistor 15 is turned on when the signal G1 is supplied to the gate of the transistor 15 and the value at which the transistor 15 is turned off when the signal G1 is supplied to the gate of the transistor 15. The signal G1 has a function of controlling the on/off state of the transistor 15. The signal G1 has a function of controlling the timing at which the signal DATA is input to the pixel 10. The signal G1 has a function of controlling the timing at which the potential V32 is set to the value at which the transistors 12 and 14 are turned off.

The signal G2 has a high level and a low level. The signal G2 has the value at which the transistor 13 is turned on when the signal G2 is supplied to the gate of the transistor 13 and the value at which the transistor 13 is turned off when the signal G2 is supplied to the gate of the transistor 13. The signal G2 has a function of controlling the on/off state of the transistor 13. The signal G2 has a function of controlling the timing at which the voltage VDD is supplied to the node 31. The signal G2 has a function of controlling the timing at which the potential V31 is set to the value at which the transistor 11 is turned on.

The voltage VDD is a constant value. The voltage VDD has a value that can set the potential V31 to the value at which the transistor 11 is turned on when the voltage VDD is supplied to the node 31 through the transistor 13. The voltage VDD is a value that can set the potential V33 to the first value (at which the component 73 moves toward the component 72) when the voltage VDD is supplied to the node 33 through the transistor 11. Furthermore, the voltage VDD has a function as a power supply voltage.

The voltage VSS is a constant value. The voltage VSS has a value that can set the potential V31 to the value at which the transistor 11 is turned off when the voltage VSS is supplied to the node 31 through the transistor 14. The voltage VSS is a value that can set the potential V33 to the second value (at which the component 73 moves toward the component 71) when the voltage VSS is supplied to the node 33 through the transistor 12. Furthermore, the voltage VSS has a function as a power supply voltage.

The wiring 51 has a function of transmitting the voltage VDD. The wiring 51 has a function as a power supply line.

The wiring 52 has a function of transmitting the voltage VSS. The wiring 52 has a function as a power supply line.

The wiring 53 has a function of transmitting the signal G1. The wiring 53 has a function as a signal line.

The wiring 54 has a function of transmitting the signal G2. The wiring 54 has a function as a signal line.

The wiring 55 has a function of transmitting the signal DATA. The wiring 55 has a function as a signal line.

The transistors 11 and 12 preferably have high current supply capability to drive the display element 70. In contrast, the current supply capability of the transistors 13 to 15 is not necessarily as high as that of the transistors 11 and 12 as long as the transistors 13 to 15 can drive the transistor 11 or 12. Thus, the channel width/channel length (W/L) ratio of the transistor 11 is preferably higher than that of the transistor 13. The W/L ratio of the transistor 11 is preferably higher than that of the transistor 14. The W/L ratio of the transistor 11 is preferably higher than that of the transistor 15. The W/L ratio of the transistor 12 is preferably higher than that of the transistor 13. The W/L ratio of the transistor 12 is preferably higher than that of the transistor 14. The W/L ratio of the transistor 12 is preferably higher than that of the transistor 15.

In the case where a transistor is formed of a plurality of transistors, the W/L ratio of the transistor is the sum of W/L ratios of the plurality of transistors. For example, in the case where the plurality of transistors are connected in parallel, W is the sum of Ws of the plurality of transistors and L is the average value of Ls of the plurality of transistors. In the case where the plurality of transistors are connected in series, W is the average value of Ws of the plurality of transistors and L is the sum of Ls of the plurality of transistors.

The current supply capability of the transistor 12 is preferably high in order to quickly reduce the potential V33 in the period Tb. In contrast, the current supply capability of the transistor 11 is not necessarily as high as that of the transistor 12 as long as the value of the potential V33 in the period Tb can be kept. Therefore, the W/L ratio of the transistor 12 is preferably higher than that of the transistor 11. Furthermore, since the transistor 11 or 12 preferably has a higher W/L ratio than any of the transistors 13 to 15, the transistor 12 preferably has the highest W/L ratio among the transistors (including those described later) in the pixel 10, in which case the potential V33 can be quickly reduced in the period Tb and the layout area can be reduced. However, the transistor 11 may have a higher W/L ratio than the transistor 12, i.e., the highest W/L ratio among the transistors (including those described later) in the pixel 10.

The transistor 14 preferably has high current supply capability to advance the timing at which the transistor 11 is turned off in the period Tb. In contrast, the current supply capability of the transistor 13 is not necessarily as high as that of the transistor 14 as long as the potential V31 can be set to the value at which the transistor 11 is turned on. Therefore, the W/L ratio of the transistor 14 is preferably higher than that of the transistor 13. Consequently, the time during which a shoot-through current is generated in the transistors 11 and 12 can be shortened to reduce power consumption and the layout area.

Preferably, the low level of the signal DATA is substantially equal to the voltage VSS, in which case the kinds of power supply voltages can be reduced. Note that the low level of the signal DATA may be lower than the voltage VSS. Thus, the pixel 10 can operate even if the transistors 12 and 14 are normally on.

The high level of the signal DATA is preferably lower than the voltage VDD, in which case the amplitude voltage of the signal DATA can be reduced and power consumption can be reduced accordingly.

The high level of the signal G1 is preferably lower than VDD, in which case the amplitude voltage of the signal G1 can be reduced.

In the period Ta, the pixel 10 is initialized. Specifically, the potential V31 is set to the value at which the transistor 11 is turned on and the potential V32 is set to the value at which the transistors 12 and 14 are turned off. The period Ta may be referred to as an initialization period.

In the period Tb, the signal DATA is input to the pixel 10. Specifically, the potential V33 is controlled based on the signal DATA. The period Tb may be referred to as a writing period.

In the period Tc, the pixel 10 performs display based on the signal DATA input in the period Tb. Specifically, charge based on the signal DATA input in the period Tb is held at the node 32, so that the value of the potential V33 in the period Tb is kept. Then, based on the potential V33, the gray level of the display element 70 is controlled. The period Tc may be referred to as a display period.

The periods Ta to Tc preferably belong to at least one frame period. That is, one frame period preferably includes the periods Ta to Tc.

The pixel 10 of one embodiment of the present invention is not limited to that in FIG. 1.

Figure 6A:
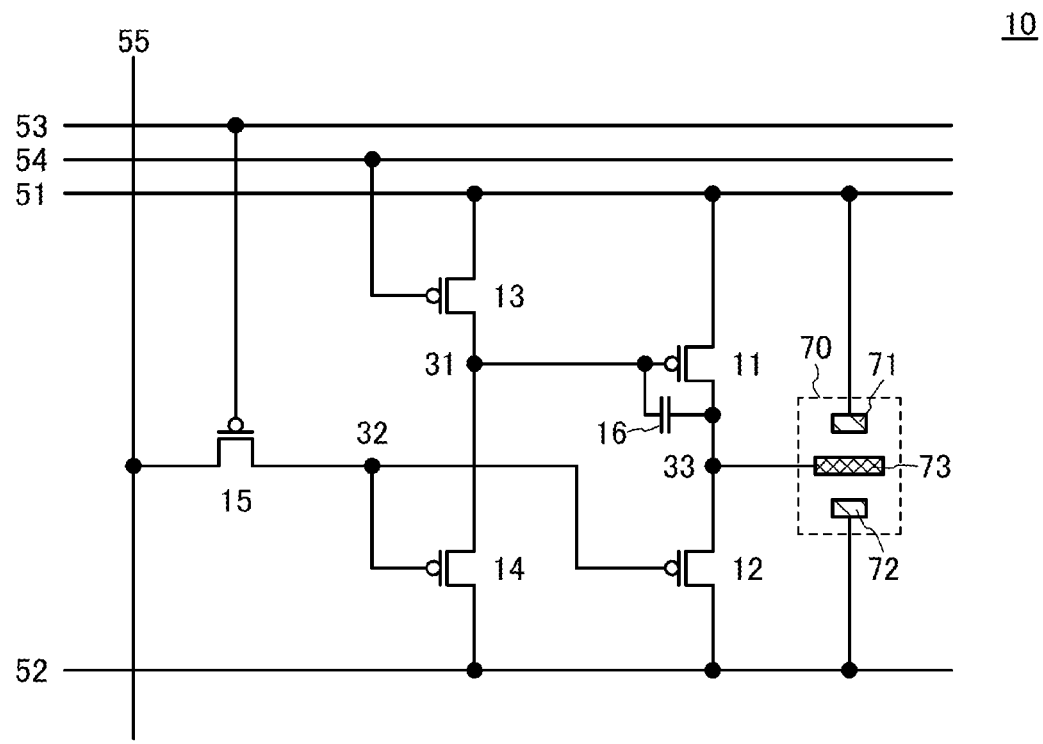
FIGS. 6A and 6B each show an example of a pixel.
Figure 6B:
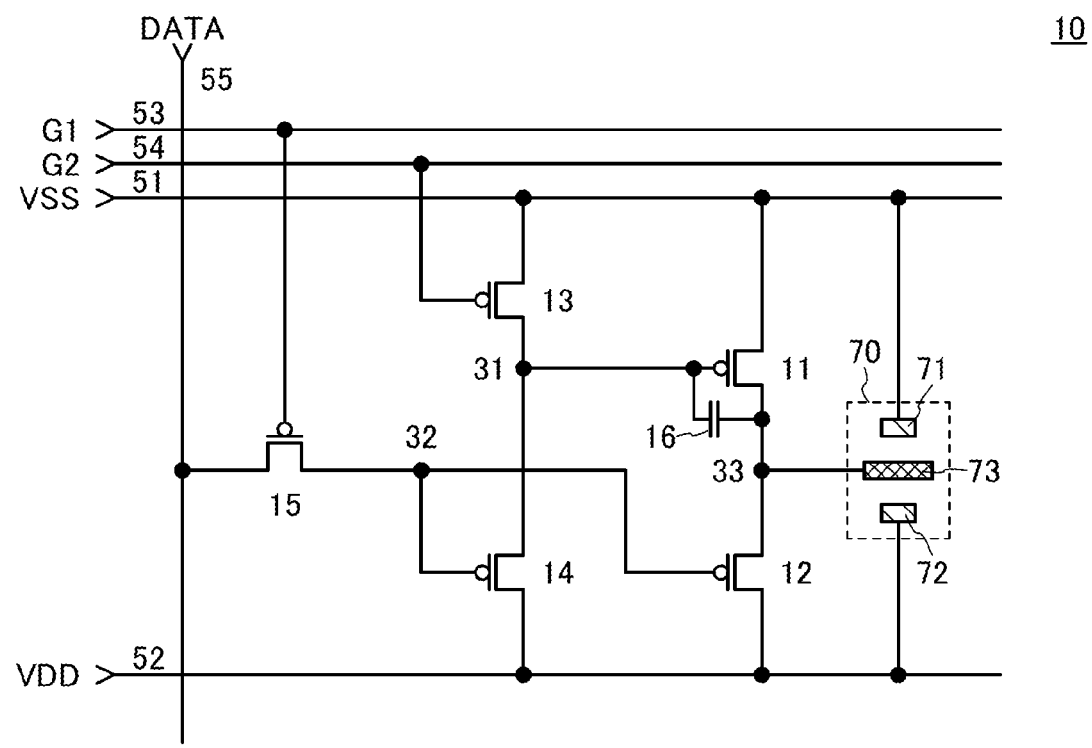
Figure 7A:
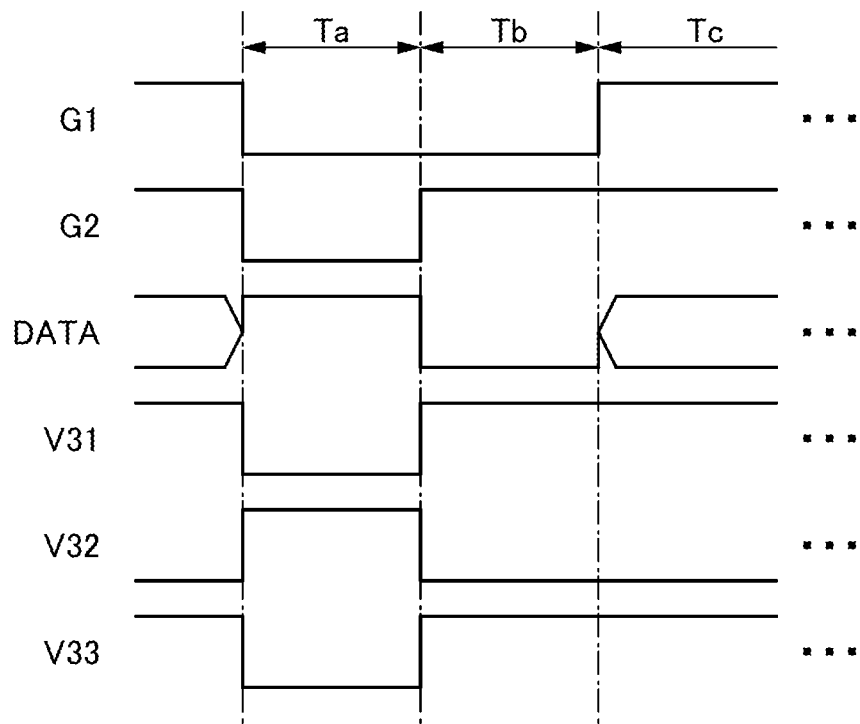
FIGS. 7A and 7B each show a chart of an example of the pixel.
Figure 7B:
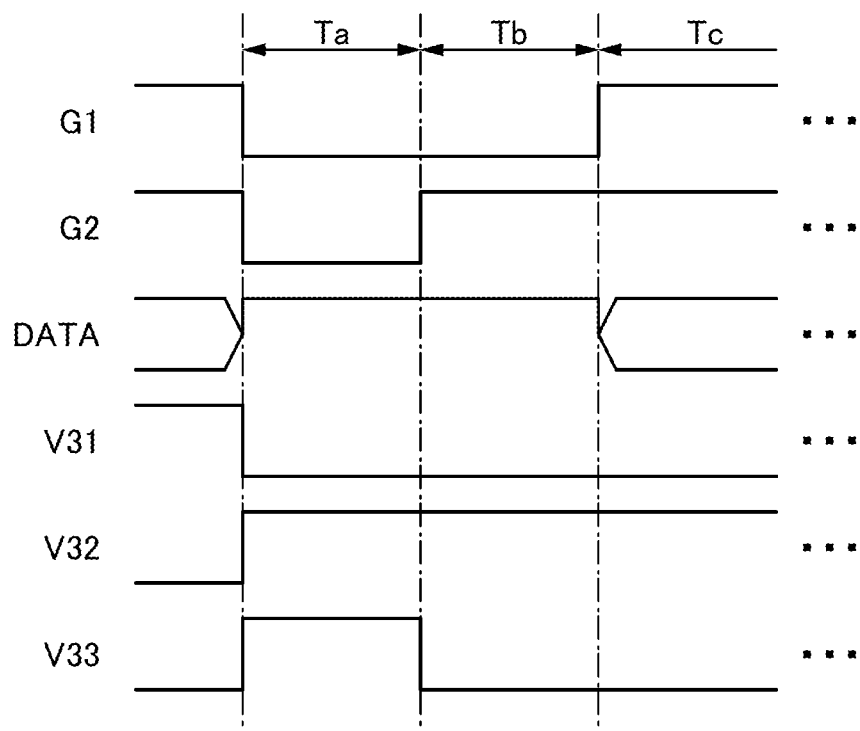

As in FIG. 6A, the transistors 11 to 15 may be p-channel transistors. Alternatively, only one or some (two, three, or four) of the transistors 11 to 15 may be p-channel transistors. In the case where the transistors 11 to 15 are p-channel transistors, as in FIGS. 7A and 7B, the signal G1, the signal G2, and the signal DATA are preferably inversion signals of those in FIGS. 2A and 2B. In addition, the voltage VSS and the voltage VDD are preferably input to the wiring 51 and the wiring 52, respectively, as in FIG. 6B.

Figure 8A:
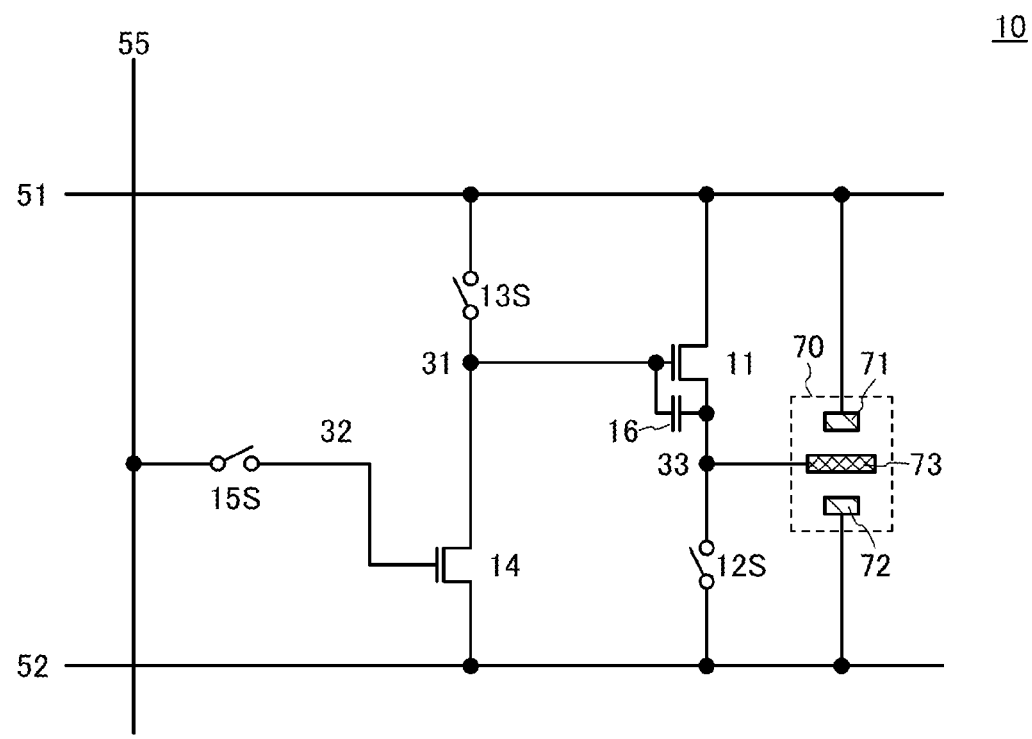
FIGS. 8A and 8B each show an example of a pixel.
Figure 8B:
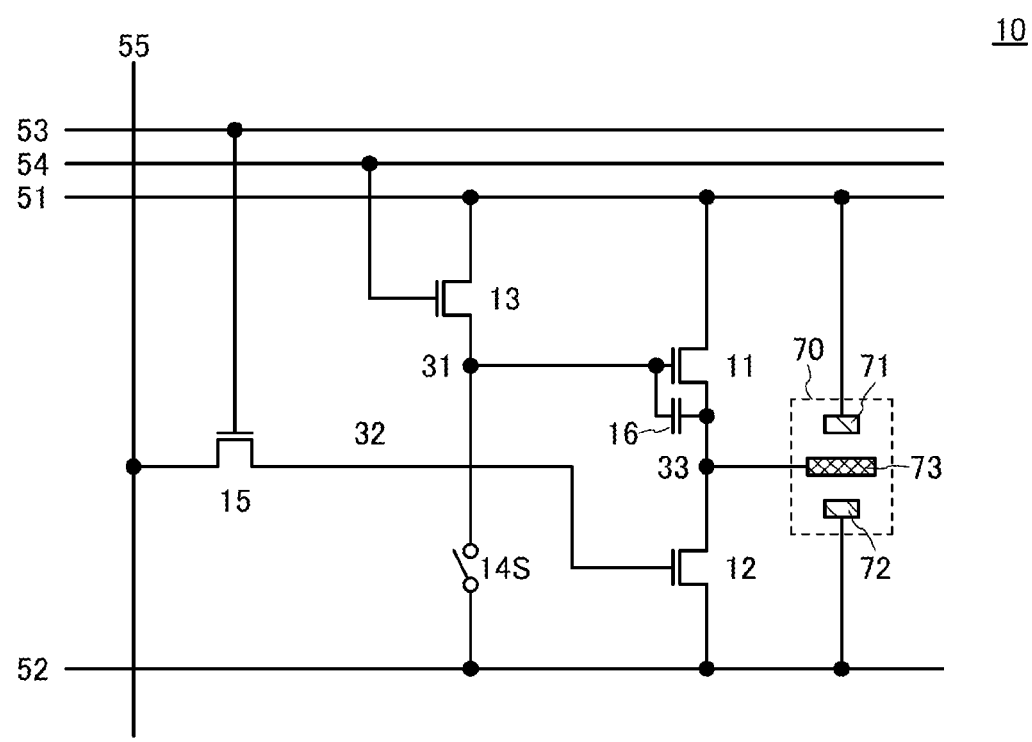

As in FIG. 8A, the transistor 12, the transistor 13, and the transistor 15 may be replaced with a switch 12S, a switch 13S, and a switch 15S, respectively. As in FIG. 8B, the transistor 14 may be replaced with a switch 14S. Note that only one or some (two or three) of the transistors 12 to 15 may be replaced with switches. Alternatively, one or both of the transistors 11 and 12 may be replaced with switches.

Figure 9A:
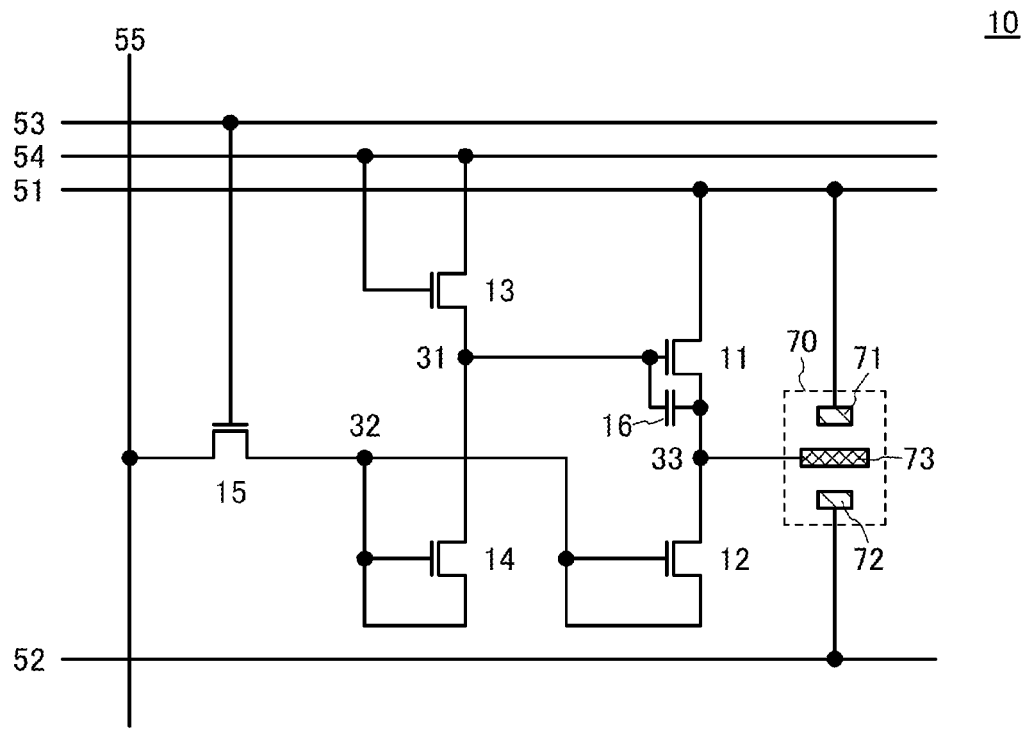
FIGS. 9A and 9B each show an example of a pixel.

As shown in FIG. 9A, the transistors 12 to 14 may be diode-connected transistors (in each of the transistors 12 to 14, the gate may be connected to the first terminal or the second terminal). In FIG. 9A, the first terminal and the gate of the transistor 12 are connected to the node 32, the first terminal and the gate of the transistor 13 are connected to the wiring 54, and the first terminal and the gate of the transistor 14 are connected to the node 32. Alternatively, the first terminal and the gate of the transistor 12 may be connected to the node 32 and the node 33, respectively. The first terminal and the gate of the transistor 13 may be connected to the wiring 54 and the node 31, respectively. The first terminal and the gate of the transistor 14 may be connected to the node 32 and node 31, respectively. Alternatively, only one or two of the transistors 12 to 14 may be diode-connected transistors.

Figure 9B:
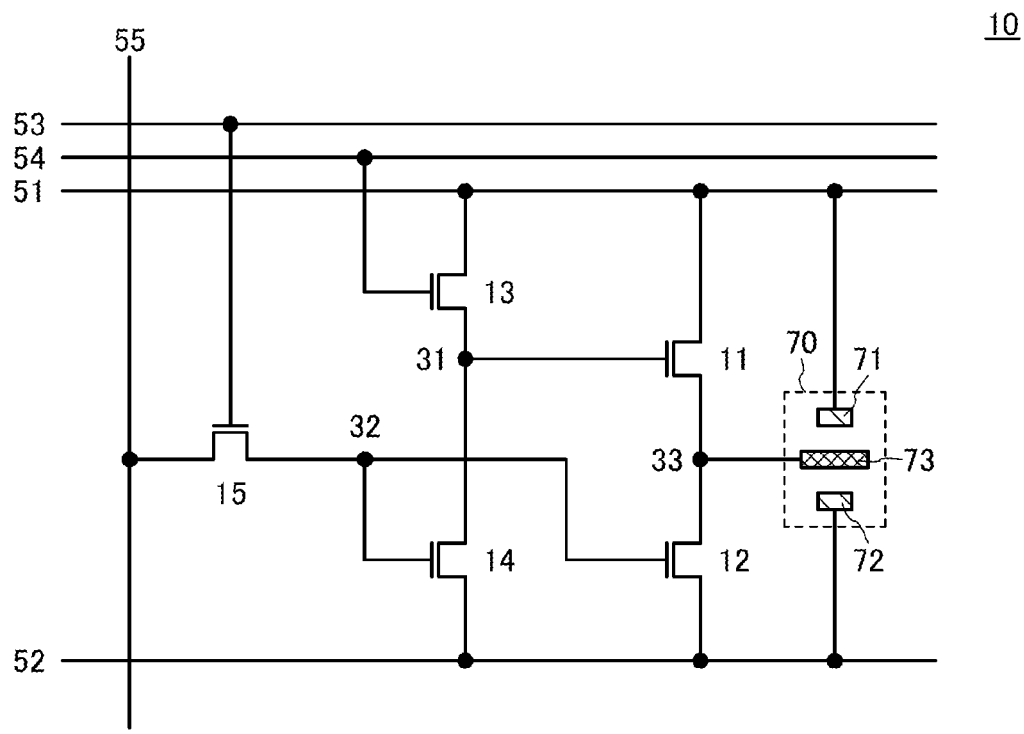

As shown in FIG. 9B, the capacitor 16 may be omitted. The potential difference between the node 33 and the node 31 can be held by parasitic capacitance between the second terminal and the gate of the transistor 11.

Figure 10A:
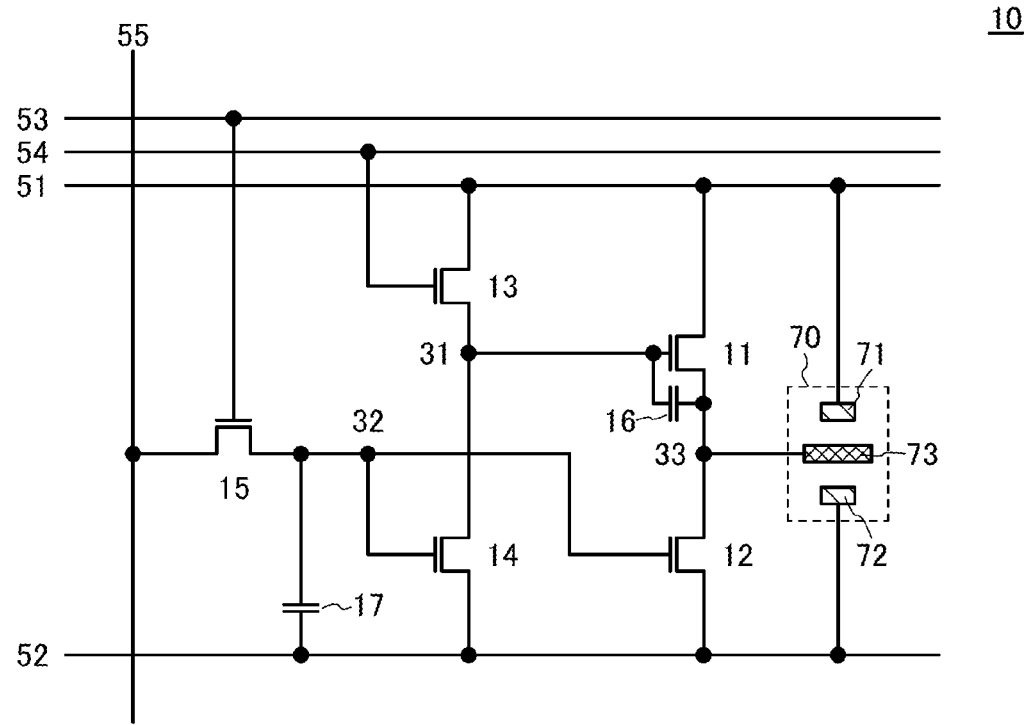
FIGS. 10A and 10B each show an example of a pixel.

As shown in FIG. 10A, a capacitor 17 may be provided. A first electrode of the capacitor 17 is connected to the wiring 52. A second electrode of the capacitor 17 is connected to the node 32. Note that the first electrode of the capacitor 17 may be connected to the wiring 51, the node 33, or another wiring that is not shown.

Figure 10B:
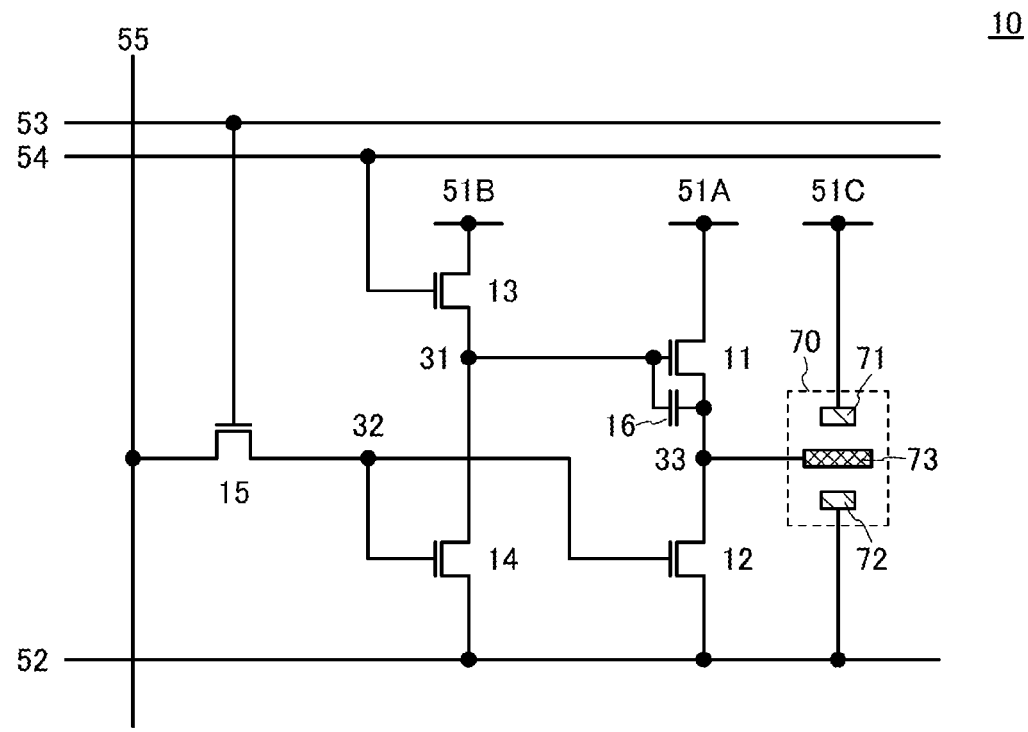
Figure 11A:
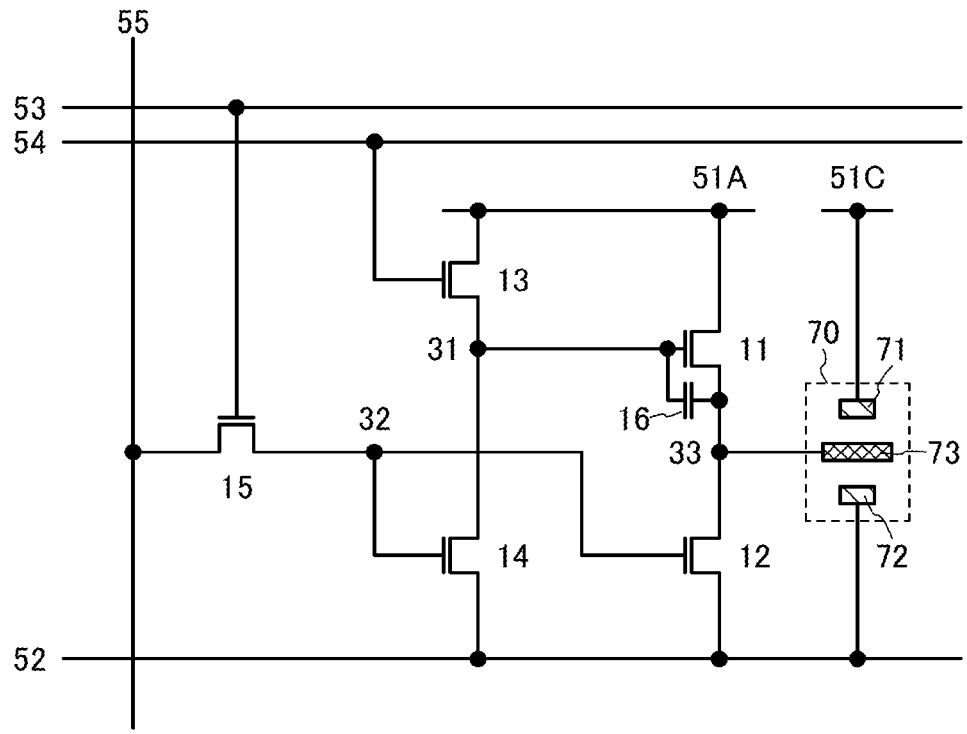
FIGS. 11A and 11B each show an example of a pixel.

As shown in FIG. 10B, the first terminal of the transistor 11, the first terminal of the transistor 13, and the component 71 may be connected to different wirings. The first terminal of the transistor 11 is connected to a wiring 51A, the first terminal of the transistor 13 is connected to a wiring 51B, and the component 71 is connected to a wiring 51C. The wirings 51A to 51C correspond to the wiring 51. The same voltage or signal or the like may be input to the wirings 51A to 51C, or different voltages or signals or the like may be input thereto. Any two of the first terminal of the transistor 11, the first terminal of the transistor 13, and the component 71 may be connected to the same wiring; in FIG. 11A, the first terminal of the transistor 11 and the first terminal of the transistor 13 are connected to the wiring 51A, and the component 71 is connected to the wiring 51C.

Figure 11B:
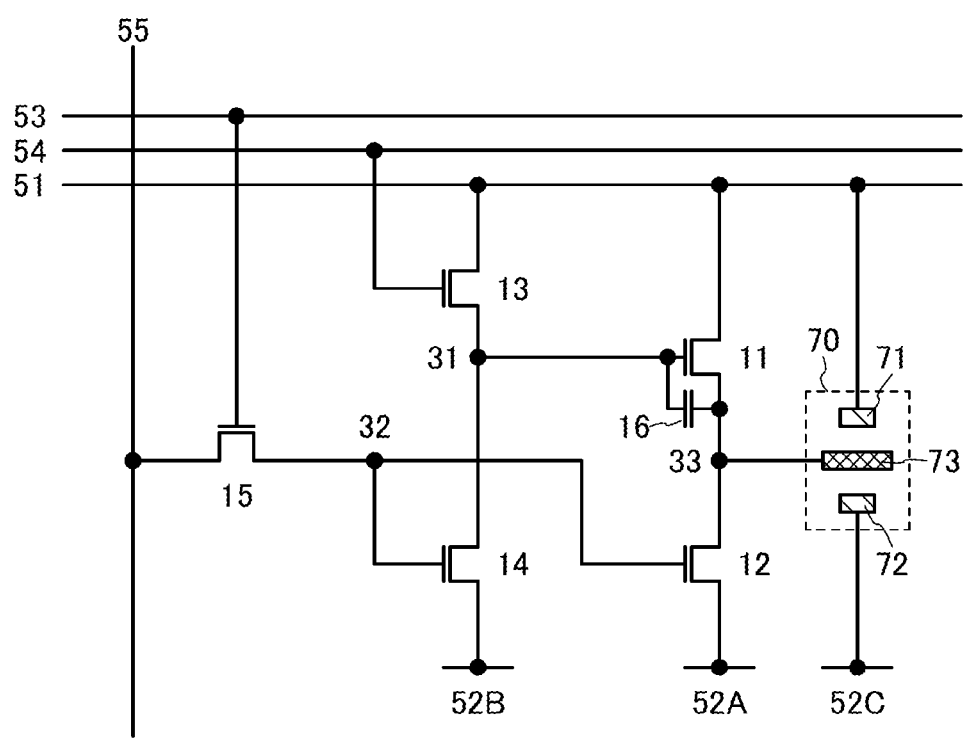

As shown in FIG. 11B, the first terminal of the transistor 12, the first terminal of the transistor 14, and the component 72 may be connected to different wirings. The first terminal of the transistor 12 is connected to a wiring 52A, the first terminal of the transistor 14 is connected to a wiring 52B, and the component 72 is connected to a wiring 52C. The wirings 52A to 52C correspond to the wiring 52. The same voltage or signal or the like may be input to the wirings 52A to 52C, or different voltages or signals or the like may be input thereto. Any two of the first terminal of the transistor 12, the first terminal of the transistor 14, and the component 72 may be connected to the same wiring.

Figure 12A:
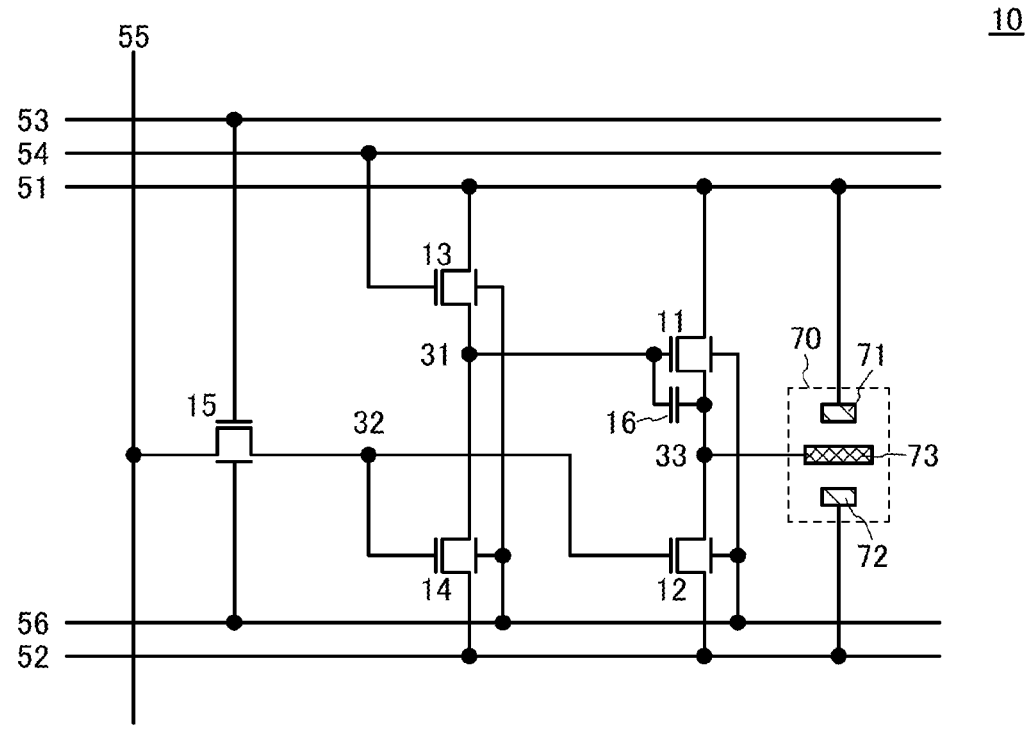
FIGS. 12A and 12B each show an example of a pixel.
Figure 12B:
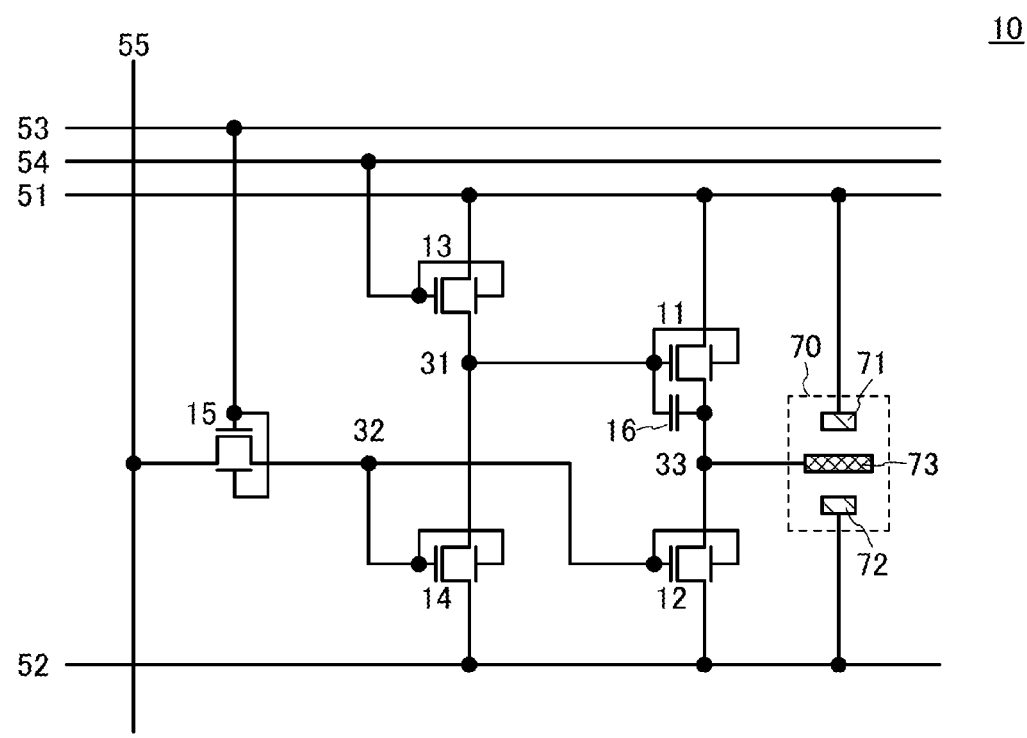

As shown in FIG. 12A, each of the transistors 11 to 15 may be provided with a back gate (also referred to as a second gate). In other words, each of the transistors 11 to 15 may include two gate electrodes and a channel formation region between the two gate electrodes or a semiconductor layer including a region between the two gate electrodes. In FIG. 12A, the back gates of the transistors 11 to 15 are connected to a wiring 56. Controlling the potential of the wiring 56 can change characteristics of the transistors 11 to 15. In particular, when the potential of the wiring 56 is set lower than the potential of the wiring 52, the threshold voltages of the transistors 11 to 15 can be shifted in the negative direction. Alternatively, only one or some (two, three, or four) of the transistors 11 to 15 may be provided with a back gate. As shown in FIG. 12B, two gates may be connected to each other. The back gates of the transistors 11 to 15 may be connected to the wiring 52.

Figure 13A:
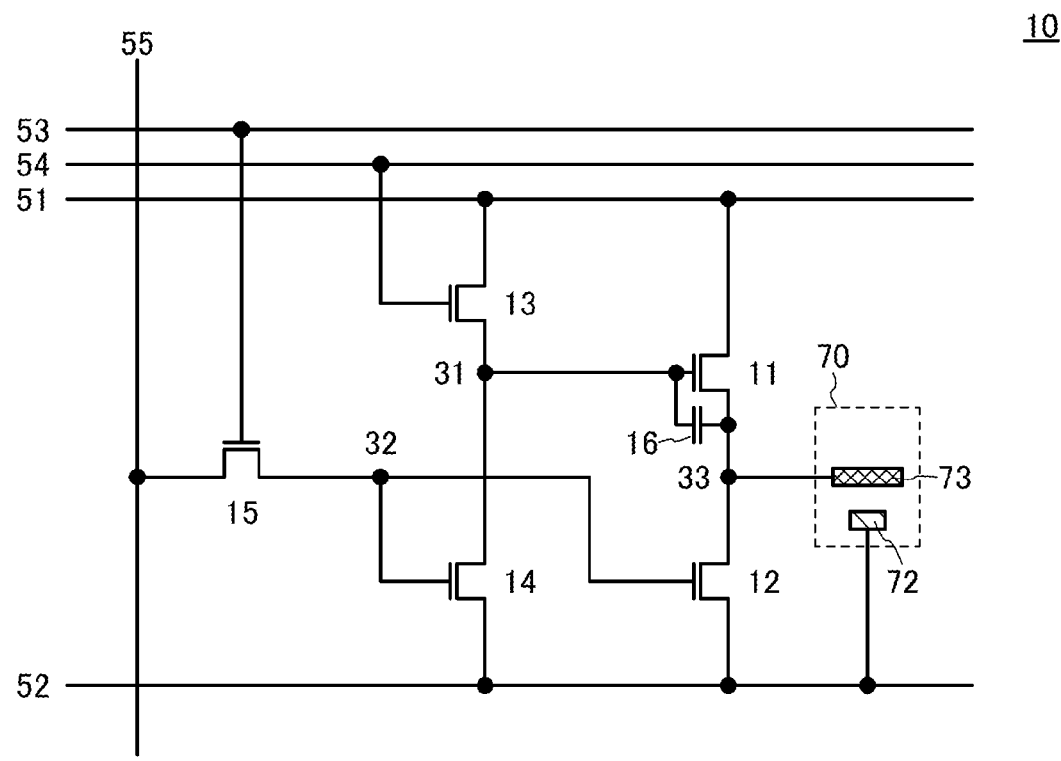
FIGS. 13A and 13B each show an example of a pixel.

As shown in FIG. 13A, the component 71 may be omitted in the display element 70. Alternatively, the component 72 may be omitted in the display element 70.

Figure 13B:
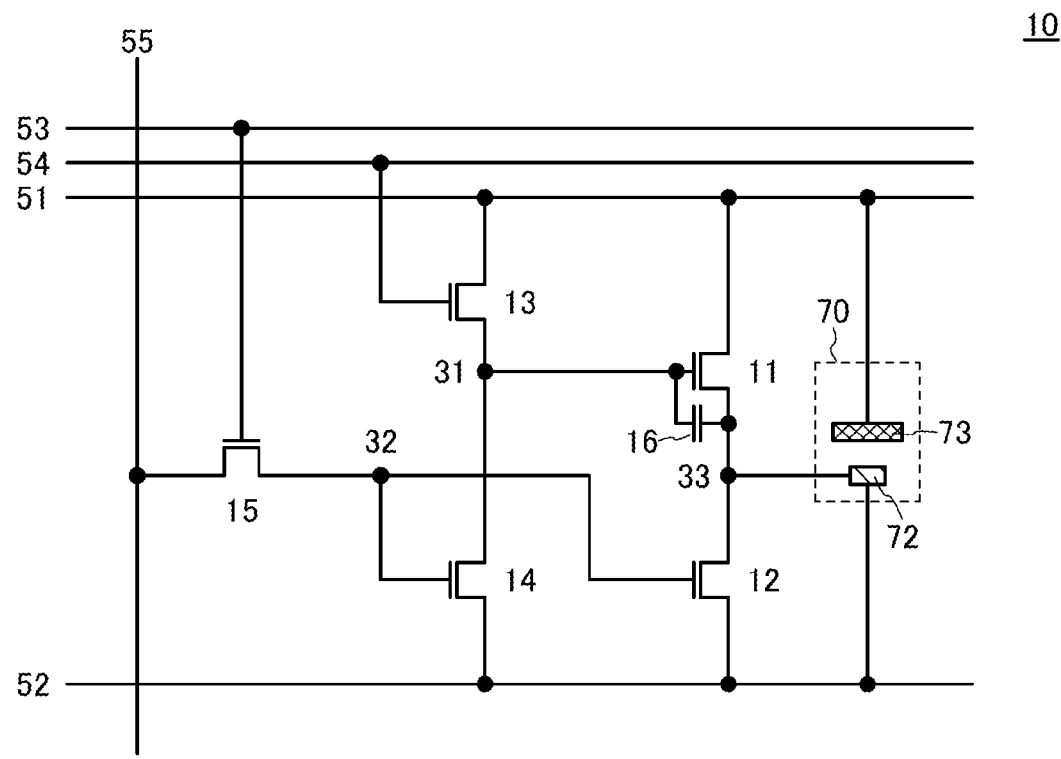

As shown in FIG. 13B, in the display element 70, the component 72 and the component 73 may be connected to the node 33 and the wiring 51, respectively, while the component 71 is omitted. Note that the component 73 may be connected to the wiring 52 or another wiring that is not shown. Alternatively, in the display element 70, the component 71 and the component 73 may be connected, respectively, to the node 33 and to the wiring 51, the wiring 52, or a wiring that is not shown while the component 72 is omitted.

Figure 14A:
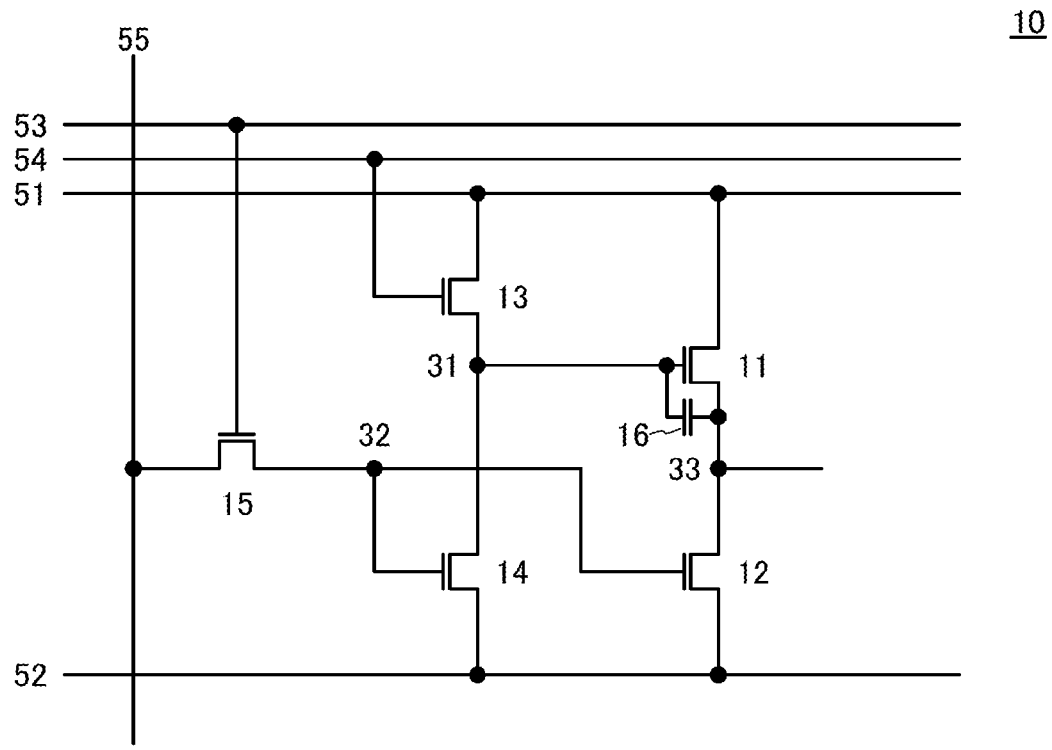
FIGS. 14A and 14B each show an example of a pixel.
Figure 14B:
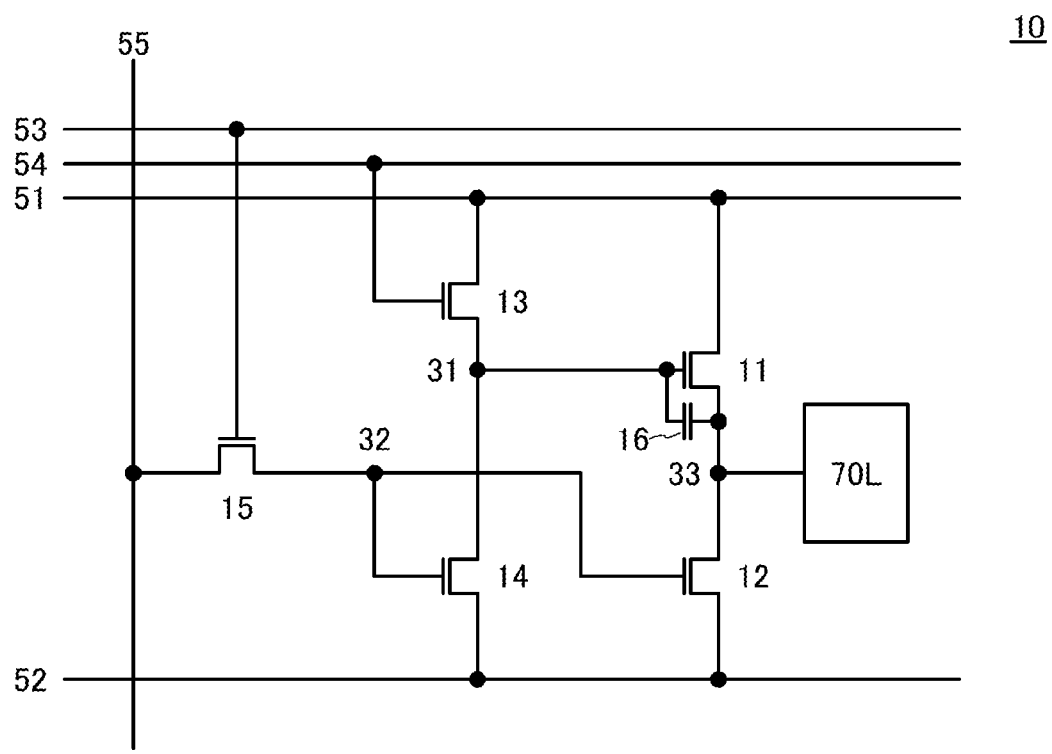

As shown in FIG. 14A, the display element 70 may be omitted. As shown in FIG. 14B, a load 70L may be connected instead of the display element 70. In this manner, application of the pixel of one embodiment of the present invention is not limited to display devices.

The display element 70 is not limited to the structure shown in FIG. 1. As the display element 70, a microelectromechanical systems (MEMS) device can be used. Examples of MEMS devices include a display element using MEMS, a digital micromirror device (DMD), a digital micro shutter (DMS), an interferometric modulator display (IMOD) element, a MEMS shutter display element, and an optical-interference-type MEMS display element. Note that the present invention is not limited to this. For example, in this specification and the like, a display element, a display device including a display element, a light-emitting element, and a light-emitting device including a light-emitting element can employ a variety of modes or can include a variety of elements. The display element, the display device, the light-emitting element, or the light-emitting device includes at least one of the following, for example: an electroluminescent (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using MEMS, a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, and a projection liquid crystal display). Examples of display devices including electronic ink, electronic liquid powder (registered trademark), or electrophoretic elements include electronic paper. In a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. When graphene or graphite is provided in this manner, a nitride semiconductor, for example, an n-type GaN semiconductor layer including crystals can be easily formed thereover. Furthermore, a p-type GaN semiconductor layer including crystals or the like can be provided thereover, and thus the LED can be formed. Note that an MN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

Figure 33:
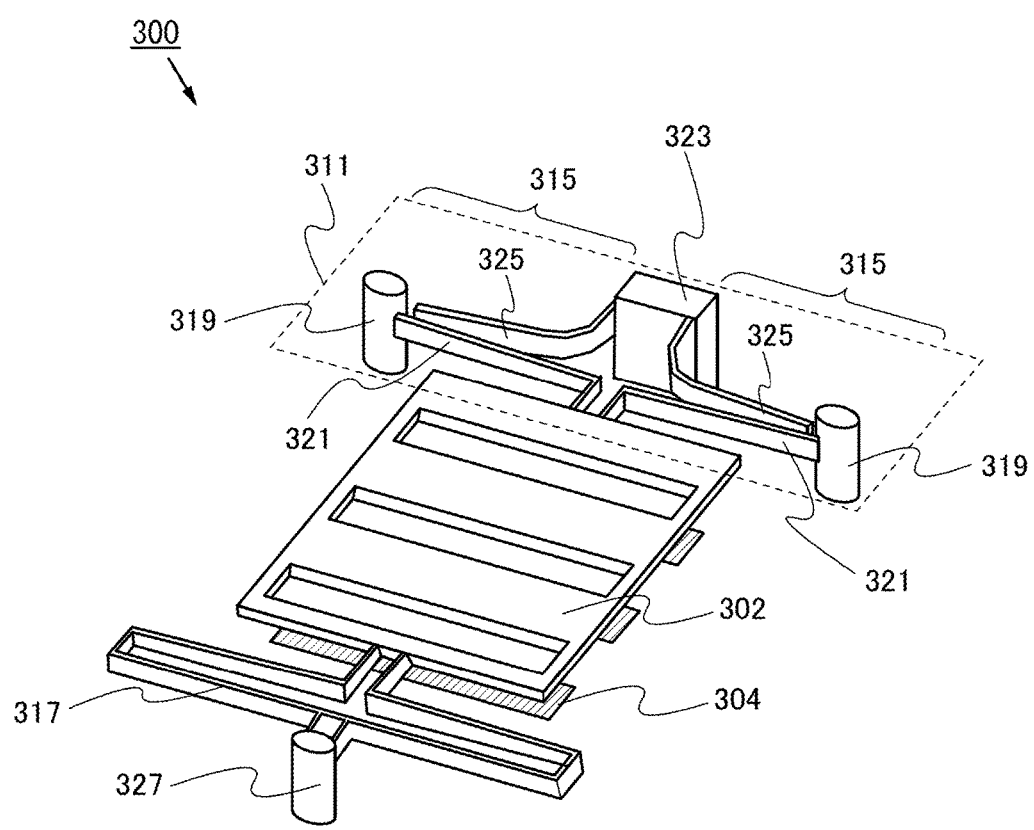
FIG. 33 illustrates an example of a display element.

An example of the structure of the MEMS shutter that can be used as the display element 70 is described. FIG. 33 illustrates a shutter 300. The shutter 300 includes a movable light-blocking layer 302 bonded to an actuator 311. The actuator 311 is provided over a light-blocking layer (not illustrated for simplicity) having an opening 304 and includes two flexible actuators 315. A side of the movable light-blocking layer 302 is electrically connected to the actuators 315. The actuators 315 have a function of moving the movable light-blocking layer 302 in a lateral direction parallel to the surface of the light-blocking layer having the opening 304.

The actuators 315 each include a movable electrode 321 electrically connected to the movable light-blocking layer 302 and a structure body 319, and a movable electrode 325 electrically connected to the structure body 323. The movable electrode 325 is adjacent to the movable electrode 321. One end of the movable electrode 325 is electrically connected to the structure body 323, and the other end thereof can be freely moved. The other end of the movable electrode 325 which can be moved freely is curved so as to be closest to a connection portion of the movable electrode 321 and the structure body 319.

The other side of the movable light-blocking layer 302 is connected to a spring 317 which returns to its original shape after force is applied by the actuator 311. The spring 317 is connected to the structure body 327.

The structure bodies 319, the structure body 323, and the structure body 327 function as mechanical supports to make the movable light-blocking layer 302, the actuators 315, and the spring 317 float in the vicinity of the surface of the light-blocking layer having the opening 304.

Under the movable light-blocking layer 302, the opening 304 surrounded by the light-blocking layer is provided. Note that the shapes of the movable light-blocking layer 302 and the opening 304 are not limited to these.

The structure body 323 included in the shutter 300 is electrically connected to a transistor (not illustrated). The transistor drives the movable light-blocking layer. Thus, a given voltage can be applied from the transistor to the movable electrode 325 connected to the structure body 323. The structure bodies 319 and 327 are each connected to a ground electrode (GND). Accordingly, the movable electrode 321 connected to the structure body 319 and the spring 317 connected to the structure body 327 each have a potential of GND. Note that the structure bodies 319 and 327 may be electrically connected to a common electrode which can apply a given voltage. The structure bodies 319 and 327 may be replaced with another actuator 311 so that the shutter includes the two actuators 311.

When voltage is applied to the movable electrode 325, the movable electrode 325 and the movable electrode 321 are electrically attracted to each other by a potential difference therebetween. As a result, the movable light-blocking layer 302 connected to the movable electrode 321 is drawn toward the structure body 323 to move to the structure body 323 in the lateral direction. Because the movable electrode 321 functions as a spring, when the potential difference between the movable electrodes 321 and 325 is eliminated, the movable electrode 321 releases the stress accumulated therein so that the movable light-blocking layer 302 returns to its original position. In a state where the movable electrode 321 is drawn to the movable electrode 325, the movable light-blocking layer 302 may block the opening 304 or may be positioned so as not to overlap with the opening 304.

The node 33 may be electrically connected to the structure body 323. Alternatively, the node 33 may be connected to the structure body 327. Alternatively, the node 33 may be connected to the structure body 319.

Figure 15:
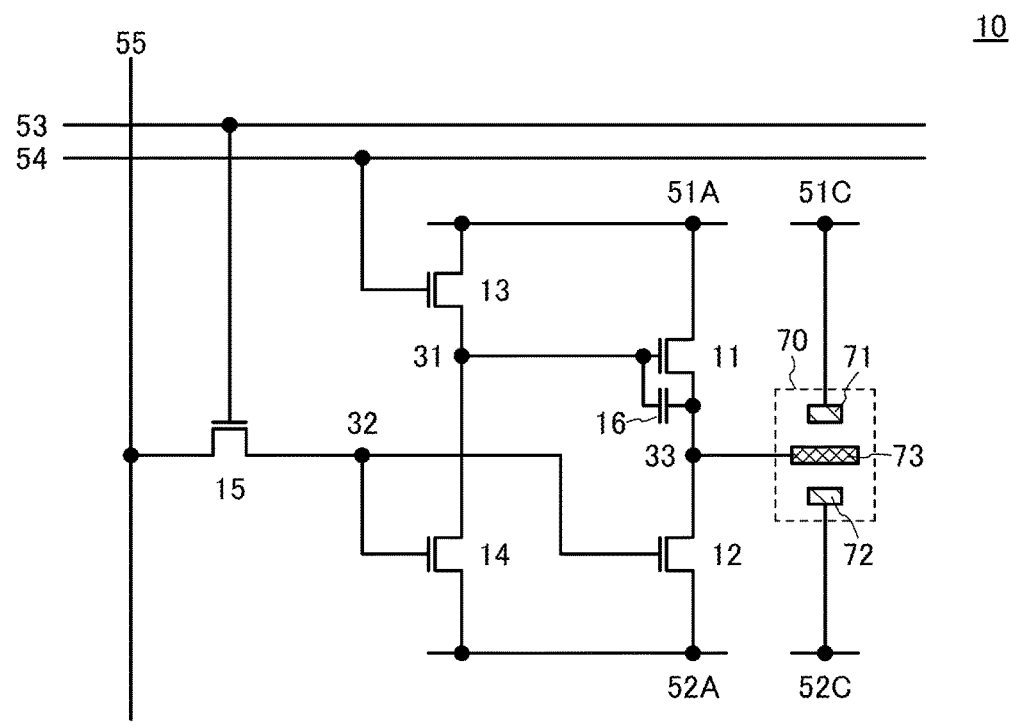
FIG. 15 shows an example of a pixel.

Two or more of the above structures (e.g., the structures described referring to FIGS. 6A and 6B, FIGS. 7A and 7B, FIGS. 8A and 8B, FIGS. 9A and 9B, FIGS. 10A and 10B, FIGS. 11A and 11B, FIGS. 12A and 12B, FIGS. 13A and 13B, and FIGS. 14A and 14B and the structures not referring to the drawings) can be applied as appropriate to the pixel 10 shown in FIG. 1. For example, according to the structures described with reference to FIG. 10B, FIG. 11A, and FIG. 12B, in the pixel in FIG. 1, the first terminal of the transistor 11 and the first terminal of the transistor 13 may be connected to the wiring 51A, the component 71 may be connected to the wiring 51C, the first terminal of the transistor 12 and the first terminal of the transistor 14 may be connected to the wiring 52A, and the component 72 may be connected to the wiring 52C (see FIG. 15). In particular, in FIG. 15, the potentials of the components 71 and 72 can be independently controlled. Therefore, the potentials of the wirings 51C and 52C may be inverted every predetermined period (e.g., one frame period or one gate selection period). For example, in the first frame period, the voltage VDD and the voltage VSS may be supplied to the wiring 51C and the wiring 52C respectively, and in a second frame period, the voltage VSS and the voltage VDD may be supplied to the wiring 51C and the wiring 52C respectively.

Figure 31:
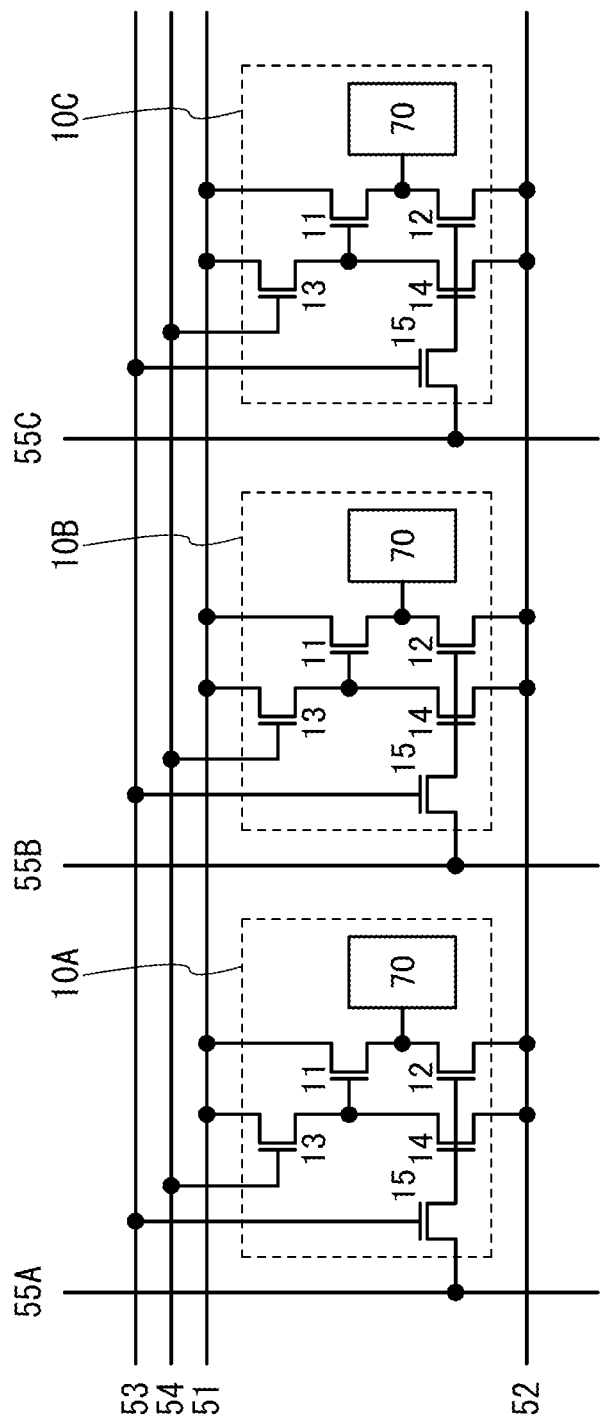
FIG. 31 shows an example of a pixel.
Figure 32:
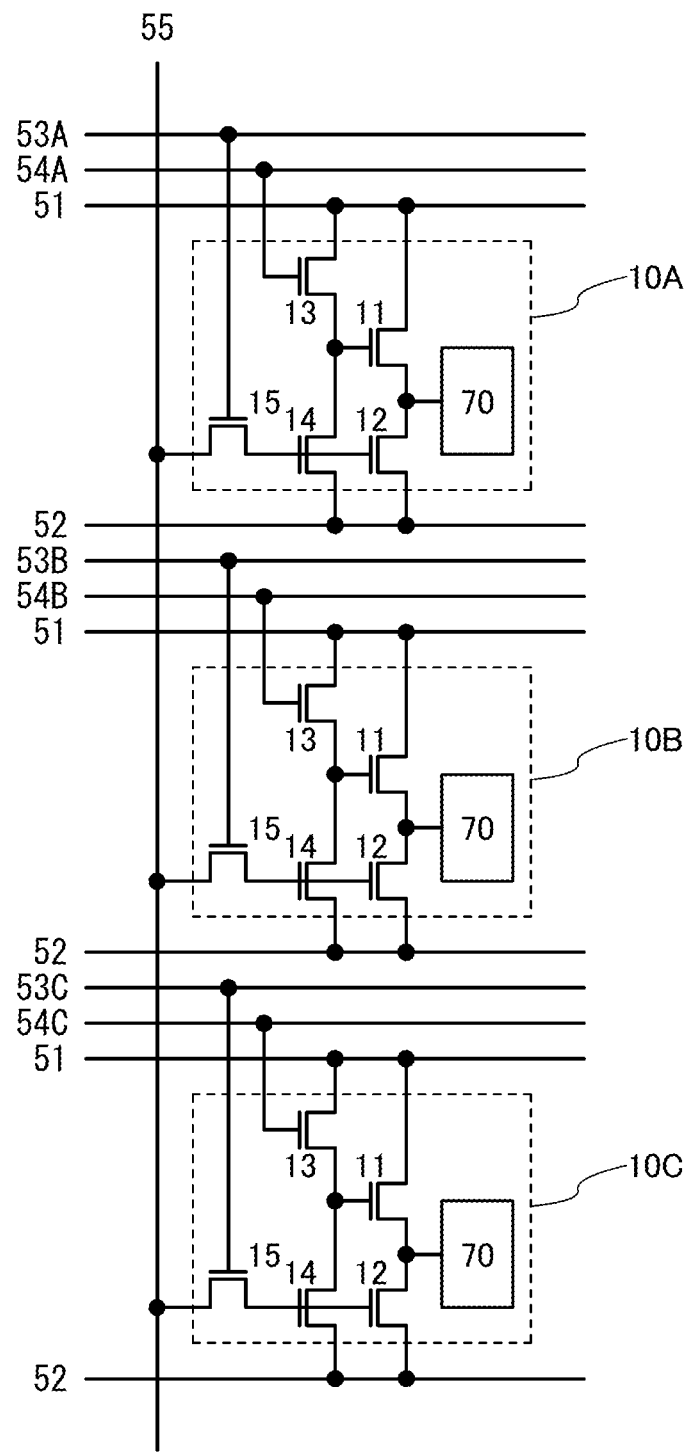
FIG. 32 shows an example of a pixel.

Multiple gray levels can be achieved by a time grayscale method or an area grayscale method. It is preferable in a time grayscale method that one frame period include a plurality of sub-frame periods and each of the plurality of sub-frame periods include the periods Ta to Tc. The display element 70 is controlled in each of the plurality of sub-frame periods, whereby multiple gray levels can be achieved. In an area grayscale method, the pixel 10 includes a plurality of sub-pixels, and the display elements 70 in the plurality of sub-pixels are independently controlled, whereby multiple gray levels can be achieved. FIG. 31 shows a structure in which the pixel 10 includes three sub-pixels (a sub-pixel 10A, a sub-pixel 10B, and a sub-pixel 10C), and three wirings (a wiring 55A, a wiring 55B, and a wiring 55C) instead of the wiring 55. FIG. 32 shows a structure in which the pixel 10 includes three sub-pixels (a sub-pixel 10A, a sub-pixel 10B, and a sub-pixel 10C), three wirings (a wiring 53A, a wiring 53B, and a wiring 53C) instead of the wiring 53, and three wirings (a wiring 54A, a wiring 54B, and a wiring 54C) instead of the wiring 54.

Color display can be performed by a sequential method or using a color filter. It is preferable in a sequential method that one frame period include a plurality of periods and each of the plurality of periods include the periods Ta to Tc; the color of light from a backlight is varied in each of the plurality of periods to perform color display. For example, one frame period includes first to third periods; the color of light from a backlight is varied to red in a first period, the color of light from the backlight is varied to green in a second period, and the color of light from the backlight is varied to blue in a third period. In the case of using a color filter, the color filter is provided to overlap with the display element 70. For example, the pixel 10 in which the display element 70 overlaps with a red color filter, the pixel 10 in which the display element 70 overlaps with a green color filter, and the pixel 10 in which the display element 70 overlaps with a blue color filter are provided to perform color display.

This embodiment can be combined with any other embodiment as appropriate. Note that a content (or part thereof) described in one embodiment may be applied to, combined with, or replaced with a different content (or part thereof) described in the embodiment and/or a content (or part thereof) described in one or more different embodiments. Note that in each embodiment, a content described in the embodiment is a content described with reference to a variety of diagrams or a content described with text in this specification. In addition, by combining a diagram (or part thereof) described in one embodiment with another part of the diagram, a different diagram (or part thereof) described in the embodiment, and/or a diagram (or part thereof) described in another embodiment or other embodiments, much more diagrams can be created. The same can be applied to any other embodiment.

Embodiment 2

In this embodiment, a modification example of Embodiment 1 is described.

Modification Example 1

Figure 16A:
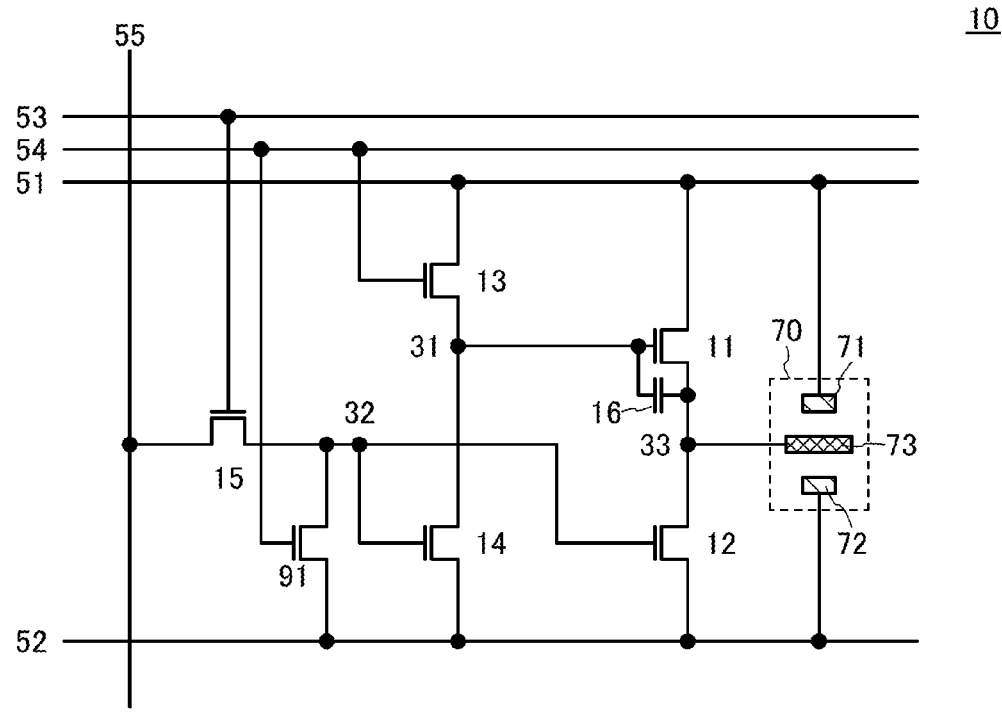
FIGS. 16A and 16B each show an example of a pixel.

FIG. 16A is different from FIG. 1 in that a transistor 91 is provided. A first terminal of the transistor 91 is connected to the wiring 52, a second terminal of the transistor 91 is connected to the node 32, and a gate of the transistor 91 is connected to the wiring 54. The transistor 91 preferably has the same polarity as the transistors 11 to 15.

Figure 16B:
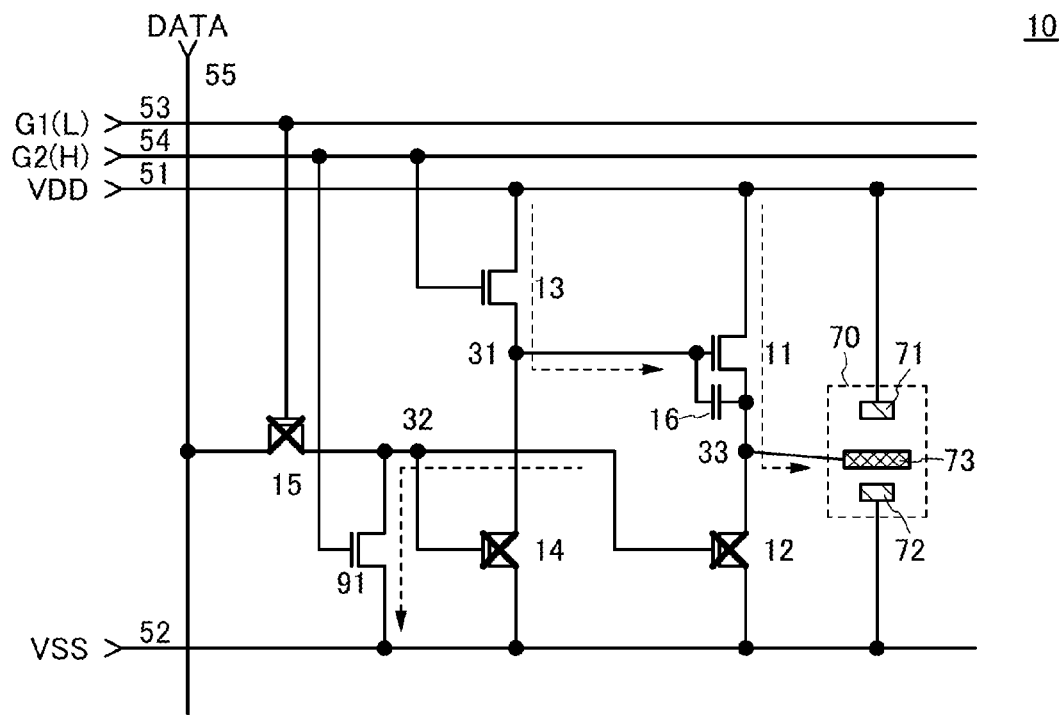
Figure 17A:
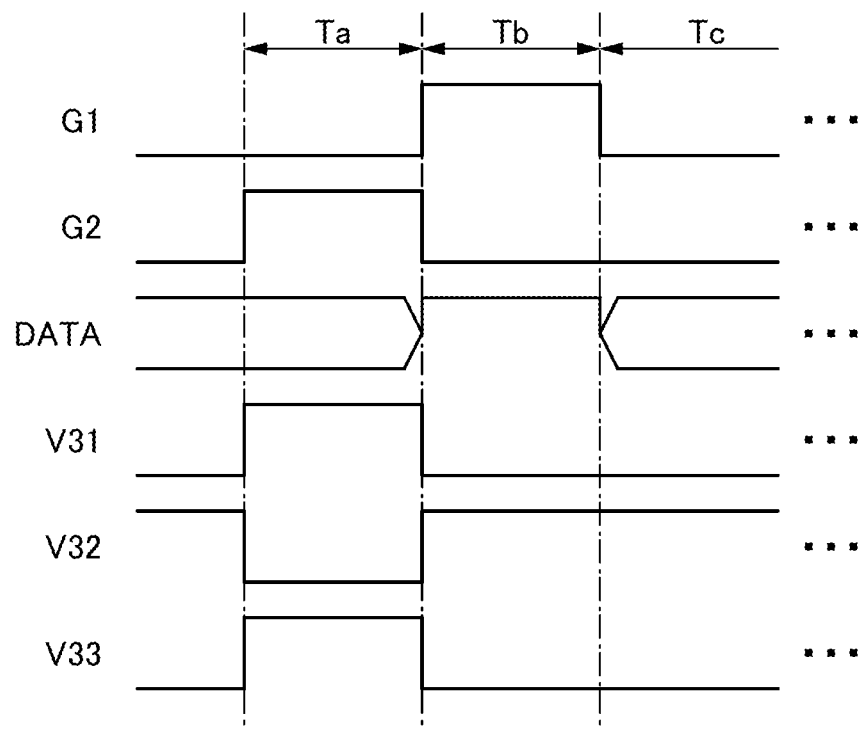
FIGS. 17A and 17B each show a chart of an example of the pixel.
Figure 17B:
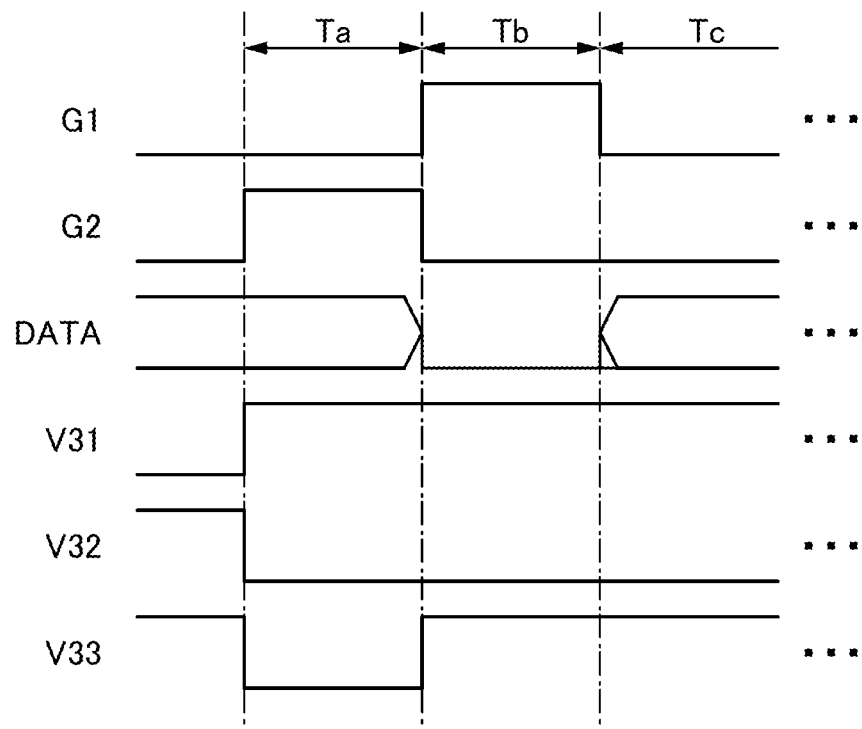

In the pixel 10 shown in FIG. 16A, in the period Ta, the level of the signal G2 becomes high and the transistor 91 is thus turned on. Then, the voltage VSS is supplied to the node 32 from the wiring 52 through the transistor 91, so that the level of the potential V32 becomes low (see FIG. 16B). Therefore, the low-level signal DATA is not necessarily supplied to the node 32 from the wiring 55 through the transistor 15. Thus, as shown in FIGS. 17A and 17B, in the period Ta, the level of the signal G1 can be set low to turn off the transistor 15. Consequently, the signal DATA can be input to the pixel 10 in another row in the period Ta. Thus, the frame rate can be improved. Alternatively, the number of pixels 10 to which the signal DATA is input in a certain period can be increased, resulting in higher pixel resolution. In the periods Tb and Tc, the level of the signal G2 becomes low and the transistor 91 is thus turned off.

The structure of the transistors 11 to 15 in Embodiment 1 can be applied to the transistor 91 as appropriate. For example, the transistor 91 may be replaced with a switch having a first terminal connected to the wiring 52 and a second terminal connected to the node 32. Alternatively, the transistor 91 may be a diode-connected transistor; that is, the first terminal and the gate of the transistor 91 may be connected to the wiring 54. Alternatively, the first terminal and the gate of the transistor 91 may be connected to the wiring 54 and the node 32, respectively. Alternatively, the transistor 91 may be provided with a back gate so that the back gate can be connected to the wiring 56 or the wiring 54. Alternatively, the first terminal of the transistor 91 may be connected to a wiring (not shown) different from the wiring 52 or connected to the wiring 53.

Modification Example 2

Figure 18A:
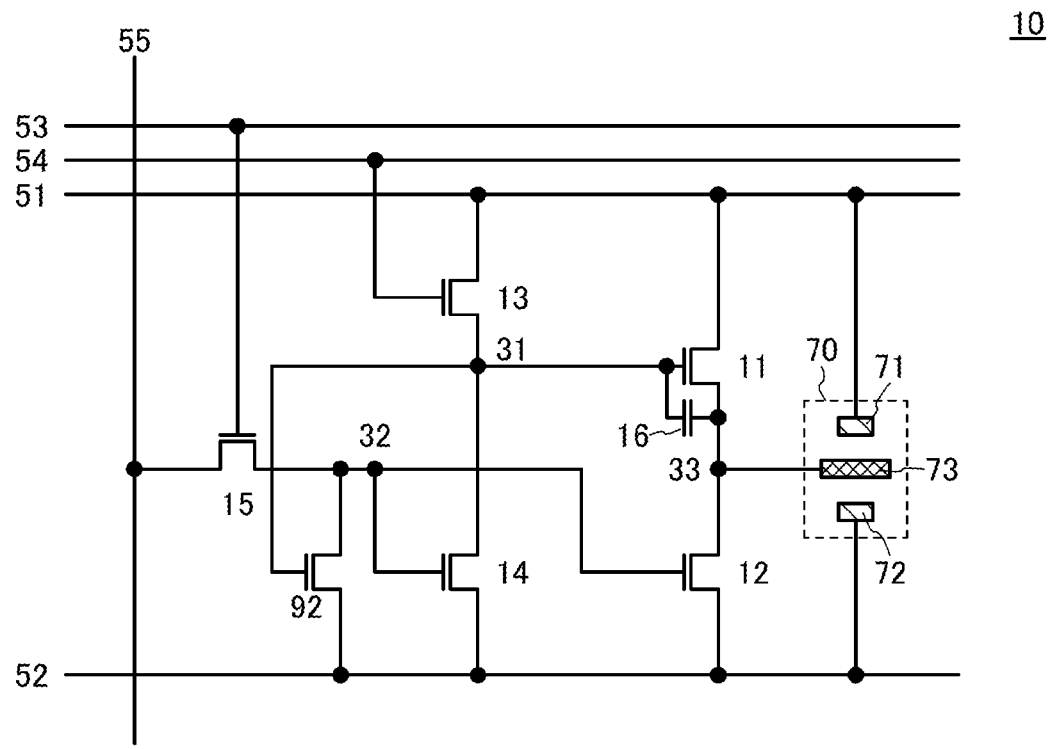
FIGS. 18A and 18B each show an example of a pixel.

FIG. 18A is different from FIG. 1 in that a transistor 92 is provided. A first terminal of the transistor 92 is connected to the wiring 52, a second terminal of the transistor 92 is connected to the node 32, and a gate of the transistor 92 is connected to the node 31. The transistor 92 preferably has the same polarity as the transistors 11 to 15.

Figure 18B:
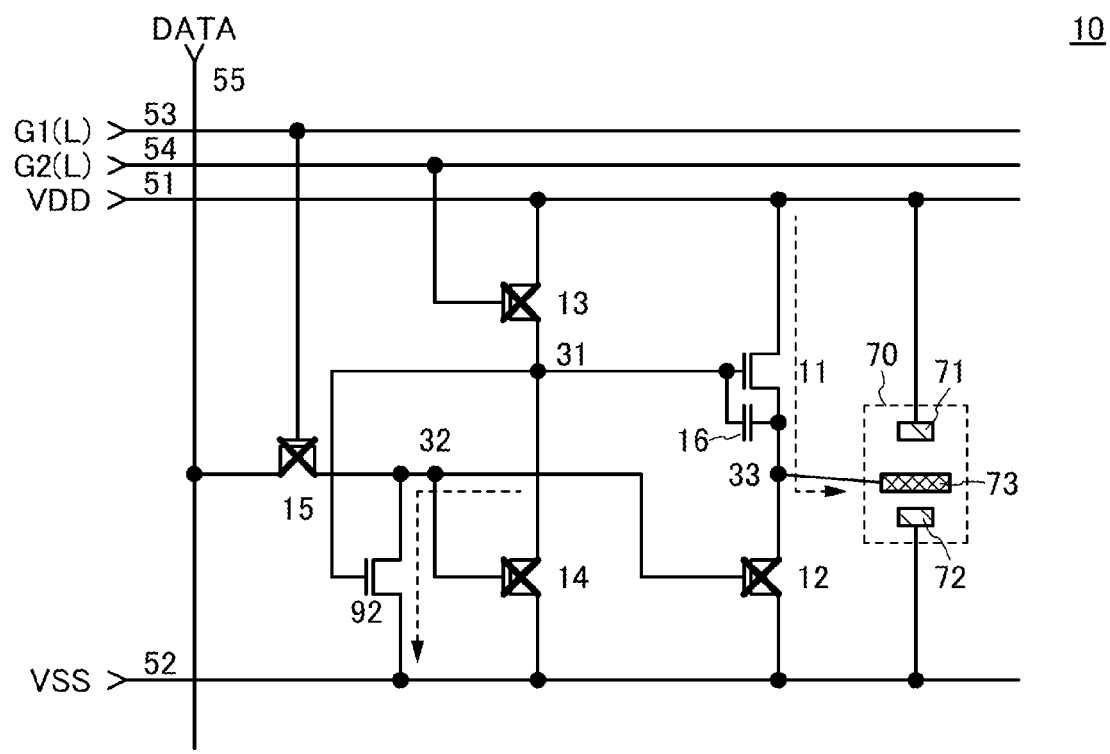

In the pixel 10 shown in FIG. 18A, in the period Ta, the level of the potential V31 becomes high and the transistor 92 is thus turned on. Then, the voltage VSS is supplied to the node 32 from the wiring 52 through the transistor 92, so that the level of the potential V32 becomes low. Thus, as in the pixel 10 shown in FIG. 16A, in the period Ta, the level of the signal G1 can be set low to turn off the transistor 15. In the periods Tb and Tc in the case where the level of the signal DATA is high, the potential V31 becomes low and the transistor 92 is turned off. In contrast, in the periods Tb and Tc in the case where the level of the signal DATA is low, the potential V31 becomes high and the transistor 92 is turned on. Then, the voltage VSS is supplied to the node 32 from the wiring 52 through the transistor 92, so that the level of the potential V32 becomes low (see FIG. 18B). The voltage VSS can be supplied to the node 32, which makes it easy to keep the level of the potential V32 low. This contributes to the prevention of malfunction.

The structures of the transistors 11 to 15 in Embodiment 1 can be applied to the transistor 92 as appropriate. For example, the transistor 92 may be replaced with a switch having a first terminal connected to the wiring 52 and a second terminal connected to the node 32. Alternatively, the transistor 92 may be provided with a back gate so that the back gate can be connected to the wiring 56 or the node 31. Alternatively, the first terminal of the transistor 92 may be connected to a wiring (not shown) different from the wiring 52 or connected to the wiring 53.

Modification Example 3

Figure 19A:
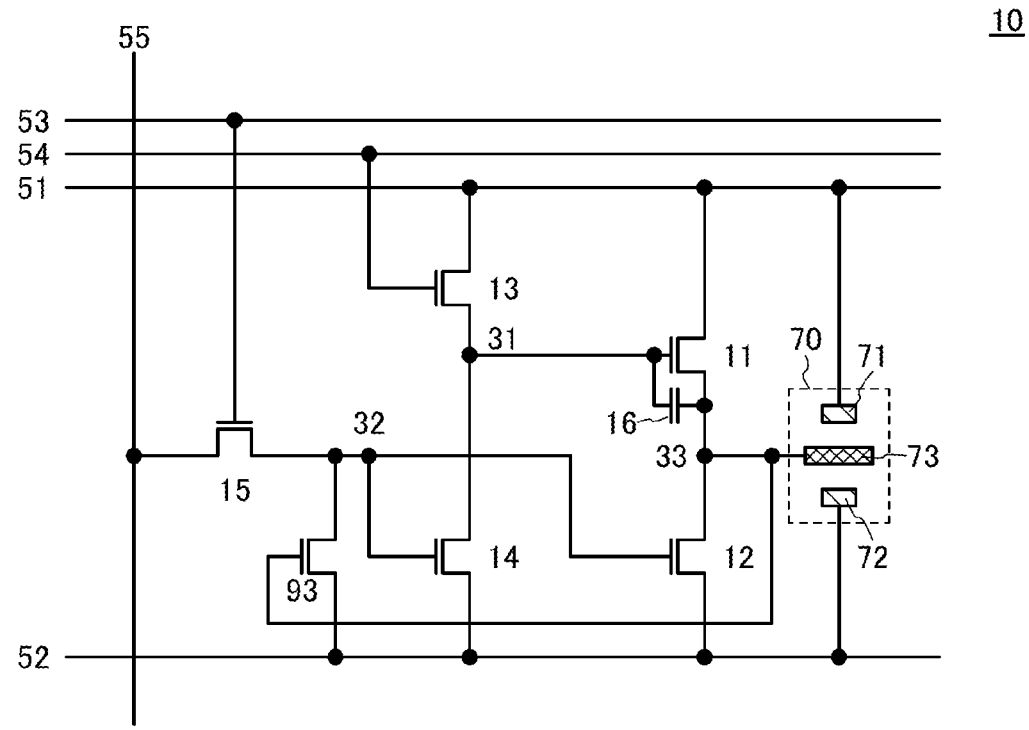
FIGS. 19A and 19B each show an example of a pixel.

FIG. 19A is different from FIG. 1 in that a transistor 93 is provided. A first terminal of the transistor 93 is connected to the wiring 52, a second terminal of the transistor 93 is connected to the node 32, and a gate of the transistor 93 is connected to the node 33. The transistor 93 preferably has the same polarity as the transistors 11 to 15.

Figure 19B:
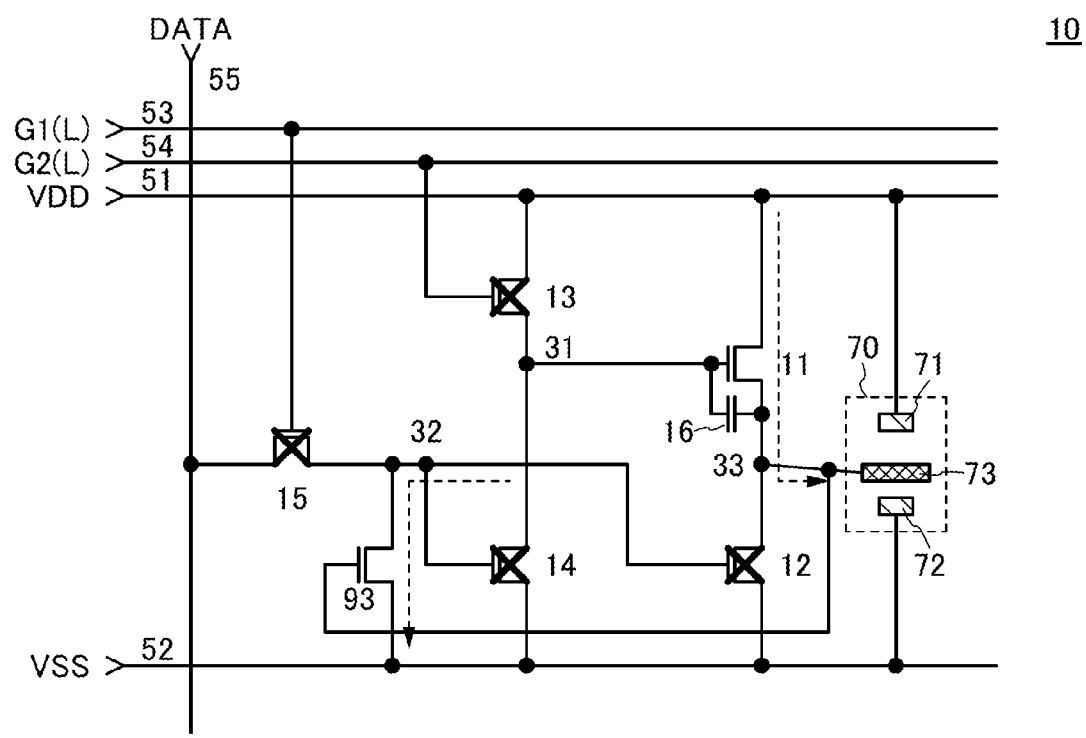

In the pixel 10 shown in FIG. 19A, in the period Ta, the level of potential V33 becomes high and the transistor 93 is thus turned on. Then, the voltage VSS is supplied to the node 32 from the wiring 52 through the transistor 93, so that the level of the potential V32 becomes low. Thus, as in the pixel 10 shown in FIG. 16A, in the period Ta, the level of the signal G1 can be set low to turn off the transistor 15. In the periods Tb and Tc in the case where the level of the signal DATA is high, the potential V33 becomes low and the transistor 93 is turned off. In contrast, in the periods Tb and Tc in the case where the level of the signal DATA is low, the potential V33 becomes high and the transistor 93 is turned on. Then, the voltage VSS is supplied to the node 32 from the wiring 52 through the transistor 93, so that the level of the potential V32 becomes low (see FIG. 19B). This enables the voltage VSS to be supplied to the node 32 and makes it easy to keep the level of the potential V32 low. This contributes to the prevention of malfunction.

The structures of the transistors 11 to 15 in Embodiment 1 can be applied to the transistor 93 as appropriate. For example, the transistor 93 may be replaced with a switch having a first terminal connected to the wiring 52 and a second terminal connected to the node 32. Alternatively, the transistor 93 may be provided with a back gate so that the back gate can be connected to the wiring 56 or the node 31. Alternatively, the first terminal of the transistor 93 may be connected to a wiring (not shown) different from the wiring 52.

Modification Example 4

Figure 20A:
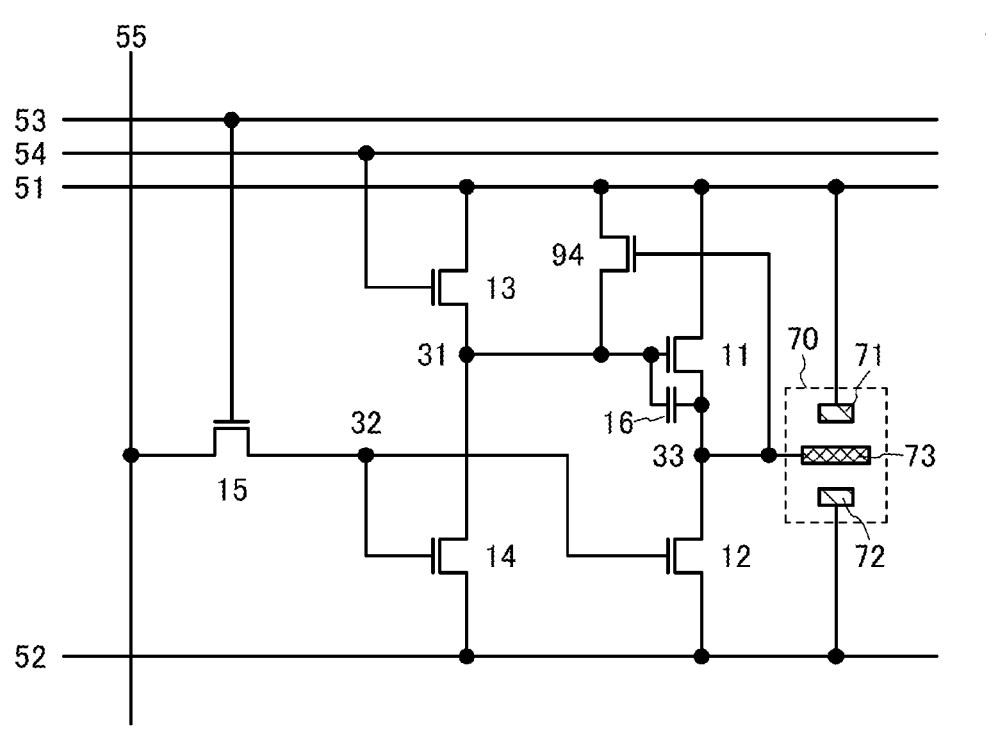
FIGS. 20A and 20B each show an example of a pixel.

FIG. 20A is different from FIG. 1 in that a transistor 94 is provided. A first terminal of the transistor 94 is connected to the wiring 51, a second terminal of the transistor 94 is connected to the node 31, and a gate of the transistor 94 is connected to the node 33. The transistor 94 preferably has the same polarity as the transistors 11 to 15.

Figure 20B:
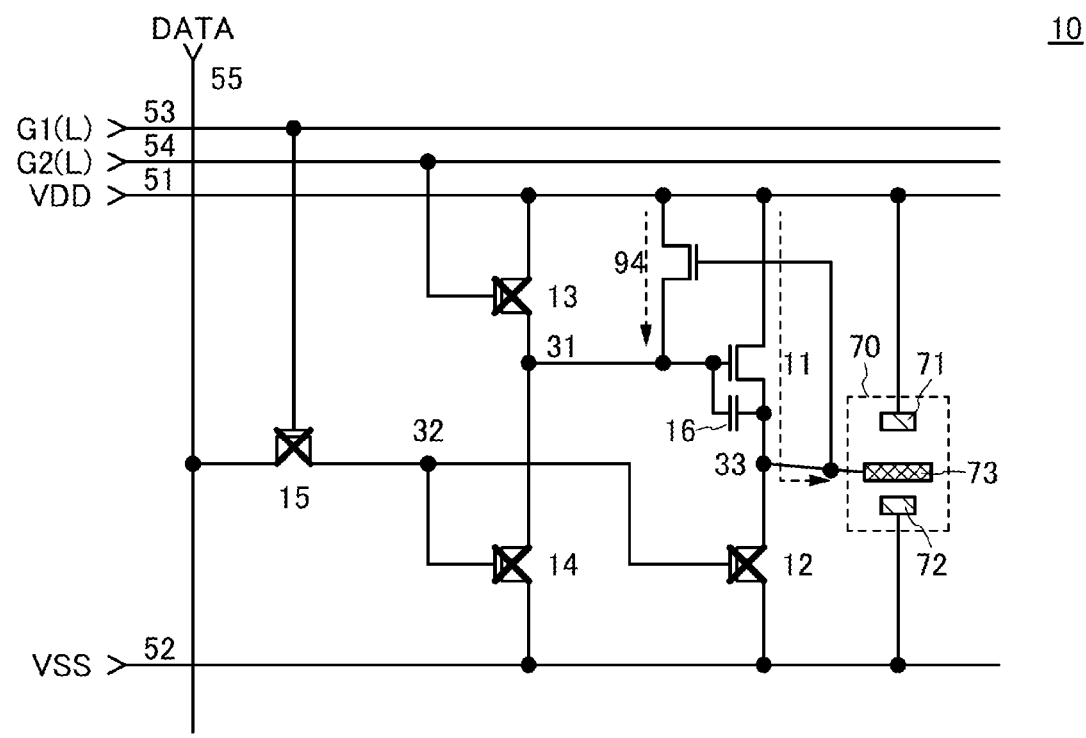

In the pixel 10 shown in FIG. 20A, in the period Ta, the level of potential V33 becomes high and the transistor 94 is thus turned on. Then, the voltage VSS is supplied to the node 31 from the wiring 51 through the transistor 94, so that the level of the potential V34 becomes high. In the periods Tb and Tc in the case where the level of the signal DATA is high, the potential V33 becomes low and the transistor 94 is turned off. In contrast, in the periods Tb and Tc in the case where the level of the signal DATA is low, the potential V33 becomes high and the transistor 94 is turned on. Then, the voltage VDD is supplied to the node 31 from the wiring 51 through the transistor 94, so that the level of the potential V31 becomes high (see FIG. 20B). This enables the voltage VDD to be supplied to the node 31 and makes it easy to keep the level of the potential V33 high. This contributes to the prevention of malfunction.

The structures of the transistors 11 to 15 in Embodiment 1 can be applied to the transistor 94 as appropriate. For example, the transistor 94 may be replaced with a switch having a first terminal connected to the wiring 51 and a second terminal connected to the node 31. Alternatively, the transistor 94 may be provided with a back gate so that the back gate can be connected to the wiring 56 or the node 33. Alternatively, the first terminal of the transistor 94 may be connected to a wiring (not shown) different from the wiring 51.

Modification Example 5

Figure 21A:
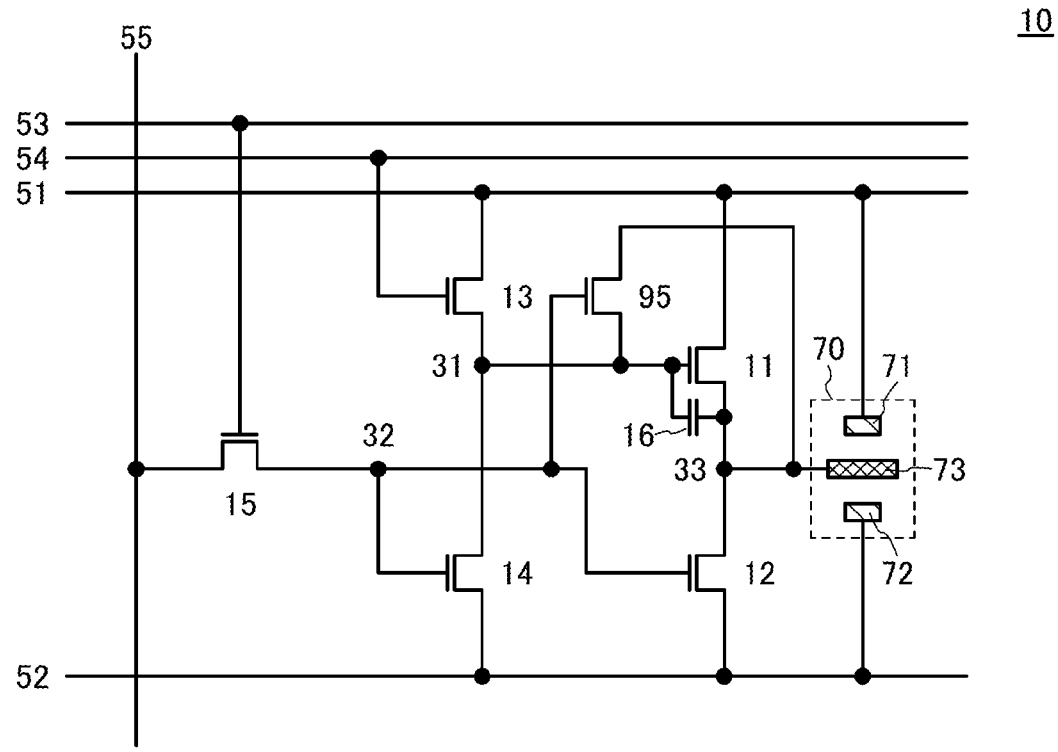
FIGS. 21A and 21B each show an example of a pixel.

FIG. 21A is different from FIG. 1 in that a transistor 95 is provided. A first terminal of the transistor 95 is connected to the node 33, a second terminal of the transistor 95 is connected to the node 31, and a gate of the transistor 95 is connected to the node 32. The transistor 95 preferably has the same polarity as the transistors 11 to 15.

Figure 21B:
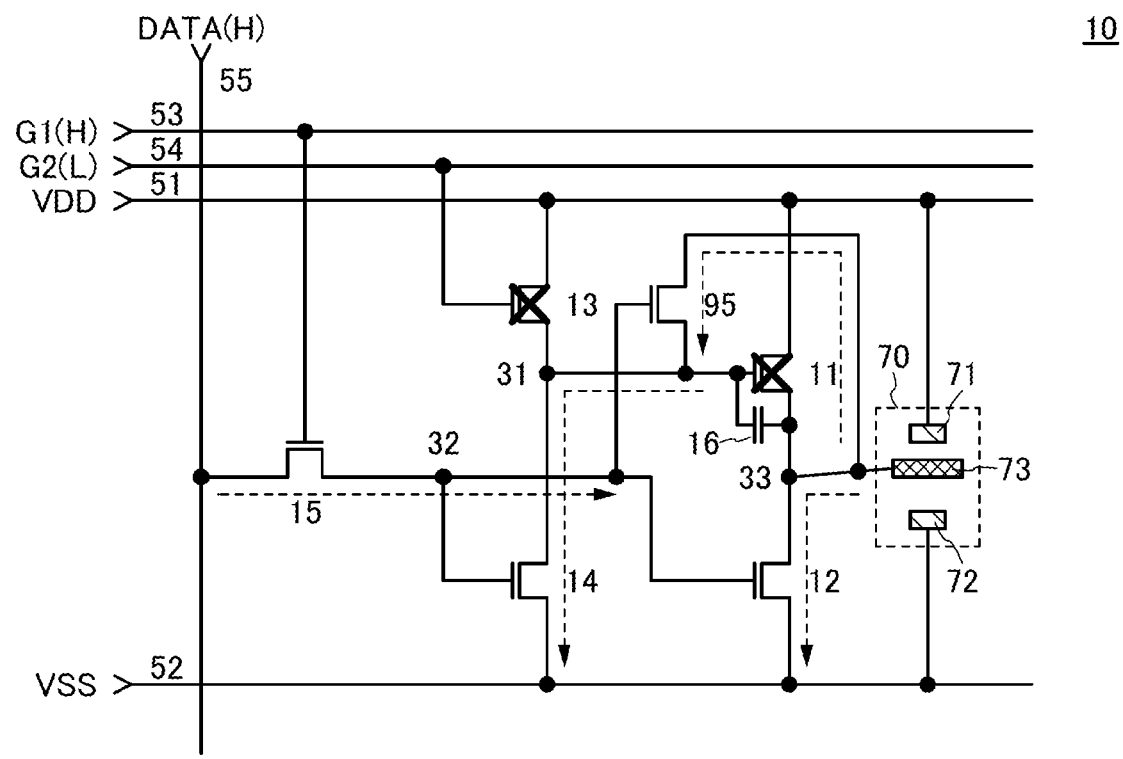

In the pixel 10 shown in FIG. 21A, in the period Ta, the level of potential V32 becomes low and the transistor 95 is thus turned off. In the periods Tb and Tc in the case where the level of the signal DATA is high, the level of the potential V32 becomes high and the transistor 95 is turned on. Then, the voltage VSS is supplied to the node 31 from the wiring 52 through the transistors 12 and 95 (see FIG. 21B). In contrast, in the periods Tb and Tc in the case where the level of the signal DATA is low, the potential V32 becomes low and the transistor 95 is turned off.

The structures of the transistors 11 to 15 in Embodiment 1 can be applied to the transistor 95 as appropriate. For example, the transistor 95 may be replaced with a switch having a first terminal connected to the node 33 and a second terminal connected to the node 31. Alternatively, the transistor 95 may be provided with a back gate so that the back gate can be connected to the wiring 56 or the node 31. Alternatively, the first terminal of the transistor 95 may be connected to a wiring (not shown) different from the wiring 51.

When the pixel 10 includes the transistor 95, in the period Tb in the case where the level of the signal DATA is high, the level of the potential V31 can be made low by turning on the transistor 95. Therefore, the transistor 14 may be omitted.

Modification Example 6

Figure 22A:
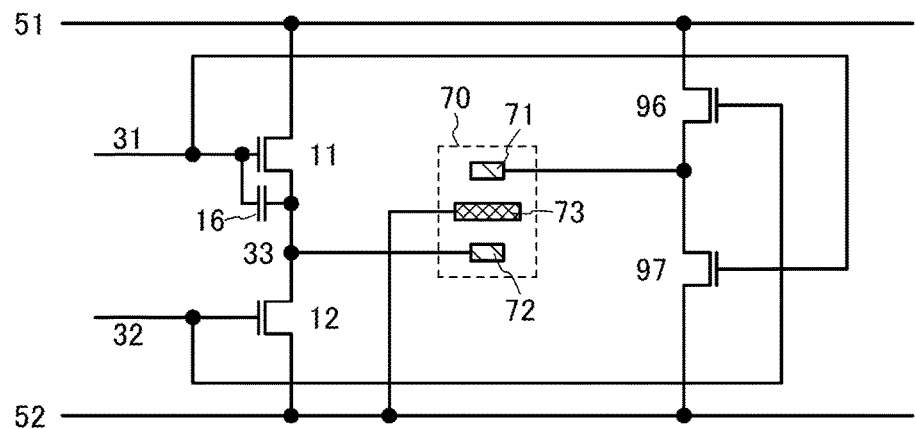
FIGS. 22A and 22B each show an example of a pixel.
Figure 22B:
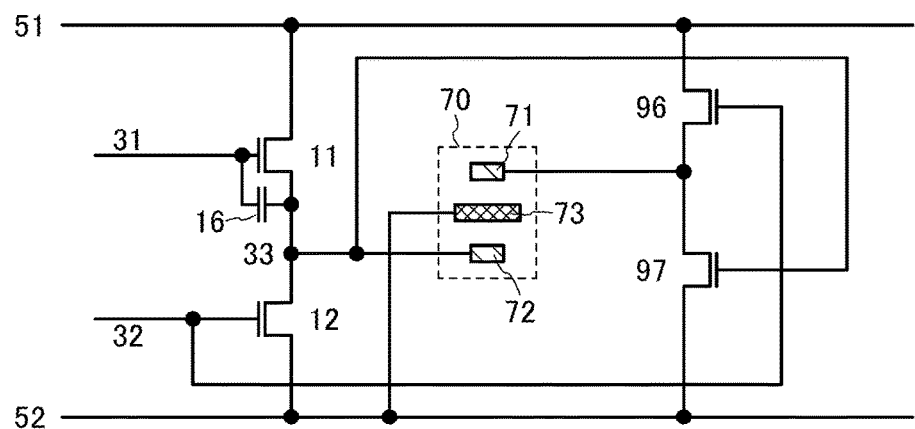

In the pixel 10 in FIG. 22A, the node 33 is connected to the component 72 and the component 73 is connected to the wiring 52. The pixel 10 in FIG. 22A includes transistors 96 and 97 to control the potential of the component 71. A first terminal of the transistor 96 is connected to the wiring 51. A second terminal of the transistor 96 is connected to the component 71. A gate of the transistor 96 is connected to the node 32. A first terminal of the transistor 97 is connected to the wiring 52. A second terminal of the transistor 97 is connected to the component 71. A gate of the transistor 97 is connected to the node 31. For example, when the level of the potential V31 is high and the level of the potential V32 is low, the transistors 11 and 97 are turned on and the transistors 12 and 96 are turned off. The voltage VSS is supplied to the component 71 from the wiring 52 through the transistor 97, and the voltage VDD is supplied to the component 72 from the wiring 51 through the transistor 11. Consequently, a potential difference is generated between the component 73 and the component 72; therefore, the component 73 moves toward the component 72. In contrast, when the level of the potential V31 is low and the level of the potential V32 is high, the transistors 11 and the 97 are turned off and the transistors 12 and 96 are turned on. The voltage VDD is supplied to the component 71 from the wiring 51 through the transistor 96, and the voltage VSS is supplied to the component 72 from the wiring 52 through the transistor 12. Thus, a potential difference is generated between the component 73 and the component 71, so that the component 73 moves toward the component 71. Note that the component 73 may be connected to the wiring 51. As shown in FIG. 22B, the gate of the transistor 97 may be connected to the node 33.

Modification Example 7

Figure 23:
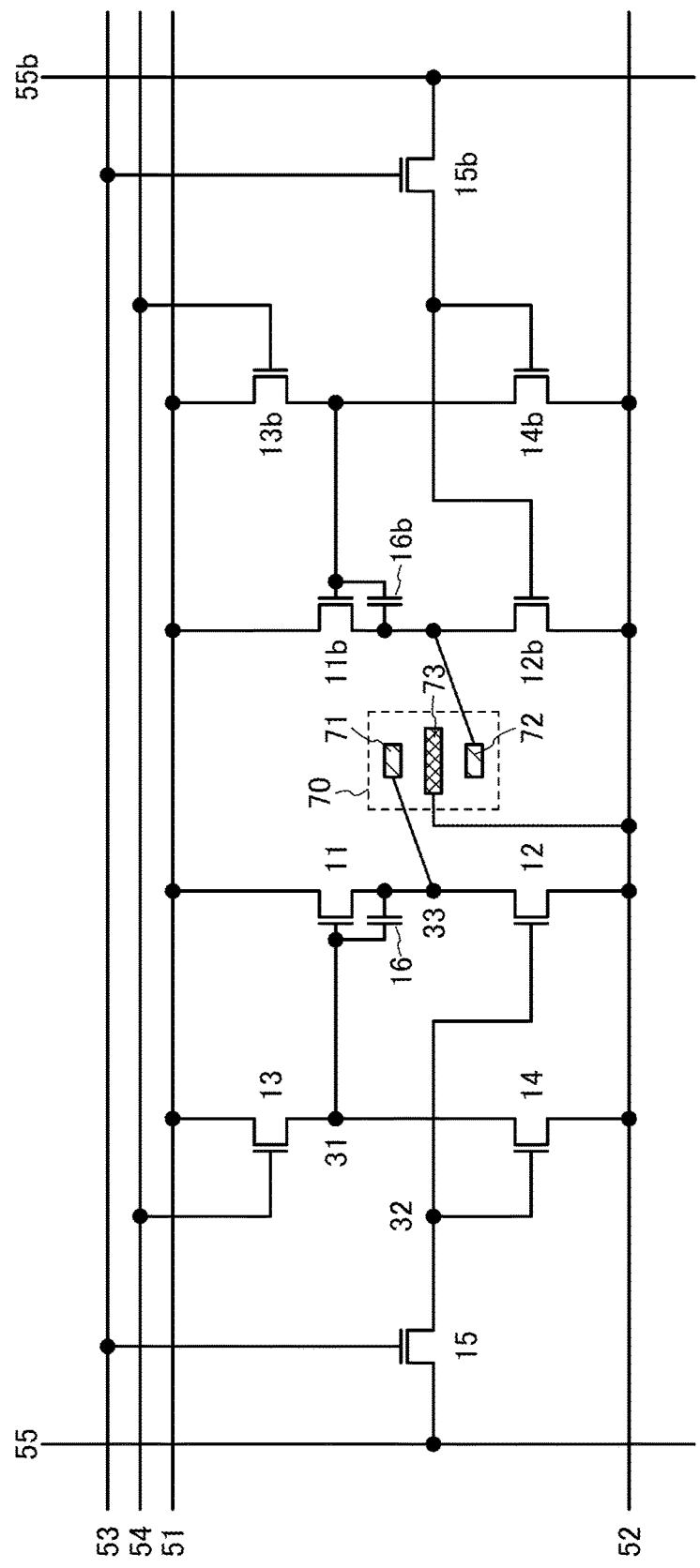
FIG. 23 shows an example of a pixel.

In the pixel 10 in FIG. 23, the node 33 is connected to the component 71, and the component 73 is connected to the wiring 52. The pixel 10 in FIG. 23 includes transistors 11b to 15b and a capacitor 16b to control the potential of the component 72. A first terminal of the transistor 11b is connected to the wiring 51. A second terminal of the transistor 11b is connected to the component 72. A first terminal of the transistor 12b is connected to the wiring 52. A second terminal of the transistor 12b is connected to the component 72. A first terminal of the transistor 13b is connected to the wiring 51. A second terminal of the transistor 13b is connected to a gate of the transistor 11b. A gate of the transistor 13b is connected to the wiring 54. A first terminal of the transistor 14b is connected to the wiring 52. A second terminal of the transistor 14b is connected to the gate of the transistor 11b. A gate of the transistor 14b is connected to a gate of the transistor 12b. A first terminal of the transistor 15b is connected to a wiring 55b. The second terminal of the transistor 15b is connected to the gate of the transistor 12b. A gate of the transistor 15b is connected to the wiring 53. A first electrode of the capacitor 16b is connected to the component 72. A second electrode of the capacitor 16b is connected to the gate of the transistor 11b. The transistors 11b, 12b, 13b, 14b, and 15b correspond to the transistors 11, 12, 13, 14, and 15, respectively. For the transistors 11b to 15b, the description of the transistors 11 to 15 can be referred to as appropriate. Similarly, the capacitor 16b corresponds to the capacitor 16 and the wiring 55b corresponds to the wiring 55.

The pixel 10 in Embodiment 1 may be modified based on any two or more of Modification Examples 1 to 7 described above. For example, any two, three, four, five, six, or seven of the transistors 91 to 97 may be provided in the pixel 10 in Embodiment 1.

This embodiment can be combined with any other embodiment as appropriate. Note that a content (or part thereof) described in one embodiment may be applied to, combined with, or replaced with a different content (or part thereof) described in the embodiment and/or a content (or part thereof) described in one or more different embodiments. Note that in each embodiment, a content described in the embodiment is a content described with reference to a variety of diagrams or a content described with text in this specification. In addition, by combining a diagram (or part thereof) described in one embodiment with another part of the diagram, a different diagram (or part thereof) described in the embodiment, and/or a diagram (or part thereof) described in another embodiment or other embodiments, much more diagrams can be created. The same can be applied to any other embodiment.

Embodiment 3

In this implementation, a display device according to one embodiment of the present invention is described.

Figure 24:
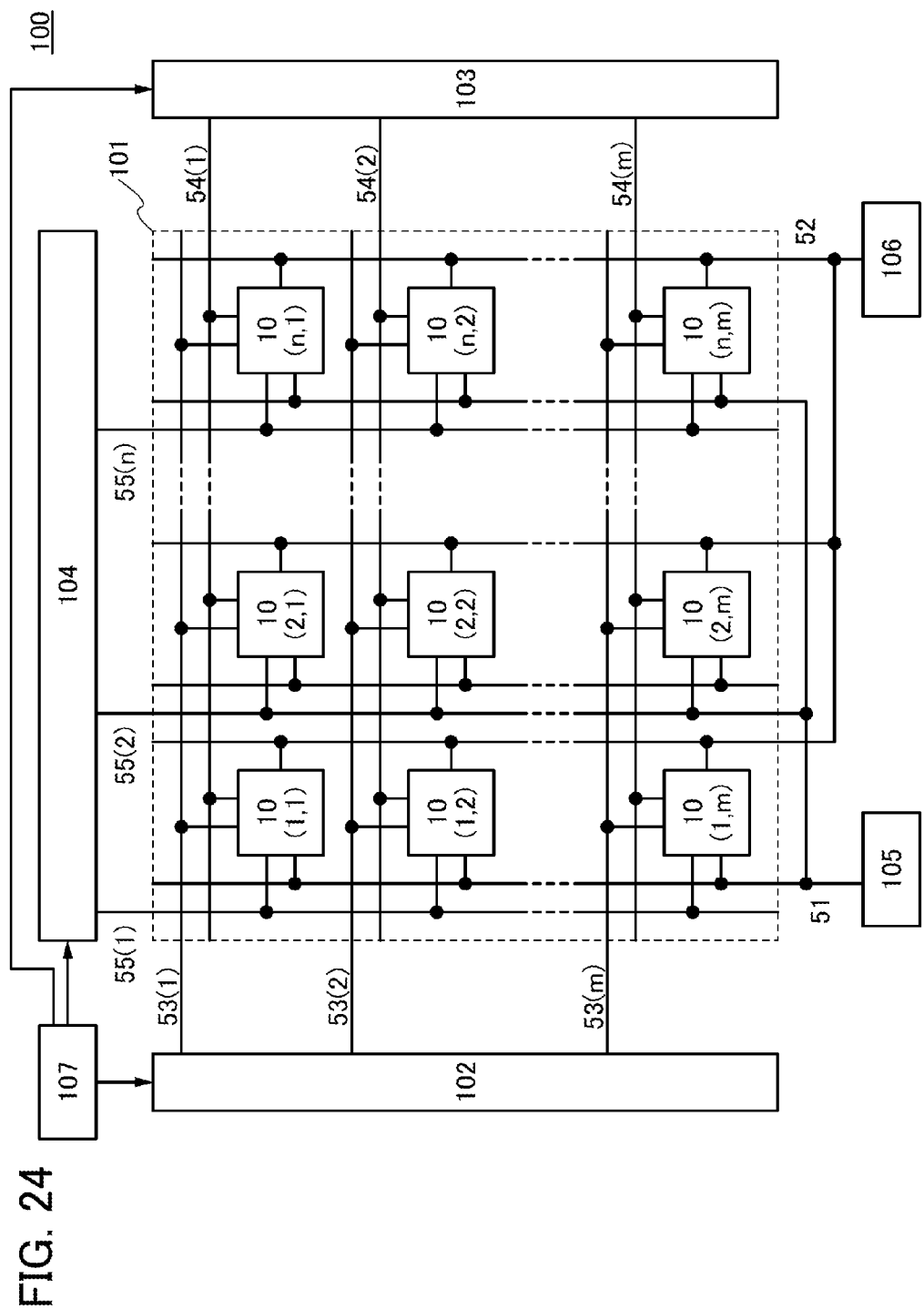
FIG. 24 shows an example of a display device.
Figure 25:
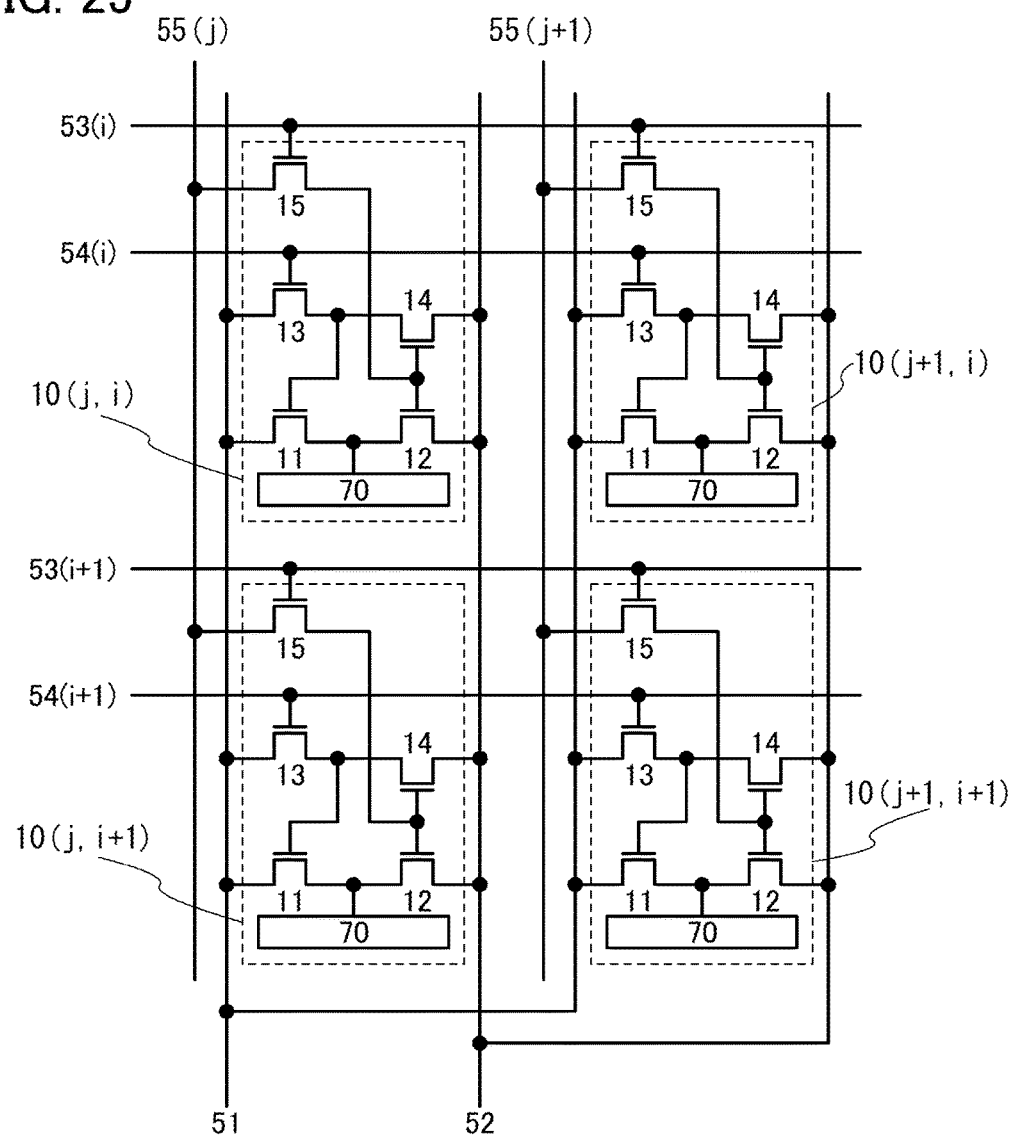
FIG. 25 shows an example of a display device.

FIG. 24 is a block diagram showing a display device 100 of one embodiment of the present invention. The display device 100 in FIG. 24 includes a pixel portion 101 and circuits 102 to 107. The pixel portion 101 is provided with the wiring 51, the wiring 52, wirings 53(1) to 53(*m*) (m is a natural number), wirings 54(1) to 54(*m*), and wirings 55(1) to 55(*n*) (n is a natural number). The pixels 10(1, 1) to 10(*n*, *m*) are arranged in a matrix to correspond to the wirings 53(1) to 53(*m*), the wirings 54(1) to 54(*m*), and the wirings 55(1) to 55(*n*). FIG. 25 shows a specific example of the pixel 10(*j*, *i*) (j is one of 1 to n, and i is one of 1 to m), the pixel 10(*j*+1, i), the pixel 10(*j*, *i*+1), and the pixel 10(*j*+1, i+1).

The circuit 102 is connected to the wirings 53(1) to 53(*m*). The circuit 102 has a function of controlling the potentials of the wirings 53(1) to 53(*m*). Specifically, the circuit 102 has a function of outputting signals, each of which corresponds to the signal G1, to the wirings 53(1) to 53(*m*). That is, the circuit 102 has a function as a driver circuit such as a scan line driver circuit or a gate driver. The wirings 53(1) to 53(*m*) have a function as a signal line such as a scan line or a gate signal line.

The circuit 103 is connected to the wirings 54(1) to 54(*m*). The circuit 103 has a function of controlling the potentials of the wirings 54(1) to 54(*m*). Specifically, the circuit 103 has a function of outputting signals, each of which corresponds to the signal G2, to the wirings 54(1) to 54(*m*). That is, the circuit 103 has a function as a driver circuit such as a scan line driver circuit or a gate driver. The wirings 54(1) to 54(*m*) have a function as a signal line such as a scan line or a gate signal line.

The circuit 104 is connected to the wirings 55(1) to 55(*n*). The circuit 104 has a function of controlling the potentials of the wirings 55(1) to 55(*n*). Specifically, the circuit 104 has a function of outputting signals, each of which corresponds to the signal DATA, to the wirings 55(1) to 55(*n*). That is, the circuit 104 has a function as a driver circuit such as a signal line driver circuit or a source driver. The wirings 55(1) to 55(*n*) have a function as a signal line such as a video signal line or a source signal line.

The circuit 105 is connected to the wiring 51. The circuit 105 has a function of controlling the potential of the wiring 51. Specifically, the circuit 105 outputs the voltage VDD to the wiring 51. That is, the circuit 105 has a function as a power supply circuit.

The circuit 106 is connected to the wiring 52. The circuit 106 has a function of controlling the potential of the wiring 52. Specifically, the circuit 106 outputs the voltage VSS to the wiring 52. As described above, the circuit 106 has a function as a power supply circuit.

The circuit 107 is connected to the circuits 102 to 104. The circuit 107 has a function of controlling the circuits 102 to 104. Specifically, the circuits 107 has a function of outputting signals for controlling the circuit 102 (e.g., a clock signal and a start pulse) to the circuit 102. The circuit 107 has a function of outputting signals for controlling the circuit 103 (e.g., a clock signal and a start pulse) to the circuit 103. The circuit 107 has a function of outputting signals for controlling the circuit 104 (e.g., a video signal, a clock signal, and a start pulse) to the circuit 102. That is, the circuit 107 has a function as a timing controller.

Figure 30:
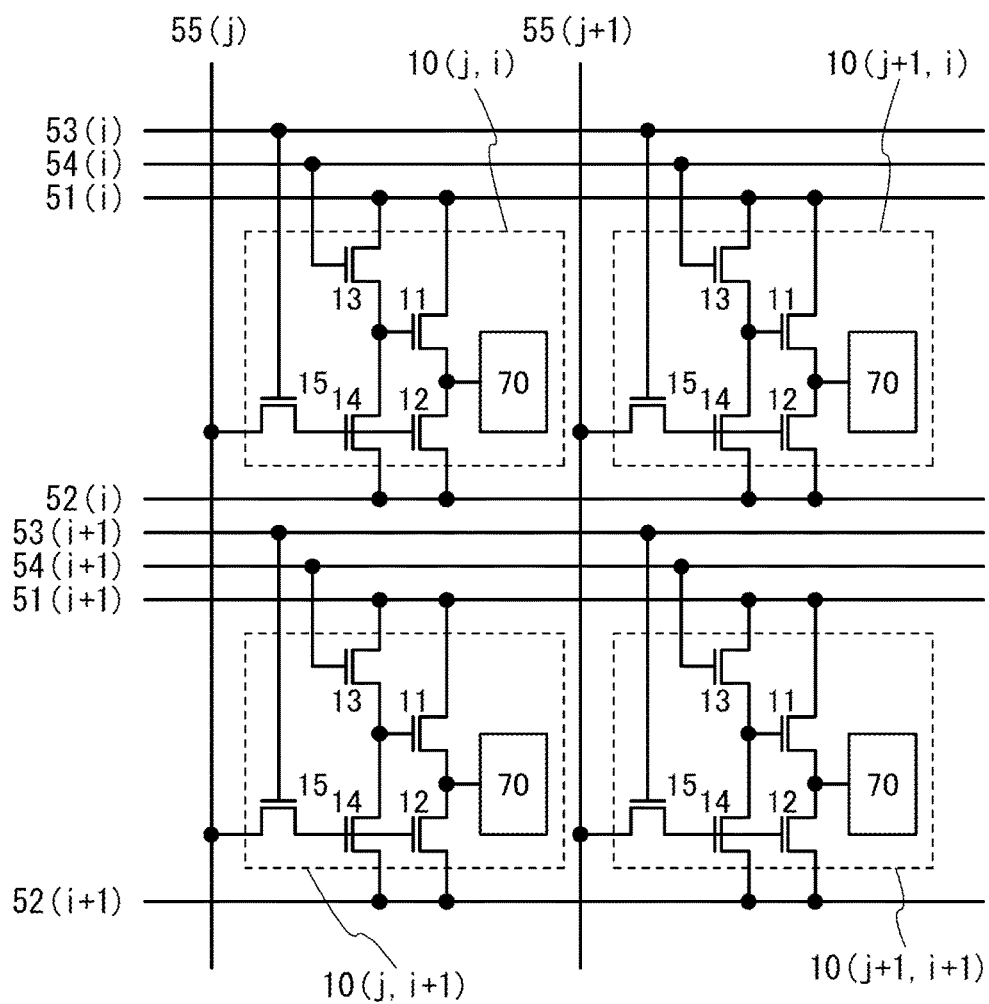
FIG. 30 shows an example of a display device.

As shown in FIG. 30, the wirings 51 and 52 may be provided in parallel with the wirings 53 and 54. In that case, the potentials of the wirings 51 and 52 can be independently controlled in each row. For example, in synchronization with a signal input to the circuit 102 or 103 or an output signal, the potentials of the wirings 51 and 52 can be independently controlled. Consequently, deletion of images (black display) in the pixels 10 (1, 1) to (n, m) can be performed row by row.

This embodiment can be combined with any other embodiment as appropriate. Note that a content (or part thereof) described in one embodiment may be applied to, combined with, or replaced with a different content (or part thereof) described in the embodiment and/or a content (or part thereof) described in one or more different embodiments. Note that in each embodiment, a content described in the embodiment is a content described with reference to a variety of diagrams or a content described with text in this specification. In addition, by combining a diagram (or part thereof) described in one embodiment with another part of the diagram, a different diagram (or part thereof) described in the embodiment, and/or a diagram (or part thereof) described in another embodiment or other embodiments, much more diagrams can be created. The same can be applied to any other embodiment.

Embodiment 4

In this embodiment, the structure of the pixel described in Embodiment 1 will be explained.

Figure 26:
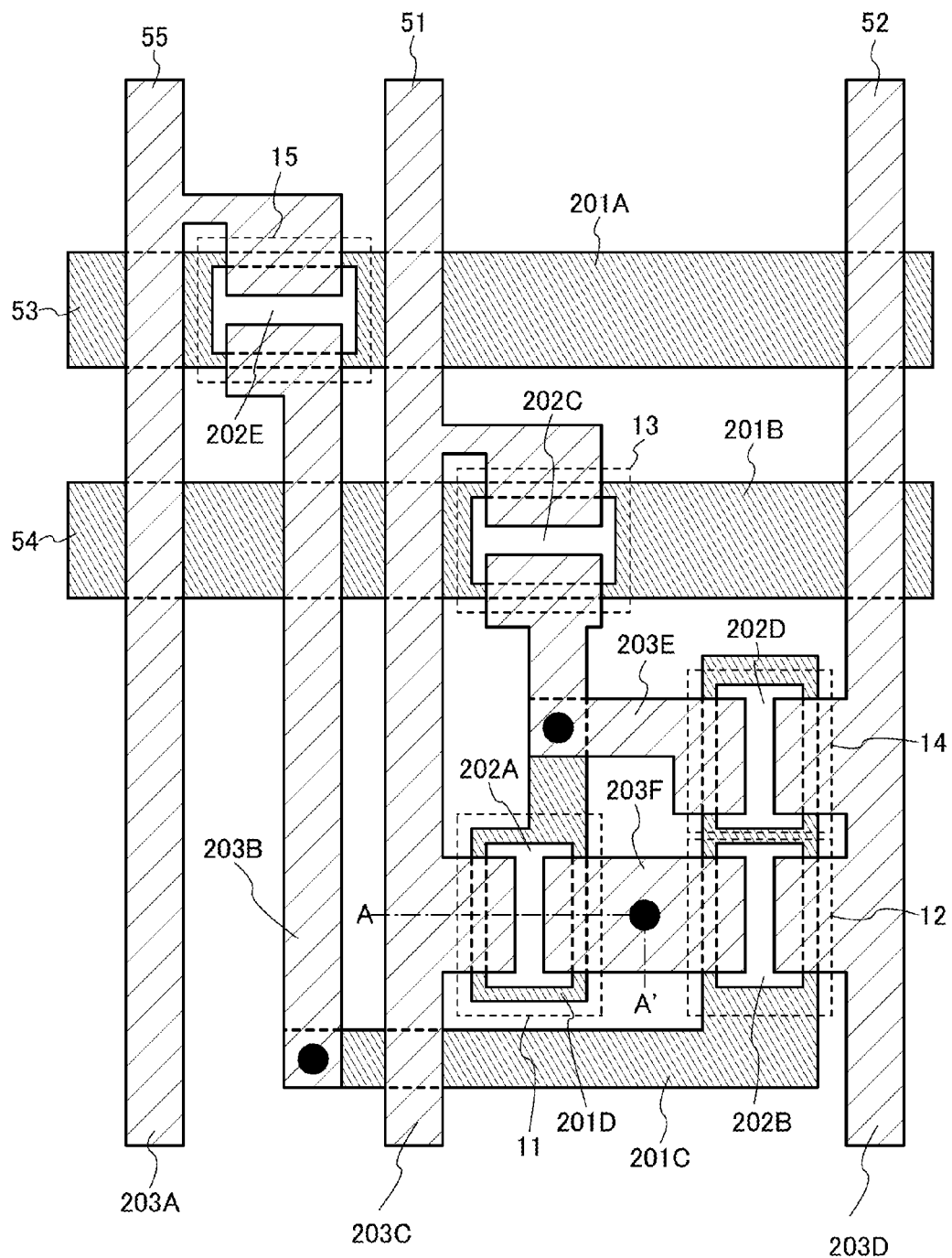
FIG. 26 illustrates an example of a pixel.
Figure 27:
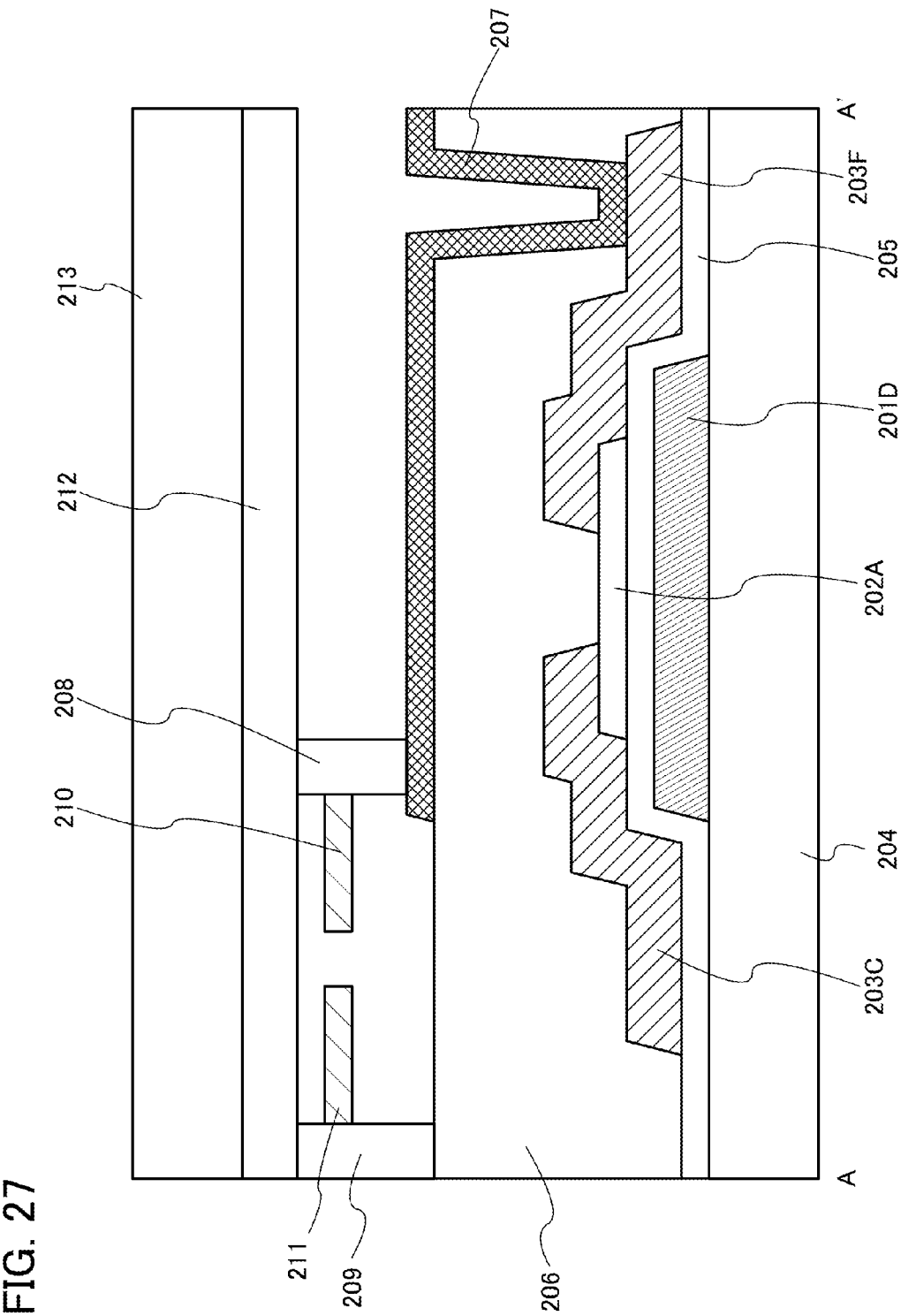
FIG. 27 illustrates the example of the pixel.

FIG. 26 is a top view of the pixel 10 in FIG. 1. FIG. 27 shows a cross section along the line A-A' in FIG. 26.

Conductive layers 201A to 201D contain the same material. Alternatively, the conductive layers 201A to 201D are formed through a step of processing one conductive layer. The conductive layers 201A to 201D are formed as different islands. The conductive layer 201A has a region functioning as the wiring 53 and a region functioning as a gate electrode of the transistor 15. The conductive layer 201B has a region functioning as the wiring 54 and a region functioning as a gate electrode of the transistor 13. The conductive layer 201C has a region functioning as a gate electrode of the transistor 12 and a region functioning as a gate electrode of the transistor 14. The conductive layer 201D has a region functioning as a gate electrode of the transistor 11.

Semiconductor layers 202A to 202E contain the same material. Alternatively, the semiconductor layers 202A to 202E are formed through a step of processing one conductive layer. The semiconductor layers 202A to 202E are formed as different islands. The semiconductor layer 202A has a channel formation region of the transistor 11. The semiconductor layer 202B has a channel formation region of the transistor 12. The semiconductor layer 202C has a channel formation region of the transistor 13. The semiconductor layer 202D has a channel formation region of the transistor 14. The semiconductor layer 202E has a channel formation region of the transistor 15.

Conductive layers 203A to 203F contain the same material. Alternatively, the conductive layers 203A to 203F are formed through a step of processing one conductive layer. The conductive layers 203A to 203F are formed as different islands. The conductive layer 203A has a region functioning as the wiring 55 and a region functioning as one of a source electrode and a drain electrode of the transistor 15. The conductive layer 203B has a region functioning as the other of the source electrode and the drain electrode of the transistor 15. The conductive layer 203C has a region functioning as the wiring 51, a region functioning as one of a source electrode and a drain electrode of the transistor 11, and a region functioning as one of a source electrode and a drain electrode of the transistor 13. The conductive layer 203D has a region functioning as the wiring 52, a region functioning as one of a source electrode and a drain electrode of the transistor 12, and a region functioning as one of a source electrode and a drain electrode of the transistor 14. The conductive layer 203E has a region functioning as the other of the source electrode and the drain electrode of the transistor 13 and a region functioning as the other of the source electrode and the drain electrode of the transistor 14. The conductive layer 203F has a region functioning as the other of the source electrode and the drain electrode of the transistor 11 and a region functioning as the other of the source electrode and the drain electrode of the transistor 12.

The conductive layer 203A is connected to the semiconductor layer 202E. The conductive layer 203B is connected to the semiconductor layer 202E and the conductive layer 201C. The conductive layer 203C is connected to the semiconductor layer 202A and the semiconductor layer 202C. The conductive layer 203D is connected to the semiconductor layer 202B and the semiconductor layer 202D. The conductive layer 203E is connected to the semiconductor layer 202C, the semiconductor layer 202D, and the conductive layer 201D. The conductive layer 203F is connected to the semiconductor layer 202A, the semiconductor layer 202B, and a conductive layer 207.

The conductive layers 203A to 203F are in contact with the top surfaces of the semiconductor layers 202A to 202E; alternatively, the conductive layers 203A to 203F may be in contact with the bottom surfaces of the semiconductor layers 202A to 202E.

An insulating layer 205 has a region functioning as a gate insulating film of the transistor 11, a region functioning as a gate insulating film of the transistor 12, a region functioning as a gate insulating film of the transistor 13, a region functioning as a gate insulating film of the transistor 14, and a region functioning as a gate insulating film of the transistor 15.

The insulating layer 205 is formed above the conductive layers 201A to 201D, and the semiconductor layers 202A to 202E are formed above the insulating layer 205. Alternatively, the insulating layer 205 may be formed above the semiconductor layers 202A to 202E, and the conductive layers 201A to 201D may be formed above the insulating layer 205. In other words, the insulating layer 205 has a region between the conductive layer 201D and the semiconductor layer 202A, a region between the conductive layer 201C and the semiconductor layer 202B, a region between the conductive layer 201B and the semiconductor layer 202C, a region between the conductive layer 201D and the semiconductor layer 202D, and a region between the conductive layer 201A and the semiconductor layer 202E.

A portion denoted by a black circle is an opening provided in the insulating layer 205. The conductive layers 201A to 201D and the conductive layers 203A to 203F are connected to each other as appropriate through the openings.

An insulating layer 206 is provided above the transistors 11 to 15.

A conductive layer 207 has a region functioning as a wiring that connects the conductive layer 203F to the display element 70 (the component 71, the component 72, or the component 73).

The display element 70 includes a structure body 208, a structure body 209, an electrode 210, and an electrode 211. The structure body 208 is connected to the conductive layer 207 and the electrode 210 is fixed to the structure body 208; that is, the conductive layer 207 is connected to the electrode 210 through the structure body 208. The structure body 209 is connected to the wiring 51, the wiring 52, or a wiring that is not illustrated. The electrode 211 is fixed to the structure body 209. The structure body 208 and the structure body 209 may have a function as a spacer.

A drying agent 212 is provided between a substrate 213 and a substrate 204 provided with a transistor and a display element.

The conductive layers 201A to 201D can be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these elements; or the like.

The conductive layers 201A to 201D may have a single-layer structure or a stacked-layer structure of two or more layers. For example, it is possible to employ a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, or a three-layer structure in which a titanium film, an aluminum film, and a titanium film are stacked in this order. Alternatively, an alloy film or a nitride film that contains aluminum and one or more elements selected from titanium, tantalum, tungsten, molybdenum, chromium, neodymium, and scandium may be used.

The conductive layers 201A to 201D can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A Cu—X alloy film (X is Mn, Ni, Cr, Fe, Co, Mo, Ta, or Ti) may be used for the conductive layers 201A to 201D. The use of a Cu—X alloy film results in lower manufacturing costs because the film can be processed by wet etching.

For the semiconductor layers 202A to 202E, a single crystal semiconductor or a non-single-crystal semiconductor can be used. Examples of a non-single-crystal semiconductor include non-single-crystal silicon and non-single-crystal germanium. Examples of non-single-crystal silicon include amorphous silicon, microcrystalline silicon, and polycrystalline silicon. Examples of non-single-crystal germanium include amorphous germanium, microcrystalline germanium, and polycrystalline germanium.

An oxide semiconductor film is preferably used as the semiconductor layers 202A to 202E. For the oxide semiconductor film, In-M oxide (M is Ti, Ga, Sn, Y, Zr, La, Ce, Nd, or Hf) or In-M-Zn oxide can be used. It is particularly preferable to use In-M-Zn oxide for the oxide semiconductor film. When the oxide semiconductor film is an In-M-Zn oxide film, it is preferred that the atomic ratio of the metal elements of a sputtering target used for forming the In-M-Zn oxide film satisfy In≥M and Zn≥M. As the atomic ratio of the metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable. When the oxide semiconductor film is an In-M-Zn oxide film, a target including polycrystalline In-M-Zn oxide is preferably used as a sputtering target. With the use of the target including polycrystalline In-M-Zn oxide, an oxide semiconductor film having crystallinity can be easily formed. Note that the atomic ratio of metal elements in the oxide semiconductor film may vary from the atomic ratio of those in the above sputtering target, within a range of ±40% as an error. For example, when a sputtering target with an atomic ratio of In:Ga:Zn=4:2:4.1 is used, the atomic ratio of In to Ga and Zn in the oxide semiconductor film may be 4:2:3 or in the vicinity of 4:2:3.

The energy gap of the oxide semiconductor film is 2 eV or more, preferably 2.5 eV or more, further preferably 3 eV or more. The off-state current of a transistor can be reduced by using an oxide semiconductor having a wide energy gap.

The thickness of the oxide semiconductor film is greater than or equal to 3 nm and less than or equal to 200 nm, preferably greater than or equal to 3 nm and less than or equal to 100 nm, further preferably greater than or equal to 3 nm and less than or equal to 50 nm. Note that the above-described thickness relationship between them is preferably satisfied.

An oxide semiconductor film with low carrier density is used as the oxide semiconductor film. For example, the carrier density of the oxide semiconductor film is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$. The carrier density of the oxide semiconductor film may be preferably greater than or equal to $1\times10^{5}/cm^3$, further preferably greater than or equal to $1\times10^{7}/cm^3$.

Note that without limitation to the compositions and materials described above, a material with an appropriate composition can be used depending on required semiconductor characteristics and electrical characteristics (e.g., field-effect mobility and threshold voltage) of a transistor. To obtain the required semiconductor characteristics of the transistor, it is preferred that the carrier density, the impurity concentration, the defect density, the atomic ratio of a metal element to oxygen, the interatomic distance, the density, and the like of the oxide semiconductor film be set to appropriate values.

The oxide semiconductor film is preferably an oxide semiconductor film where the impurity concentration is low and the density of defect states is low, in which case the transistors can have quite excellent electrical characteristics. Here, the state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, a highly purified intrinsic or substantially highly purified intrinsic oxide semiconductor film exhibits an extremely low off-state current. The off-state current of an element having a channel width of $1\times10^6$ μm and a channel length L of 10 μm can be less than or equal to the measurement limit of a semiconductor parameter analyzer, i.e., less than or equal to $1\times10^{-13}$ A at a voltage between a source electrode and a drain electrode (drain voltage) of 1 V to 10 V.

Accordingly, the transistor in which the channel region is formed in the highly purified intrinsic or substantially highly purified intrinsic oxide semiconductor film can have a small variation in electrical characteristics and high reliability. Charge trapped by the trap states in the oxide semiconductor film takes a long time to be released and may behave like fixed charge. Thus, a transistor whose channel region is formed in an oxide semiconductor film having a high density of trap states has unstable electrical characteristics in some cases. Examples of impurities are hydrogen, nitrogen, alkali metal, and alkaline earth metal.

Hydrogen contained in the oxide semiconductor film reacts with oxygen bonded to a metal atom to form water, and also causes oxygen vacancies in a lattice from which oxygen is released (or a portion from which oxygen is released). Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally on. Accordingly, it is preferred that hydrogen be reduced as much as possible in the oxide semiconductor film. Specifically, in the oxide semiconductor film, the hydrogen concentration measured by secondary mass spectrometry (SIMS) may be $2 \times 10^{20}$ atoms/cm$^3$ or lower, preferably $5 \times 10^{19}$ atoms/cm$^3$ or lower, further preferably $1 \times 10^{19}$ atoms/cm$^3$ or lower, further preferably $5 \times 10^{18}$ atoms/cm$^3$ or lower, still further preferably $1 \times 10^{18}$ atoms/cm$^3$ or lower, yet still further preferably $5 \times 10^{17}$ atoms/cm$^3$ or lower. Furthermore, in the oxide semiconductor film, the hydrogen concentration measured by SIMS may be $1 \times 10^{16}$ atoms/cm$^3$ or higher, preferably $1 \times 10^{17}$ atoms/cm$^3$ or higher.

If silicon or carbon, which is an element belonging to Group 14, is contained in the oxide semiconductor film, oxygen vacancies are increased in the oxide semiconductor film, and the oxide semiconductor film becomes an n-type film. Thus, the concentration of silicon or carbon in the oxide semiconductor film and the concentration of silicon or carbon at or near an interface with the oxide semiconductor film (concentration measured by SIMS) is set lower than or equal to $2 \times 10^{18}$ atoms/cm$^3$. The concentration of silicon or carbon in the oxide semiconductor film or the concentration of silicon or carbon at or near an interface with the oxide semiconductor film (concentration measured by SIMS) may be preferably set higher than or equal to $1 \times 10^{17}$ atoms/cm$^3$, further preferably higher than or equal to $3 \times 10^{17}$ atoms/cm$^3$, still further preferably higher than or equal to $1 \times 10^{18}$ atoms/cm$^3$.

The concentration of alkali metal or alkaline earth metal of the oxide semiconductor film, which is measured by SIMS, is set lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal of the oxide semiconductor film. In addition, the concentration of alkali metal or alkaline earth metal of the oxide semiconductor film, which is measured by SIMS, may be higher than or equal to $5 \times 10^{15}$ atoms/cm$^3$, preferably higher than or equal to $1 \times 10^{16}$ atoms/cm$^3$.

If nitrogen is contained in the oxide semiconductor film, electrons serving as carriers are generated and the carrier density increases, so that the oxide semiconductor film easily becomes an n-type film. Thus, a transistor including an oxide semiconductor film that contains nitrogen is likely to have normally-on characteristics. For this reason, nitrogen in the oxide semiconductor film is preferably reduced as much as possible; the nitrogen concentration measured by SIMS is preferably set, for example, lower than or equal to $5 \times 10^{18}$ atoms/cm$^3$. Furthermore, the nitrogen concentration measured by SIMS may be higher than or equal to $1 \times 10^{16}$ atoms/cm$^3$, preferably higher than or equal to $5 \times 10^{16}$ atoms/cm$^3$, further preferably higher than or equal to $1 \times 10^{17}$ atoms/cm$^3$, still further preferably higher than or equal to $5 \times 10^{17}$ atoms/cm$^3$.

The oxide semiconductor film may have a non-single-crystal structure. Examples of the non-single-crystal structure include a c-axis-aligned crystalline oxide semiconductor (CAAC-OS) which is described later, a polycrystalline structure, a microcrystalline structure, and an amorphous structure. Among the non-single-crystal structures, the amorphous structure has the highest density of defect levels, whereas CAAC-OS has the lowest density of defect levels.

A structure of the oxide semiconductor film is described below.

An oxide semiconductor film is classified into a non-single-crystal oxide semiconductor film and a single crystal oxide semiconductor film. Furthermore, an oxide semiconductor is classified into, for example, a crystalline oxide semiconductor and an amorphous oxide semiconductor.

Examples of a non-single-crystal oxide semiconductor include a c-axis-aligned crystalline oxide semiconductor (CAAC-OS), a polycrystalline oxide semiconductor, a microcrystalline oxide semiconductor, and an amorphous oxide semiconductor. Examples of a crystalline oxide semiconductor include a single crystal oxide semiconductor, CAAC-OS, a polycrystalline oxide semiconductor, and a microcrystalline oxide semiconductor.

First, a CAAC-OS film is described.

A CAAC-OS film is an oxide semiconductor film having a plurality of c-axis-aligned crystal parts.

With a transmission electron microscope (TEM), a plurality of crystal parts in a CAAC-OS film are observed in a combined analysis image (also referred to as a high-resolution TEM image) of a bright-field image and a diffraction pattern of the CAAC-OS film. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

When a CAAC-OS film, e.g., a CAAC-OS film including an InGaZnO$_4$ crystal, is subjected to structural analysis by an out-of-plane method with an X-ray diffraction (XRD) apparatus, a peak appears frequently at a diffraction angle ($2\theta$) of around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film with an InGaZnO$_4$ crystal is analyzed by an out-of-plane method, a peak may also be observed at 2θ of around 36° as well as at 2θ of around 31°. The peak at 2θ of around 36° indicates that a crystal having no c-axis alignment is included in the CAAC-OS film. It is preferred that in the CAAC-OS film, a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. An element that has higher bonding strength to oxygen than a metal element included in the oxide semiconductor film, such as silicon, disturbs the atomic arrangement of the oxide semiconductor film by abstracting oxygen from the oxide semiconductor film and causes a decrease in crystallinity. A heavy metal such as iron or nickel, argon, carbon dioxide, or the like has a large atomic radius (or molecular radius), and thus disturbs the atomic arrangement of the oxide semiconductor film and causes a decrease in crystallinity when it is contained in the oxide semiconductor film. The impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, a transistor including an oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In a high-resolution TEM image of a microcrystalline oxide semiconductor film, there are a region where a crystal part is observed and a region where a crystal part is not clearly observed. In most cases, a crystal part in the microcrystalline oxide semiconductor film ranges from 1 nm to 100 nm or from 1 nm to 10 nm. A microcrystal with a size in the range of 1 nm to 10 nm or of 1 nm to 3 nm is specifically referred to as nanocrystal (nc). An oxide semiconductor film including nanocrystal is referred to as a nanocrystalline oxide semiconductor (nc-OS) film. For example, in a high-resolution TEM image of the nc-OS film, a grain boundary is not always found clearly.

In the nc-OS film, a microscopic region (e.g., a region with a size ranging from 1 nm to 10 nm, in particular, from 1 nm to 3 nm) has a periodic atomic order. There is no regularity of crystal orientation between different crystal parts in the nc-OS film; thus, the orientation of the whole film is not observed. Consequently, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak showing a crystal plane does not appear. A diffraction pattern like a halo pattern appears in a selected-area electron diffraction pattern of the nc-OS film obtained by using an electron beam having a probe diameter larger than the diameter of a crystal part (e.g., having a probe diameter of 50 nm or larger). Meanwhile, in a nanobeam electron diffraction pattern of the nc-OS film obtained by using an electron beam having a probe diameter close to or smaller than the diameter of a crystal part, spots are observed. Moreover, in a nanobeam electron diffraction pattern of the nc-OS film, regions with high luminance in a circular (ring) pattern are shown or a plurality of spots are shown in a ring-like region in some cases.

The nc-OS film is an oxide semiconductor film that has higher regularity than an amorphous oxide semiconductor film, and therefore has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

An amorphous oxide semiconductor film has disordered atomic arrangement and no crystal part. An example of the amorphous oxide semiconductor film is an oxide semiconductor film with a non-crystalline state like quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak showing a crystal plane does not appear. A halo pattern is shown in an electron diffraction pattern of the amorphous oxide semiconductor film. Furthermore, a halo pattern is shown but any spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void is sometimes observed. Furthermore, in the high-resolution TEM image, there are a region where a crystal part is clearly observed and a region where a crystal part is not observed. In the a-like OS film, crystallization is induced by a weak electron beam used for TEM observation and the growth of the crystal part is found in some cases. In contrast, crystallization is scarcely observed in the nc-OS film having good quality when the electron-beam irradiation is carried out at a low intensity as in the TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to be 0.29 nm from crystal structure analysis. Thus, when focusing on the lattice fringes in the high-resolution TEM image, each of the lattice fringes in which the spacing therebetween is from 0.28 nm to 0.30 nm corresponds to the a-b plane of the InGaZnO$_4$ crystal.

The density of an oxide semiconductor film might vary depending on its structure. For example, when the composition of an oxide semiconductor film becomes clear, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in an oxide semiconductor film with an atomic ratio of In:Ga:Zn=1:1:1, the density of single crystal InGaZnO$_4$ with a rhombohedral crystal structure is 6.357 g/cm$^3$. Thus, for example, the density of an a-like OS film with an atomic ratio of In:Ga:Zn=1:1:1 is higher than or equal to 5.0 g/cm$^3$ and lower than 5.9 g/cm$^3$. Moreover, for example, the density of an nc-OS film or a CAAC-OS film with an atomic ratio of In:Ga:Zn=1:1:1 is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate a density that corresponds to the density of a single crystal with a desired composition. The density of the single crystal with a desired composition can be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that the angle formed between two straight lines ranges from 60° to 120°.

In this specification, trigonal and rhombohedral crystal systems are included in a hexagonal crystal system.

The conductive layers 203A to 203F can appropriately employ any of materials or structures that can be used for the conductive layers 201A to 201D.

A substrate 204 preferably has heat resistance high enough to withstand at least heat treatment performed later. For example, a glass substrate, a ceramic substrate, a quartz substrate, or a sapphire substrate may be used as the substrate 204. A single crystal semiconductor substrate or a polycrystalline semiconductor substrate made of silicon, silicon carbide, or the like, a compound semiconductor substrate made of silicon germanium or the like, an SOI substrate, or the like may be used as the substrate 204. Furthermore, any of these substrates provided with a semiconductor element may be used as the substrate 204. In the case where a glass substrate is used as the substrate 204, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm) Thus, a large-sized display device can be manufactured.

A flexible substrate may be used as the substrate 204, and the transistor may be provided directly on the flexible substrate. Alternatively, a separation layer may be provided between a substrate and the transistor. The separation layer over which part or the whole of a semiconductor device is formed can be used to separate the semiconductor device from the substrate and transfer the semiconductor device to another substrate. In this case, the transistor can be transferred to a substrate having low heat resistance or a flexible substrate as well.

In this specification and the like, a transistor can be formed using a variety of substrates, for example. There is no particular limitation on the type of substrate. Examples of the substrate include a semiconductor substrate (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base film. Examples of a glass substrate include a barium borosilicate glass substrate, an aluminoborosilicate glass substrate, and a soda lime glass substrate. Examples of materials of a flexible substrate, an attachment film, a base film, and the like include plastic typified by polyethylene terephthalate (PET), polyethylene naphthalate (PEN), polyether sulfone (PES), and polytetrafluoroethylene (PTFE); a synthetic resin such as acrylic, polypropylene, polyester, polyvinyl fluoride, polyvinyl chloride, polyamide, polyimide, aramid, and epoxy; an inorganic vapor deposition film; and paper. Specifically, the use of a semiconductor substrate, a single crystal substrate, an SOI substrates, or the like enables the manufacture of small-sized transistors with a small variation in characteristics, size, shape, or the like and with high current capability. A circuit using such transistors achieves lower power consumption of the circuit or higher integration of the circuit.

A flexible substrate may be used as the substrate 204, and the transistor may be provided directly on the flexible substrate. Alternatively, a separation layer may be provided between a substrate and the transistor. The separation layer over which part or the whole of a semiconductor device is formed can be used to separate the semiconductor device from the substrate and transfer the semiconductor device to another substrate. In this case, the transistor can be transferred to a substrate having low heat resistance or a flexible substrate as well. The separation layer can be a stack including inorganic films (e.g., a tungsten film and a silicon oxide film) or an organic resin film of polyimide or the like formed over a substrate, for example.

In other words, a transistor may be formed using one substrate and then transferred to another substrate. Examples of a substrate to which a transistor is transferred include, in addition to the above substrates over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. The use of such a substrate enables formation of a transistor with excellent characteristics, a transistor with low power consumption, or a device with high durability, high heat resistance, or reduced weight or thickness.

The insulating layer 205 can be an insulating layer including at least one of the following films formed by a plasma enhanced chemical vapor deposition (PECVD) method, a sputtering method, or the like: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The insulating layer 206 can appropriately employ any of materials or structures that can be used for the insulating layer 205.

The conductive layer 207 can appropriately employ any of materials or structures that can be used for the conductive layers 201A to 201D.

Note that the transistors described in Embodiments 1 to 3 can have the structure described above. The transistors described in Embodiments 1 to 3 is preferably a transistor in which a channel formation region is included in an oxide semiconductor layer. Since the transistor in which a channel formation region is included in an oxide semiconductor layer exhibits a low off-state current, leakage of charge from the node 31 or the node 32 can be decreased; thus, a change in potential of the node 31 or the node 32 can be decreased.

This embodiment can be combined with any other embodiment as appropriate. Note that a content (or part thereof) described in one embodiment may be applied to, combined with, or replaced with a different content (or part thereof) described in the embodiment and/or a content (or part thereof) described in one or more different embodiments. Note that in each embodiment, a content described in the embodiment is a content described with reference to a variety of diagrams or a content described with text in this specification. In addition, by combining a diagram (or part thereof) described in one embodiment with another part of the diagram, a different diagram (or part thereof) described in the embodiment, and/or a diagram (or part thereof) described in another embodiment or other embodiments, much more diagrams can be created. The same can be applied to any other embodiment.

Embodiment 5

In this embodiment, a display module and electronic devices that include the semiconductor device or the display device of one embodiment of the present invention will be described with reference to FIG. 28 and FIGS. 29A to 29G.

Figure 28:
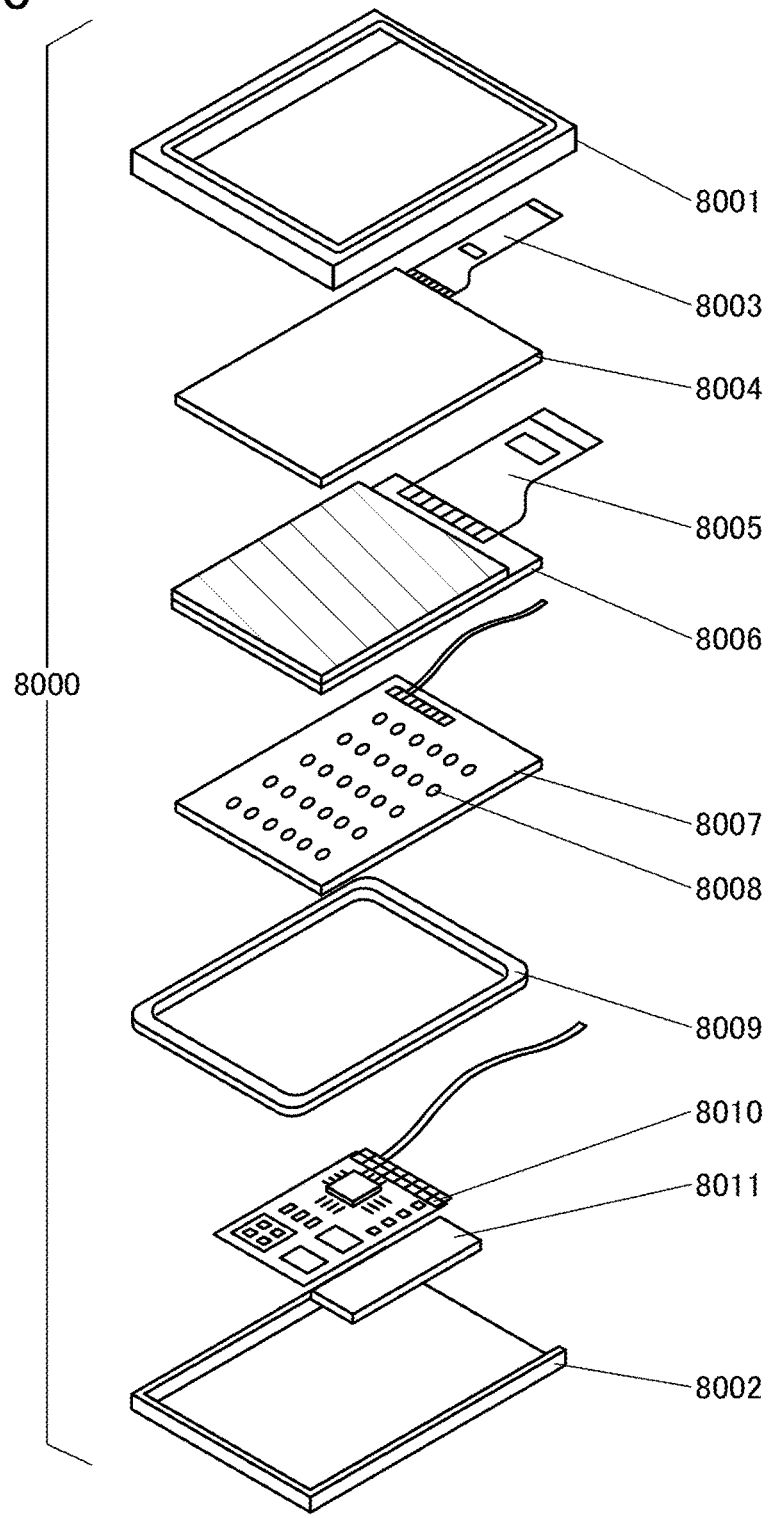
FIG. 28 illustrates an example of a display module.

In a display module 8000 illustrated in FIG. 28, a touch panel 8004 connected to an FPC 8003, a display panel 8006 connected to an FPC 8005, a backlight 8007, a frame 8009, a printed circuit board 8010, and a battery 8011 are provided between an upper cover 8001 and a lower cover 8002.

The semiconductor device or the display device of one embodiment of the present invention can be used for, for example, the display panel 8006.

The shape and size of the upper cover 8001 and the lower cover 8002 can be changed as appropriate in accordance with the size of the touch panel 8004 and the display panel 8006.

The touch panel 8004 can be a resistive touch panel or a capacitive touch panel and can overlap the display panel 8006. It is also possible to provide a touch panel function for a counter substrate (sealing substrate) of the display panel 8006. A photosensor may be provided in each pixel of the display panel 8006 so that an optical touch panel is obtained.

The backlight 8007 includes a light source 8008. Although the light sources 8008 are provided over the backlight 8007 in FIG. 28, one embodiment of the present invention is not limited to this structure. For example, it is possible to employ a structure in which the light source 8008 is provided at an end portion of the backlight 8007 and a light diffusion plate is provided. Note that the backlight 8007 need not be provided in a reflective panel or the like or in the case of using a self-luminous light-emitting element such as an organic EL element.

The frame 8009 protects the display panel 8006 and functions as an electromagnetic shield for blocking electromagnetic waves generated by the operation of the printed circuit board 8010. The frame 8009 may also have a function of a radiator plate.

The printed circuit board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a polarizing plate, a retardation plate, a prism sheet, or the like.

FIGS. 29A to 29G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 29A to 29G can have a variety of functions, for example, a function of displaying a variety of data (e.g., a still image, a moving image, and a text image) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, and a function of reading a program or data stored in a memory medium and displaying the program or data on the display portion. Note that functions that can be provided for the electronic devices shown in FIGS. 29A to 29G are not limited to the above, and the electronic devices can have a variety of functions. Although not illustrated in FIGS. 29A to 29G, the electronic device may include a plurality of display portions. Furthermore, the electronic device may be provided with a camera and the like and have a function of shooting a still image, a function of shooting a moving image, a function of storing a shot image in a memory medium (an external memory medium or a memory medium incorporated in the camera), a function of displaying a shot image on the display portion, and the like.

The electronic devices illustrated in FIGS. 29A to 29G will be described in detail.

Figure 29A:
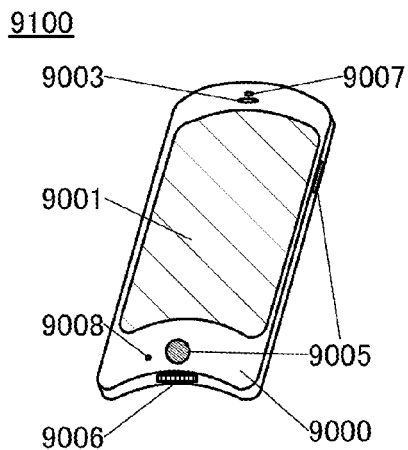
FIGS. 29A to 29G each illustrate an example of an electronic device.

FIG. 29A is a perspective view illustrating a portable information appliance 9100. A display portion 9001 of the portable information appliance 9100 is flexible; therefore, the display portion 9001 can be incorporated along a bent surface of a bent housing 9000. The display portion 9001 includes a touch sensor, and operation can be performed by touching the screen with a finger, a stylus, or the like. For example, an application can be started by touching an icon displayed on the display portion 9001.

Figure 29B:
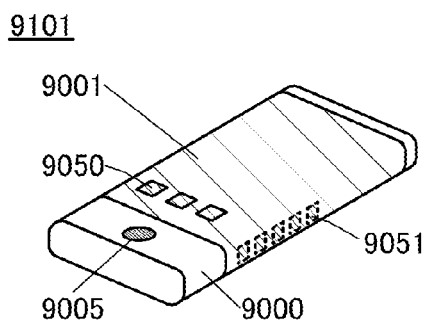

FIG. 29B is a perspective view of a portable information appliance 9101. The portable information appliance 9101 has a function of at least one of a telephone set, a notebook, and an information browsing system, for example. Specifically, the portable information appliance 9101 can be used as a smartphone. Note that the speaker 9003, the connection terminal 9006, the sensor 9007, and the like of the portable information appliance 9101, which are not illustrated in FIG. 29B, can be provided as in the portable information appliance 9100 of FIG. 29A. The portable information appliance 9101 can display letters and image data on its plurality of surfaces. For example, three operation buttons 9050 (also referred to as operation icons or simply icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, and call; the title and sender of an email and an SNS massage; the date; the time; remaining battery; and the reception strength of an antenna. Alternatively, the operation buttons 9050 or the like may be displayed in place of the information 9051.

Figure 29C:
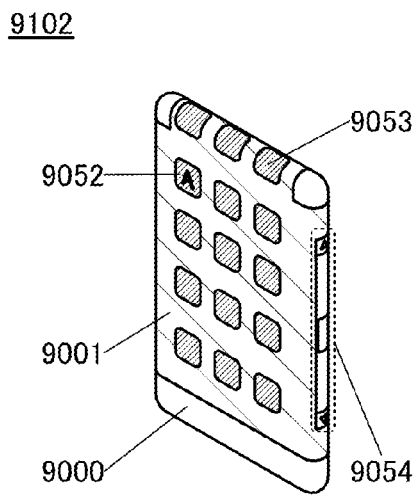

FIG. 29C is a perspective view illustrating a portable information appliance 9102. The portable information appliance 9102 has a function of displaying information on three or more surfaces of the display portion 9001. Here, information 9052, information 9053, and information 9054 are displayed on different surfaces. For example, a user of the portable information appliance 9102 can see the display (here, the information 9053) with the portable information appliance 9102 put in a breast pocket. Specifically, a caller's phone number, name, or the like of an incoming call is displayed in a position that can be seen from above the portable information appliance 9102. Thus, the user can see the display without taking out the portable information appliance 9102 from the pocket and decide whether to answer the call.

Figure 29D:
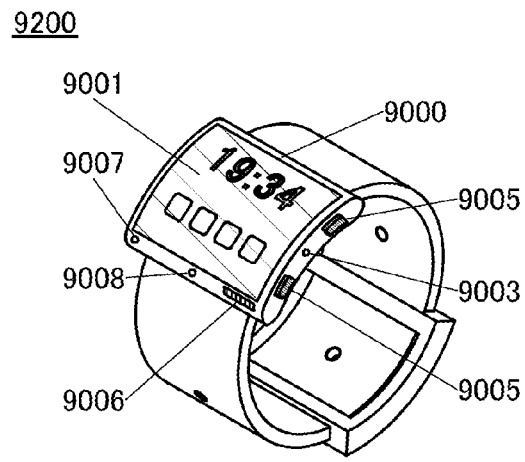

FIG. 29D is a perspective view illustrating a wrist-watch-type portable information appliance 9200. The portable information appliance 9200 is capable of executing a variety of applications such as mobile phone calls, e-mailing, reading and editing texts, music reproduction, Internet communication, and a computer game. The display surface of the display portion 9001 is bent, and images can be displayed on the bent display surface. The portable information appliance 9200 can employ near field communication based on a communication standard. For example, hands-free calling is possible with mutual communication between the portable information appliance 9200 and a headset capable of wireless communication. Moreover, the portable information appliance 9200 includes the connection terminal 9006, and data can be directly transmitted to and received from another information appliance via a connector. The portable information appliance 9200 can be charged through the connection terminal 9006. Note that the charging operation may be performed by wireless power feeding without using the connection terminal 9006.

Figure 29E:
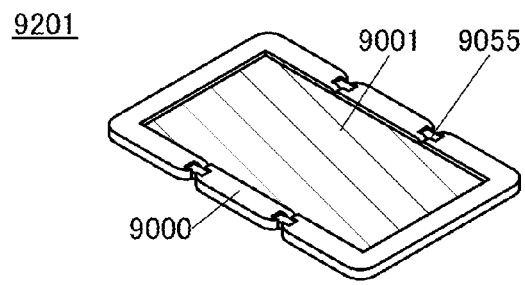
Figure 29F:
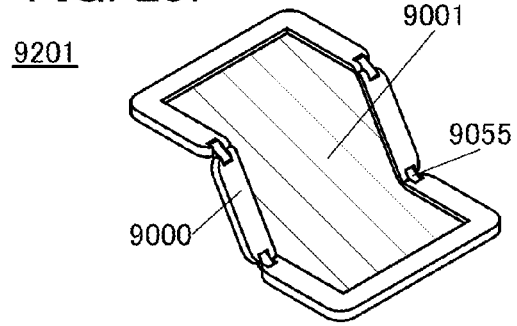
Figure 29G:
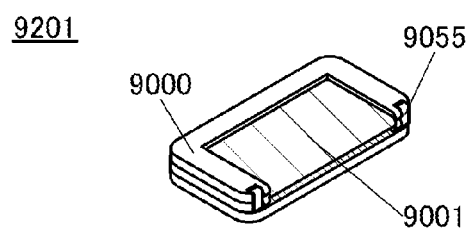

FIGS. 29E, 29F, and 29G are perspective views illustrating a foldable portable information appliance 9201 that is opened, that is being opened or being folded, and that is folded. The portable information appliance 9201 is highly portable when folded. When the portable information appliance 9201 is opened, a seamless large display region is highly browsable. The display portion 9001 of the portable information appliance 9201 is supported by three housings 9000 joined by hinges 9055. By folding the portable information appliance 9201 at a connection portion between two housings 9000 with the hinges 9055, the portable information appliance 9201 can be reversibly changed in shape from an opened state to a folded state. For example, the portable information appliance 9201 can be bent with a radius of curvature of 1 mm to 150 mm.

The semiconductor device or the display device of one embodiment of the present invention can be used for the display portion 9001.

The electronic device described in this embodiment includes a display portion for displaying some sort of information. Note that the semiconductor device of one embodiment of the present invention can also be used for an electronic device that does not have a display portion. In addition, this embodiment shows the example where the display portion of the electronic device is flexible and can display images on the bent display surface, and the example where the display portion is foldable. However, one embodiment of the present invention is not limited to these examples, and it is possible to employ a structure where the display portion is not flexible and images are displayed on a flat surface.

This application is based on Japanese Patent Application serial no. 2014-206113 filed with Japan Patent Office on Oct. 7, 2014, the entire contents of which are hereby incorporated by reference.

What is claimed is:
1. A semiconductor device comprising:
a first transistor;
a second transistor;
a third transistor;
a fourth transistor;
a fifth transistor; and
a microelectromechanical systems device,
wherein:
one of a source and a drain of the first transistor is electrically connected to one of a source and a drain of the second transistor;
one of a source and a drain of the third transistor is electrically connected to one of a source and a drain of the fourth transistor and to a gate of the first transistor;
the other of the source and the drain of the third transistor is electrically connected to the other of the source and the drain of the first transistor;

the other of the source and the drain of the fourth transistor is electrically connected to the other of the source and the drain of the second transistor;

a gate of the fourth transistor is electrically connected to a gate of the second transistor;

one of a source and a drain of the fifth transistor is electrically connected to the gate of the second transistor; and the microelectromechanical systems device is electrically connected to the one of the source and the drain of the first transistor.

2. The semiconductor device according to claim 1, wherein a channel width/channel length (W/L) ratio of the second transistor is higher than a W/L ratio of the first transistor.

3. The semiconductor device according to claim 1, wherein a channel width/channel length (W/L) ratio of the fourth transistor is higher than a W/L ratio of the third transistor.

4. A display module comprising a display panel comprising the semiconductor device according to claim 1, wherein the display module further comprises a flexible printed circuit.

5. An electronic device comprising the display module according to claim 4, wherein the electronic device further comprises an antenna, an operation button, or a speaker.

6. A semiconductor device comprising:
a first transistor;
a second transistor;
a third transistor;
a fourth transistor;
a fifth transistor;
a sixth transistor; and
a microelectromechanical systems device,
wherein:
one of a source and a drain of the first transistor is electrically connected to one of a source and a drain of the second transistor;
one of a source and a drain of the third transistor is electrically connected to one of a source and a drain of the fourth transistor and to a gate of the first transistor;
the other of the source and the drain of the third transistor is electrically connected to the other of the source and the drain of the first transistor;
the other of the source and the drain of the fourth transistor is electrically connected to the other of the source and the drain of the second transistor;
a gate of the fourth transistor is electrically connected to a gate of the second transistor;
one of a source and a drain of the fifth transistor is electrically connected to the gate of the second transistor;
one of a source and a drain of the sixth transistor is electrically connected to the gate of the second transistor;
the other of the source and the drain of the sixth transistor is electrically connected to the other of the source and the drain of the second transistor; and
the microelectromechanical systems device is electrically connected to the one of the source and the drain of the first transistor.

7. A display module comprising a display panel comprising the semiconductor device according to claim 6, wherein the display module further comprises a flexible printed circuit.

8. An electronic device comprising the display module according to claim 7, wherein the electronic device further comprises an antenna, an operation button, or a speaker.

9. A semiconductor device comprising:
a first transistor;
a second transistor;
a third transistor;
a fourth transistor;
a fifth transistor; and
a microelectromechanical systems device,
wherein:
the first to fifth transistors each comprise a channel formation region in an oxide semiconductor;
one of a source and a drain of the first transistor is electrically connected to one of a source and a drain of the second transistor;
one of a source and a drain of the third transistor is electrically connected to one of a source and a drain of the fourth transistor and to a gate of the first transistor;
the other of the source and the drain of the third transistor is electrically connected to the other of the source and the drain of the first transistor;
the other of the source and the drain of the fourth transistor is electrically connected to the other of the source and the drain of the second transistor;
a gate of the fourth transistor is electrically connected to a gate of the second transistor;
one of a source and a drain of the fifth transistor is electrically connected to the gate of the second transistor; and
the microelectromechanical systems device is electrically connected to the one of the source and the drain of the first transistor.

10. A display module comprising a display panel comprising the semiconductor device according to claim 9, wherein the display module further comprises a flexible printed circuit.

11. An electronic device comprising the display module according to claim 10, wherein the electronic device further comprises an antenna, an operation button, or a speaker.

12. A semiconductor device comprising:
a first transistor;
a second transistor;
a third transistor;
a fourth transistor;
a fifth transistor;
a sixth transistor; and
a microelectromechanical systems device,
wherein:
the first to sixth transistors each comprise a channel formation region in an oxide semiconductor;
one of a source and a drain of the first transistor is electrically connected to one of a source and a drain of the second transistor;
one of a source and a drain of the third transistor is electrically connected to one of a source and a drain of the fourth transistor and to a gate of the first transistor;
the other of the source and the drain of the third transistor is electrically connected to the other of the source and the drain of the first transistor;
the other of the source and the drain of the fourth transistor is electrically connected to the other of the source and the drain of the second transistor;
a gate of the fourth transistor is electrically connected to a gate of the second transistor;

one of a source and a drain of the fifth transistor is electrically connected to the gate of the second transistor;

one of a source and a drain of the sixth transistor is electrically connected to the gate of the second transistor;

the other of the source and the drain of the sixth transistor is electrically connected to the other of the source and the drain of the second transistor; and the microelectromechanical systems device is electrically connected to the one of the source and the drain of the first transistor.

13. A display module comprising a display panel comprising the semiconductor device according to claim 12, wherein the display module further comprises a flexible printed circuit.

14. An electronic device comprising the display module according to claim 13, wherein the electronic device further comprises an antenna, an operation button, or a speaker.

* * * * *